(12) United States Patent
Ogihara et al.

(10) Patent No.: US 8,992,790 B2
(45) Date of Patent: Mar. 31, 2015

(54) PATTERNING PROCESS

(71) Applicant: Shin-Etsu Chemical Co., Ltd., Tokyo (JP)

(72) Inventors: Tsutomu Ogihara, Jyoetsu (JP); Jun Hatakeyama, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 61 days.

(21) Appl. No.: 13/863,102

(22) Filed: Apr. 15, 2013

(65) Prior Publication Data

US 2013/0284699 A1 Oct. 31, 2013

(30) Foreign Application Priority Data

Apr. 27, 2012 (JP) .................. 2012-103332

(51) Int. Cl.
| | | |
|---|---|---|
| *B44C 1/22* | (2006.01) | |
| *G03F 7/00* | (2006.01) | |
| *G03F 7/09* | (2006.01) | |
| *B82Y 10/00* | (2011.01) | |
| *B82Y 40/00* | (2011.01) | |

(52) U.S. Cl.
CPC .............. *B44C 1/227* (2013.01); *G03F 7/0002* (2013.01); *G03F 7/09* (2013.01); *B82Y 10/00* (2013.01); *B82Y 40/00* (2013.01)
USPC ............................................. 216/48; 216/49

(58) Field of Classification Search
None
See application file for complete search history.

(56) References Cited

U.S. PATENT DOCUMENTS

| | | | |
|---|---|---|---|
| 6,013,416 A | 1/2000 | Nozaki et al. | |
| 6,280,898 B1 | 8/2001 | Hasegawa et al. | |
| 6,730,453 B2 * | 5/2004 | Nakashima et al. | ........ 430/270.1 |
| 7,132,220 B2 * | 11/2006 | Arai et al. | .................. 430/287.1 |

(Continued)

FOREIGN PATENT DOCUMENTS

| | | |
|---|---|---|
| EP | 2 540 780 A1 | 1/2013 |
| JP | A-08-012626 | 1/1996 |

(Continued)

OTHER PUBLICATIONS

Cheng et al., "Simple and Versatile Methods to Integrate Directed Self-Assembly with Optical Lithography Using a Polarity-Switched Photoresist", ACS NANO, vol. 4, No. 8, 2010, pp. 4815-4823, XP55007223.

(Continued)

*Primary Examiner* — Allan Olsen
(74) *Attorney, Agent, or Firm* — Oliff PLC

(57) ABSTRACT

A patterning process which uses self-assembly, including: forming a silicon-containing film by applying a silicon-containing film composition having an organic substituent group substituted with an acid labile group onto a substrate to be processed, forming a photoresist film onto the silicon-containing film, pattern-exposing of the photoresist film, removing the photoresist film, forming a polymer film by applying a self-assembling polymer onto the silicon-containing film, self-assembling the polymer film to form a microdomain structure, forming a pattern of the polymer film having the microdomain formed, transferring the pattern to the silicon-containing film by using the pattern formed on the polymer as a mask, and transferring the pattern to the substrate to be processed by using the pattern transferred to the silicon-containing film as a mask. There can be provided a pattern having a microdomain structure formed by self-assembly with uniformity and regularity.

4 Claims, 2 Drawing Sheets

(56) References Cited

U.S. PATENT DOCUMENTS

| | | | |
|---|---|---|---|
| 7,842,620 B2 * | 11/2010 | Takei et al. | 438/761 |
| 8,491,965 B2 * | 7/2013 | Cheng et al. | 427/256 |
| 2001/0026901 A1 | 10/2001 | Maeda et al. | |
| 2002/0177066 A1 * | 11/2002 | Song et al. | 430/270.1 |
| 2003/0091929 A1 | 5/2003 | Nishi et al. | |
| 2004/0050816 A1 | 3/2004 | Asakawa et al. | |
| 2004/0241579 A1 * | 12/2004 | Hamada et al. | 430/270.1 |
| 2007/0238300 A1 | 10/2007 | Ogihara et al. | |
| 2009/0136869 A1 | 5/2009 | Ogihara et al. | |
| 2009/0179002 A1 | 7/2009 | Cheng et al. | |
| 2010/0147985 A1 | 6/2010 | Dallimore et al. | |
| 2010/0167214 A1 | 7/2010 | Yoon et al. | |
| 2011/0147983 A1 | 6/2011 | Cheng et al. | |
| 2011/0147985 A1 | 6/2011 | Cheng et al. | |
| 2012/0052685 A1 | 3/2012 | Ogihara et al. | |
| 2012/0088188 A1 | 4/2012 | Trefonas et al. | |
| 2012/0183908 A1 * | 7/2012 | Anno et al. | 430/325 |
| 2012/0276483 A1 * | 11/2012 | Ogihara et al. | 430/319 |
| 2013/0071788 A1 * | 3/2013 | Hatakeyama et al. | 430/285.1 |
| 2013/0210236 A1 * | 8/2013 | Ogihara et al. | 438/706 |
| 2013/0280912 A1 * | 10/2013 | Ogihara et al. | 438/694 |
| 2014/0134544 A1 * | 5/2014 | ANNO et al. | 430/325 |
| 2014/0205951 A1 * | 7/2014 | Ogihara et al. | 430/296 |

FOREIGN PATENT DOCUMENTS

| | | |
|---|---|---|
| JP | A-09-073173 | 3/1997 |
| JP | A-2000-159758 | 6/2000 |
| JP | A-2003-084438 | 3/2003 |
| JP | A-2005-007244 | 1/2005 |
| JP | A-2005-008701 | 1/2005 |
| JP | A-2005-008882 | 1/2005 |
| JP | A-2009-126940 | 6/2009 |
| JP | B2-4716037 | 7/2011 |
| JP | A-2012-53253 | 3/2012 |
| JP | A-2012-78828 | 4/2012 |
| WO | WO 00/01684 | 1/2000 |

OTHER PUBLICATIONS

Jul. 31, 2013 Extended Search Report issued in European Patent Application No. EP 13002136.3.

Extended European Search Report issued in European Application No. 13002136.3 issued May 20, 2014.

Liu et al., "Integration of block copolymer directed assembly with 193 immersion lithography," *J. Vac. Sci. Technol. B.*, vol. 28, No. 6, pp. C61330-C6B34, Nov./Dec. 2010.

Aug. 5, 2014 Notification of Reasons for Refusal issued in Japanese Patent Application No. 2012-103332 (with partial translation).

* cited by examiner

PATTERNING PROCESS

BACKGROUND OF THE INVENTION

1. Field of the Invention

The present invention relates to a patterning process using self-assembly.

2. Description of the Related Art

In 1980s, photo-exposure using a g-beam (436 nm) or an i-beam (365 nm) of a mercury lamp as a light source had been widely used in the resist patterning. As a means for further miniaturization, shifting to a shorter wavelength of the exposure light was assumed to be effective, so that, in mass production process after the DRAM (Dynamic Random Access Memory) with 64 megabits (processing dimension of 0.25 μm or less) in 1990s, a KrF excimer laser (248 nm), a shorter wavelength than the i-beam (365 nm), had been used in place of the i-beam as an exposure light source. However, in production of DRAMs with integration of 256 MB and 1 GB or higher which require further miniaturized process technologies (processing dimension of 0.2 μm or less), a light source with further short wavelength is required, and thus, a photolithography using an ArF excimer laser (193 nm) has been investigated seriously since about a decade ago. At first, the ArF lithography was planned to be applied to manufacturing of a device starting from a 180-nm node device, but the life of the KrF excimer lithography was prolonged to mass production of the 130-nm node device; and thus, a full-fledged application of the ArF lithography started from the 90-nm node. Further, mass production of the 65-nm node device is now underway by combining thereof with a lens having an increased NA till 0.9. Further shortening of wavelength of the exposure light is progressing in the next 45-nm node device; and for that, the $F_2$-lithography with 157 nm wavelength became a candidate. However, there are many problems with the $F_2$ lithography: cost-up of a scanner due to use of a large quantities of expensive $CaF_2$ single crystals for a projection lens; extremely poor sustainability of a soft pellicle, which leads to change of an optical system due to introduction of a hard pellicle; decrease in etching resistance of a photoresist film, and so forth. Because of these problems, development of the $F_2$ lithography was suspended, and the ArF immersion lithography was introduced.

In the ArF immersion lithography, water having refractive index of 1.44 is introduced between a projection lens and a wafer by a partial fill method thereby enabling high speed scanning; and thus, mass production of the 45-nm node device is now underway by using a lens with a NA class of 1.3.

For the 32-nm node lithography technology, a lithography with an extreme ultraviolet beam (EUV) of 13.5 nm wavelength is considered to be a candidate. Problems to be solved in the EUV lithography are to obtain a higher output power of the laser, a higher sensitivity of the photoresist film, a higher resolution power, a lower line edge roughness (LER), a non-defect MoSi laminate mask, a lower aberration of the reflective mirror, and so forth; and thus, there are mounting problems to be solved.

Development of the immersion lithography with a high refractive index, another candidate for the 32-nm node, was suspended, because transmittance of LUAG, a candidate for a high refractive index lens, is low, and refractive index of the liquid could not reach an aimed value of 1.8.

As mentioned above, in the photo-exposure used as a general technology, resolution power based on the wavelength of a light source is approaching to its inherent limit. Therefore, in recent years, development by an organic solvent, with which a very fine hole pattern that could not be achieved by a patterning process with a positive tone by a conventional alkaline development is formed by a patterning process with a negative tone by the organic solvent development, is receiving an attention again. This is a patterning process with which a negative pattern is formed by the organic solvent development by using a positive photoresist composition having a high resolution power. Further, an investigation to obtain a doubled resolution power by combining two developments of the alkaline development and the organic solvent development is now underway. However, under the present situation, patterning to form a fine pattern by a lithography with 30 nm or less, especially by a lithography with 10 nm or less is difficult.

In recent years, a pattern having a regularity could be successively obtained by using a self-assembling technology of a block copolymer without using a lithography process (For example, Patent Documents 1 to 3). In addition, patterning of about 30 nm by a combination with the ArF immersion lithography was reported (Non-Patent Document 1).

However, the pattern obtained by these self-assembly materials has many problems in uniformity and regularity of the pattern form even though the pattern thereof is about 30 nm in its size, so that this has not been realized as a practical method; and thus, these problems are required to be solved.

PRIOR ART DOCUMENTS

Patent Documents

Patent Document 1: Japanese Patent Laid-Open Publication No. 2005-7244
Patent Document 2: Japanese Patent Laid-Open Publication No. 2005-8701
Patent Document 3: Japanese Patent Laid-Open Publication No. 2005-8882

Non-Patent Documents

Non-Patent Document 1: J. Vac. Sci. Technol. B 28(6), C6B30 November/December (2010)

SUMMARY OF THE INVENTION

The present invention was made in view of the situation mentioned above, and has an object to provide a patterning process especially suitable for a fine patterning material to be used in manufacturing of a very large scale integrated circuit by obtaining a pattern having a microdomain structure formed by self-assembly with excellent uniformity and regularity, the pattern having been difficult to be obtained by a conventional block polymer.

In order to solve the above-mentioned problems, the present invention provides a patterning process using self-assembly comprises:

a step of forming a silicon-containing film by applying a silicon-containing film composition which contains a silicon-containing compound containing an organic substituent group having a hydroxyl group thereof substituted with an acid labile group or a carboxyl group thereof substituted with an acid labile group onto a substrate to be processed, which is then followed by heating this, a step of forming a photoresist film by applying a photoresist composition onto the silicon-containing film which is then followed by heating the photoresist composition, a step of patter-exposing of the photoresist film to high-energy beam, which is then followed by heat-treatment thereof, a step of removing the photoresist film with a stripper, a step of forming a polymer film by applying a self-assembling polymer onto the silicon-containing film after removing the photoresist film, a step of self-assembling the polymer film by a heat treatment to form a microdomain structure, a step of forming a pattern by dry-etching of the polymer film having the microdomain formed, a step of transferring the pattern to the silicon-containing film by dry-etching by using the pattern formed on the polymer as a mask, and a step of transferring the pattern to the substrate to be processed by dry-etching by using the pattern transferred to the silicon-containing film as a mask.

According to the patterning processed of the present invention, a pattern having a microdomain structure formed by self-assembly with excellent uniformity and regularity, the pattern having been difficult to be obtained by a conventional self-assembling polymer, can be obtained because this process includes the steps shown above; and thus, the present invention can provide a patterning process especially suitable for a fine patterning material to be used in manufacturing of a very large scale integrated circuit and the like.

Further, the present invention provides the patterning process comprising a step of developing the photoresist film with a developer after exposing the photoresist film to high-energy beam followed by heating the film, and then the step of removing the photoresist film with a stripper.

The patterning process of the present invention may include a development step, if necessary.

Further, the present invention provides the patterning process, wherein a substrate formed thereon an organic hard mask mainly comprised of carbon formed by a CVD method or an organic film of an application type is used as the substrate to be processed.

By forming a CVD film or an organic underlayer film under the silicon-containing film used in the present invention and by optimizing a combination thereof with a film to be processed, a fine pattern by self-assembly can be transferred to an inorganic film and a semiconductor device substrate in a further lower layer without a difference in size conversion.

According to the patterning process of the present invention, self-assembly of the self-assembling polymer can be accelerated so that fine patterning that cannot be reached by a lithography using a high beam energy can be obtained and pattern transfer by using this film as an etching mask becomes possible.

DETAILED DESCRIPTION OF THE PREFERRED EMBODIMENTS

Figure 1:
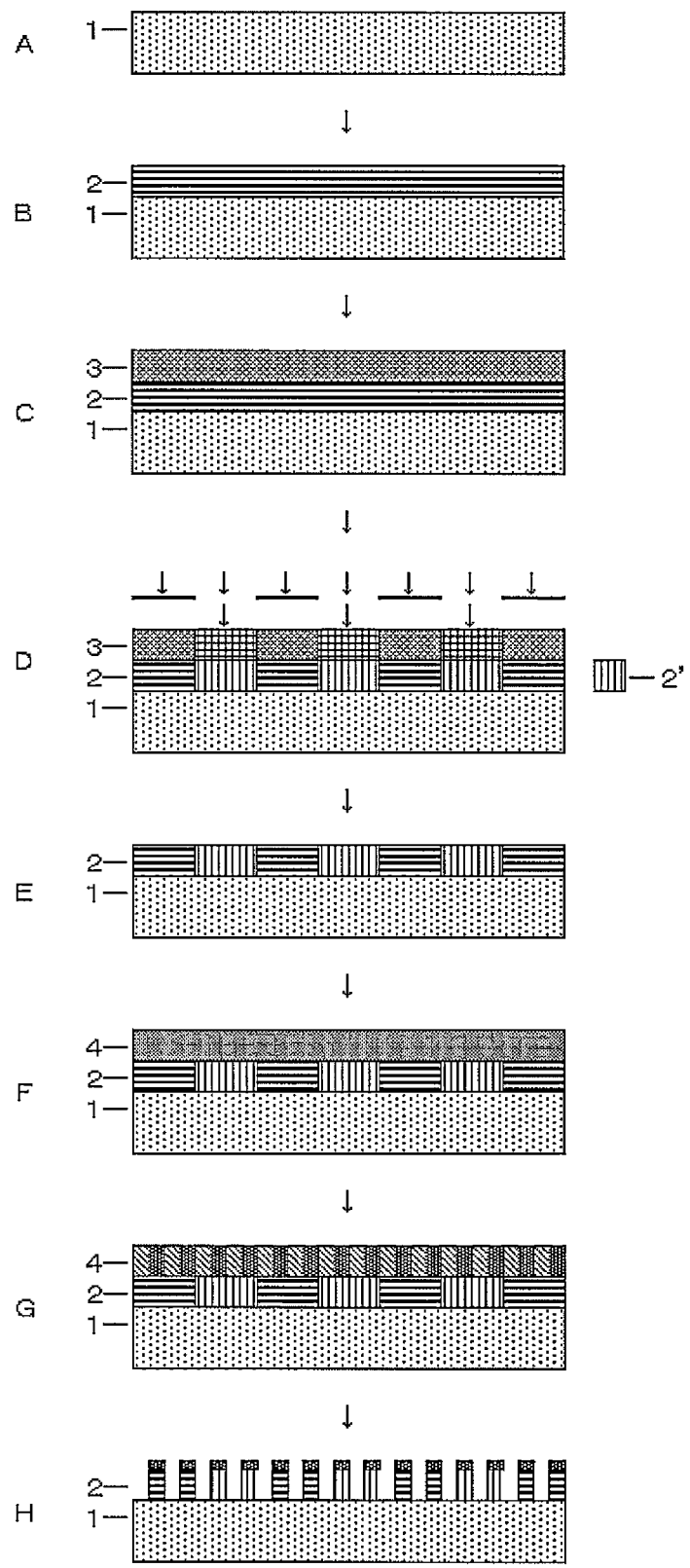
FIG. 1 is a flow chart showing the patterning process of the present invention.

Hereinafter, the present invention will be described in detail, but the present invention is not limited to these descriptions.

The present invention includes a step of forming a silicon-containing film by applying a silicon-containing film composition which contains a silicon-containing compound containing an organic substituent group having a hydroxyl group thereof substituted with an acid labile group or a carboxyl group thereof substituted with an acid labile group onto a substrate to be processed, which is then followed by heating this, a step of forming a photoresist film by applying a photoresist composition onto the silicon-containing film which is then followed by heating the photoresist composition, a step of patter-exposing of the photoresist film to high-energy beam, which is then followed by heat-treatment thereof, A photoresist film located on the silicon-containing film used in the present invention is exposed to generate an acid. An acid labile group is desorbed in the silicon-containing film by the effect of the acid, and a hydrophilic hydroxyl group or carboxyl group is generated on the exposed area. As a result, a difference in contact angle between the exposed area and the non-exposed area is caused on the silicon-containing film. It is known that generally a self-assembling polymer undergoes self-assembly by heating by using as a driving force the part where the contact angle changes on the film surface. If the silicon-containing film of the present invention is formed in the underlayer of the self-assembling polymer in advance, self-assembly takes place readily so that a pattern that is formed by self-assembly can be obtained.

As to the silicon-containing film composition which contains the silicon-containing compound, a silicon-containing film composition which contains a silicon-containing compound having one or more partial structures shown by the following general formulae (A), (B), and (C).

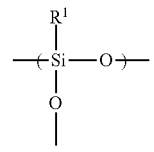

(A)

wherein, $R^1$ represents an organic group having a hydroxy group thereof substituted with an acid labile group or a carboxyl group thereof substituted with an acid labile group.

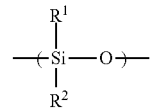

(B)

wherein, $R^1$ represents an organic group having a hydroxy group thereof substituted with an acid labile group or a carboxyl group thereof substituted with an acid labile group; and $R^2$ represents the same group as $R^1$, a hydrogen atom, or a monovalent organic group having 1 to 30 carbon atoms.

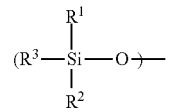

(C)

wherein, $R^1$ represents an organic group having a hydroxy group thereof substituted with an acid labile group or a carboxyl group thereof substituted with an acid labile group; $R^2$ represents the same group as $R^1$, a hydrogen atom, or a monovalent organic group having 1 to 30 carbon atoms; and $R^3$ represents the same group as $R^1$, a hydrogen atom, or a monovalent organic group having 1 to 30 carbon atoms.

Illustrative example of the organic group, shown by $R^1$, having a hydroxyl group thereof substituted with an acid labile group or a carboxyl group thereof substituted with an acid labile group in the partial structures (A), (B), and (C) of the silicon-containing compound of the present invention includes the structures shown by the following general formulae. Meanwhile, in the following general formulae, (Si) is described to show the bonding site to a silicon atom.

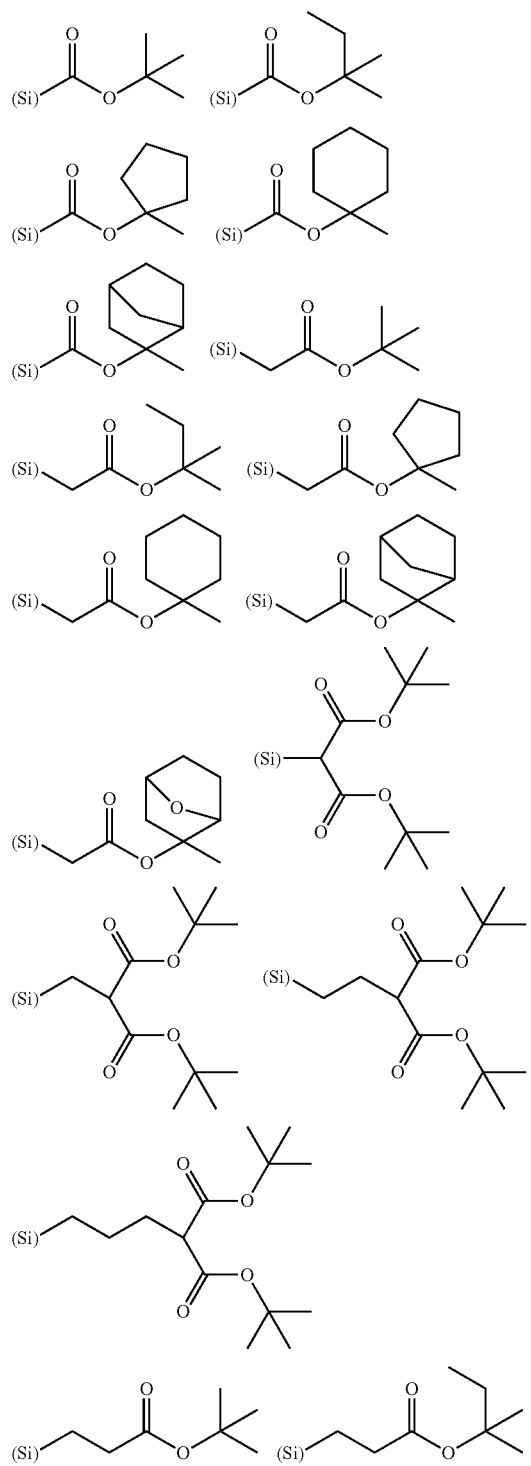
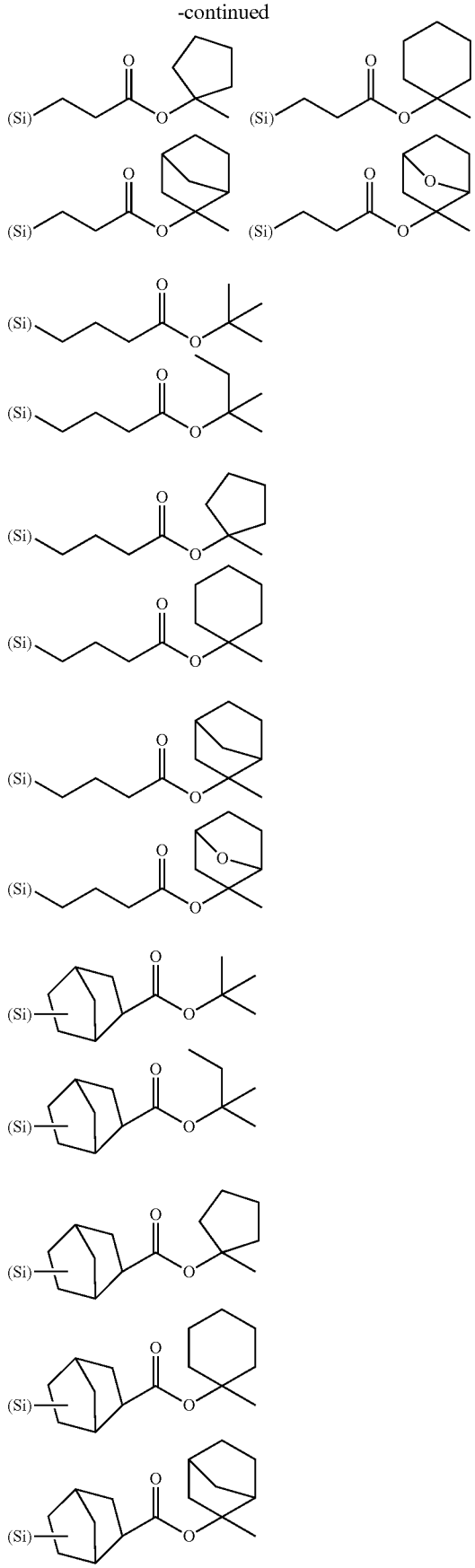

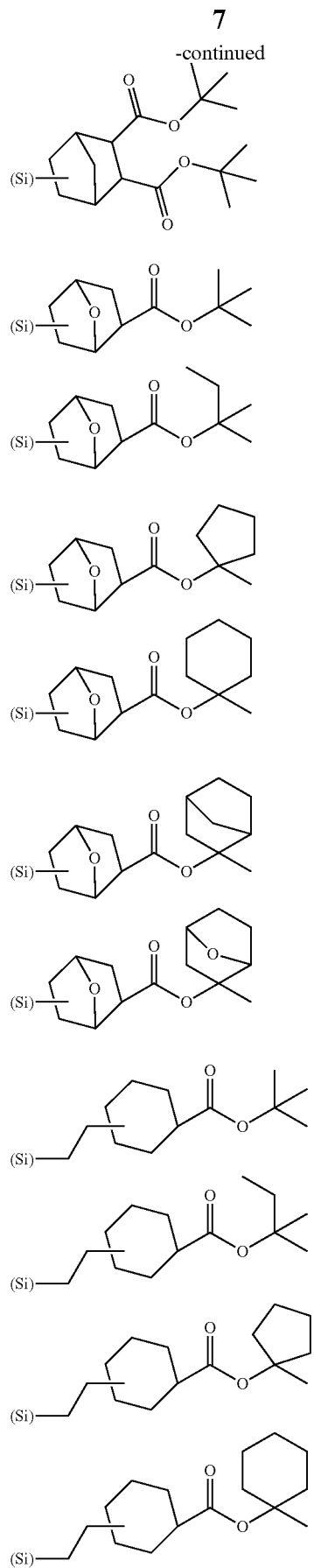
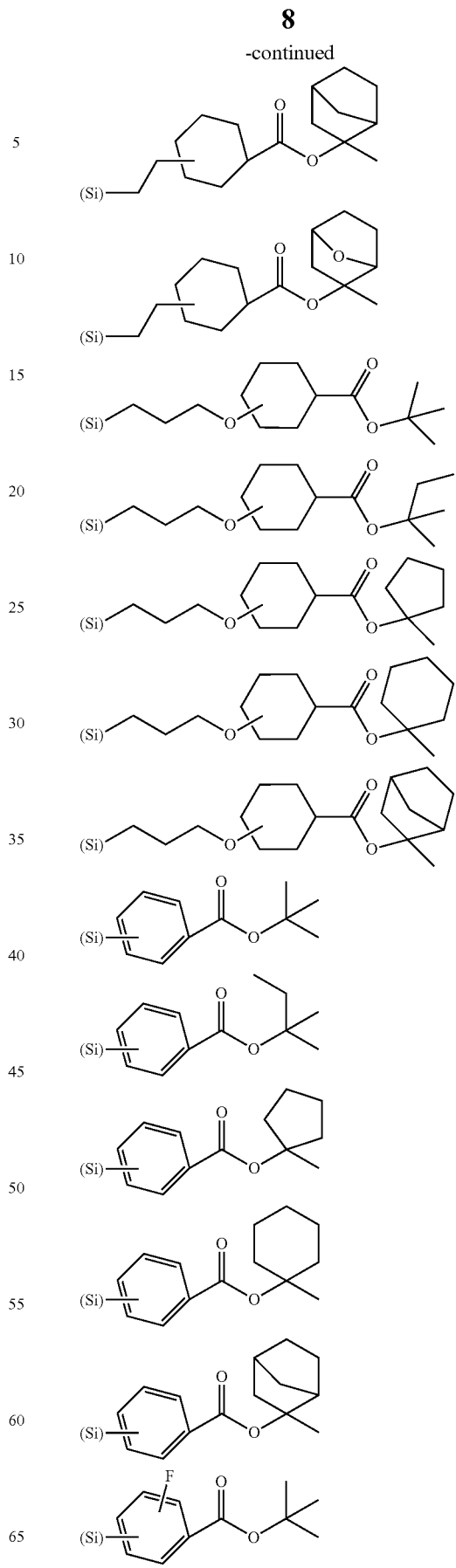

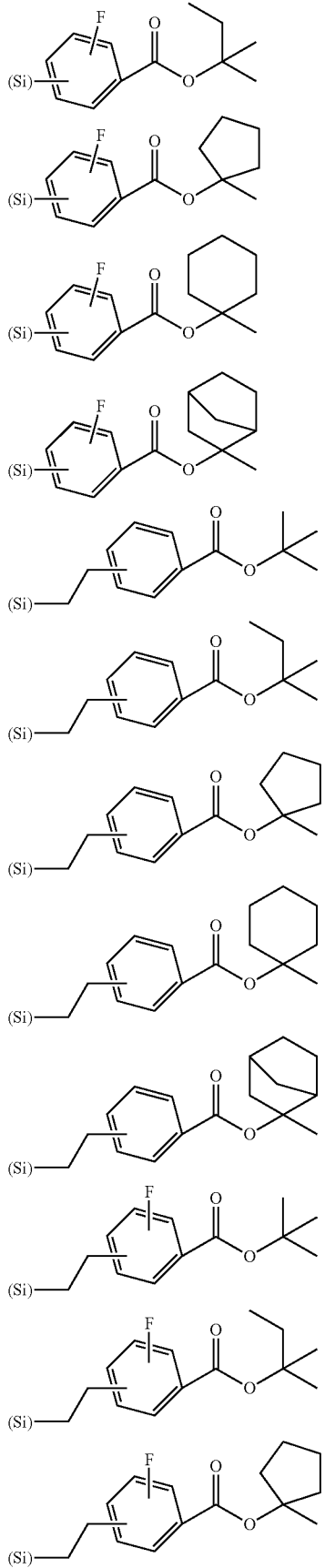
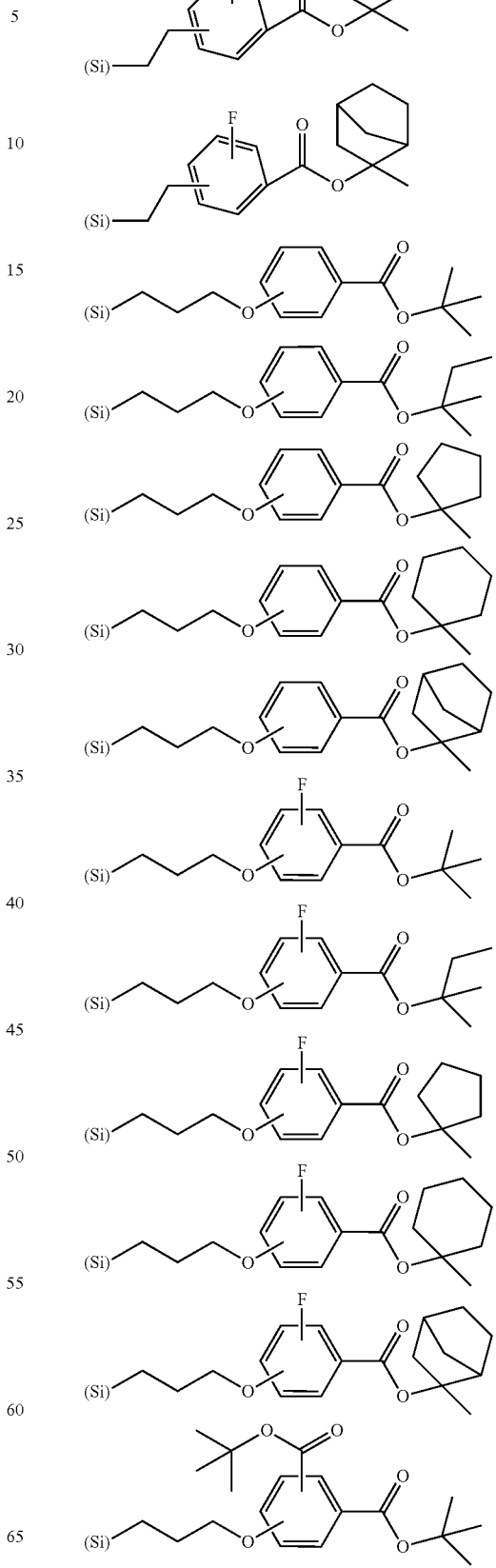

-continued
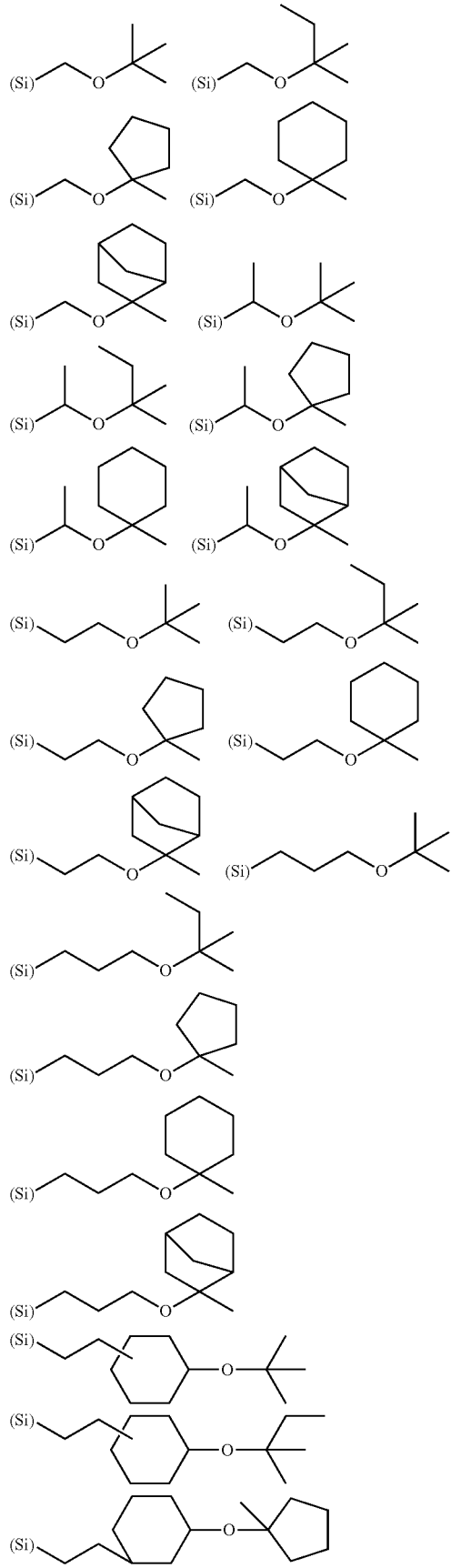
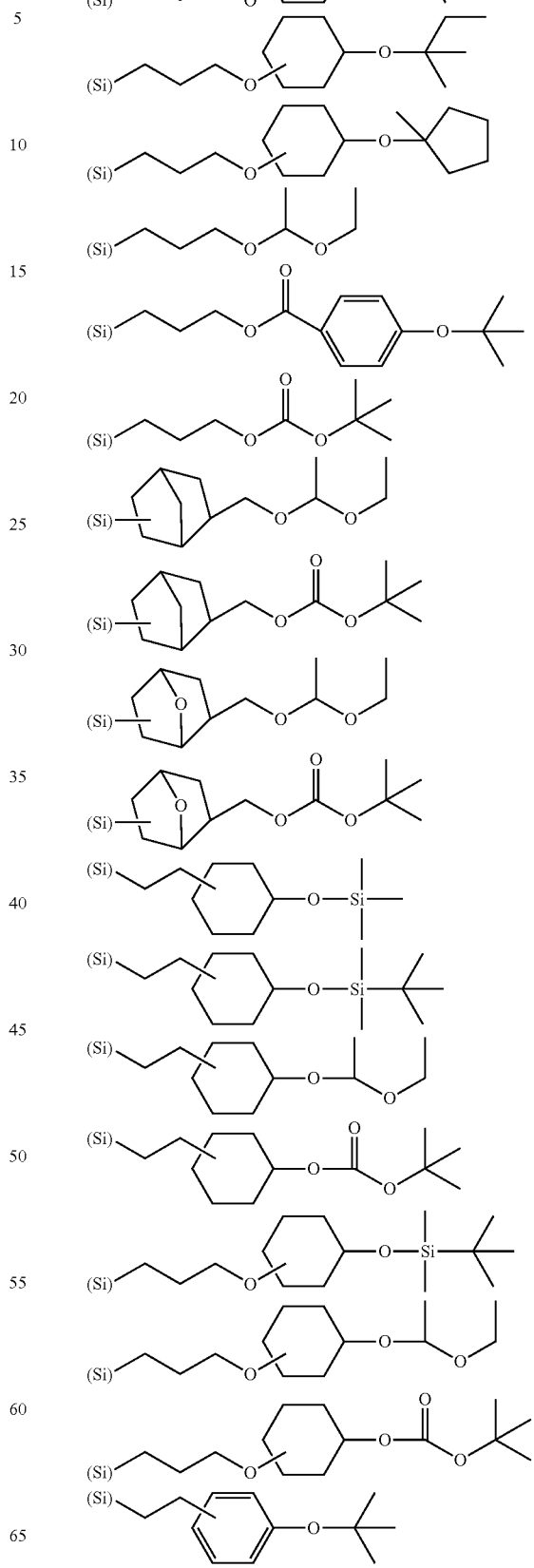

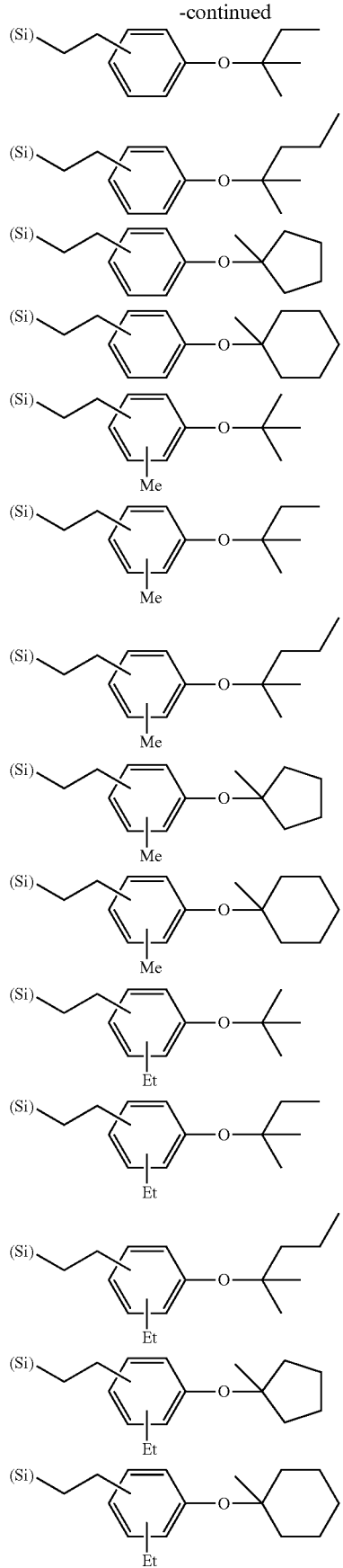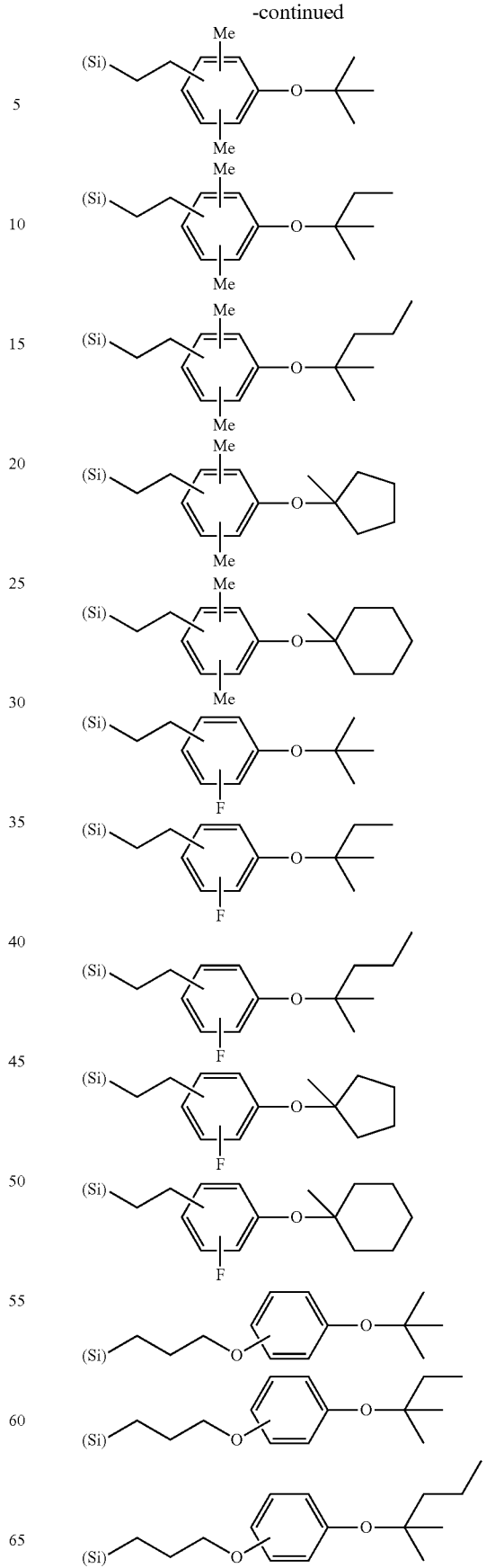

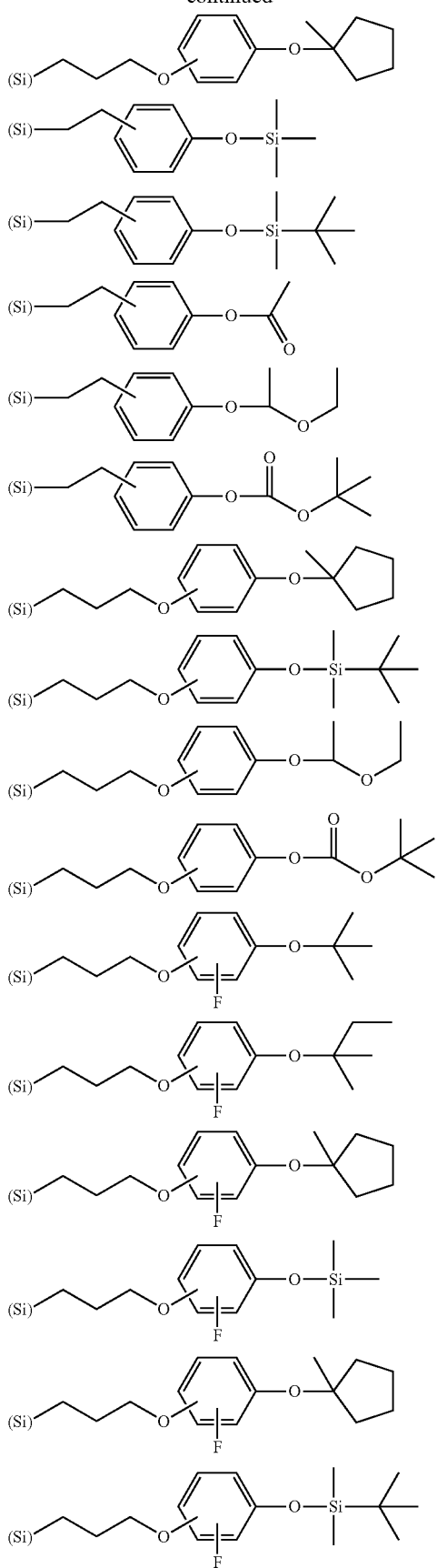
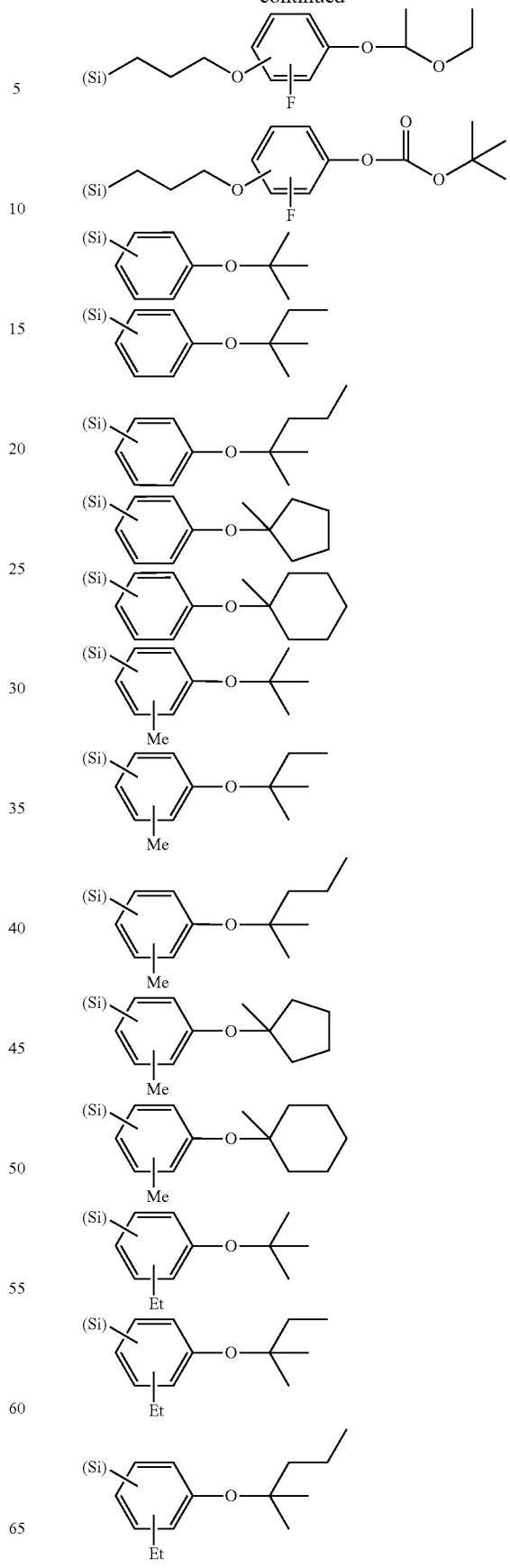

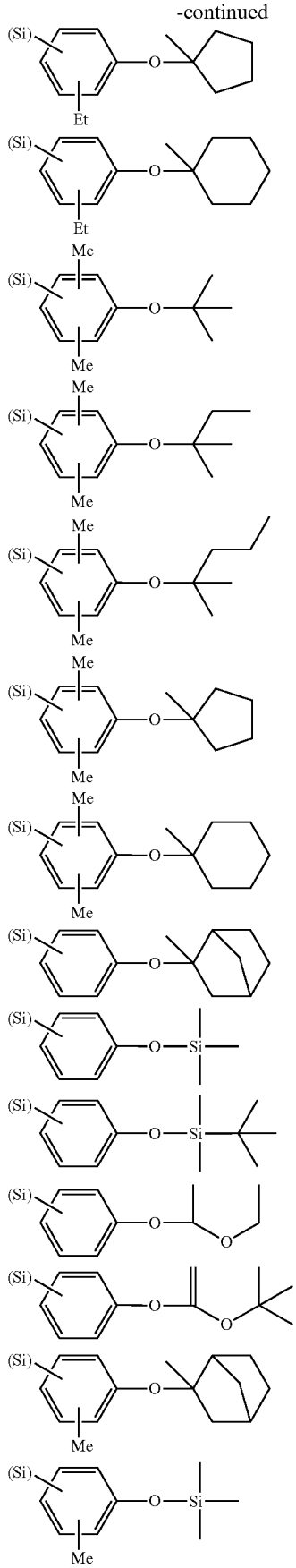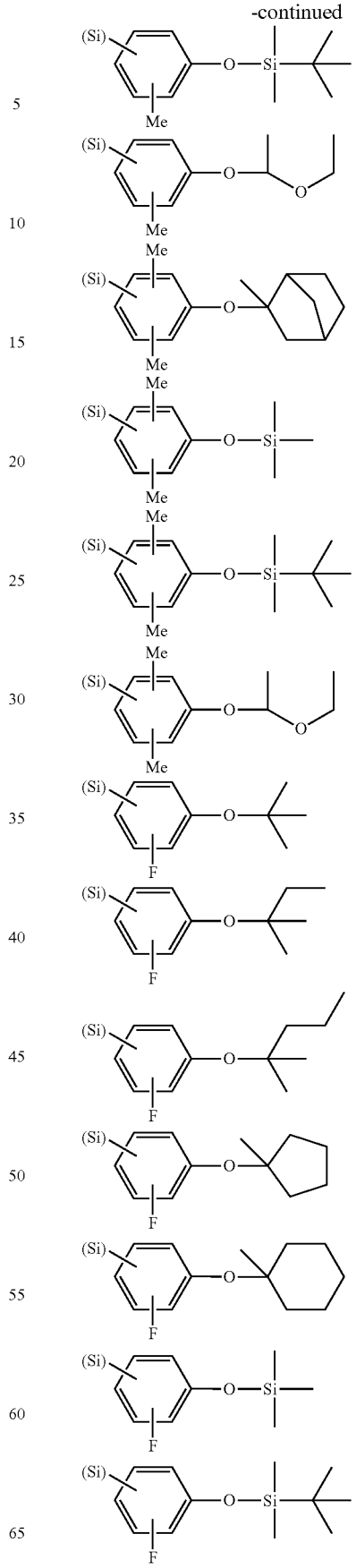

-continued
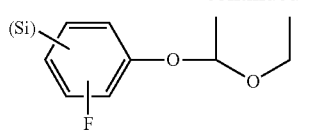
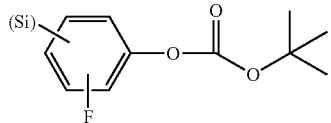
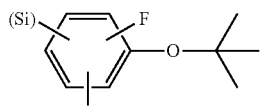
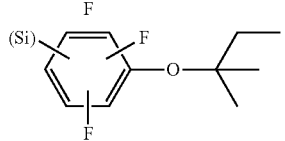
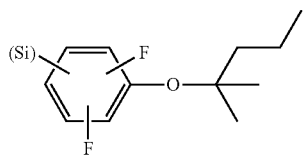
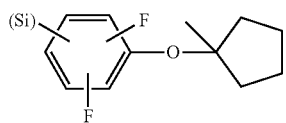
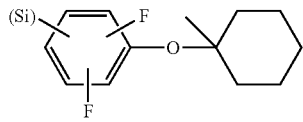
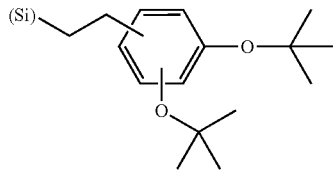
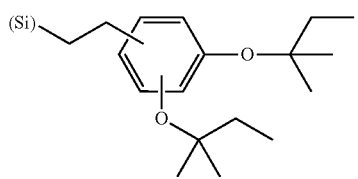
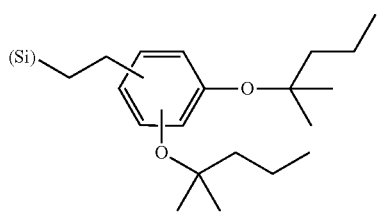
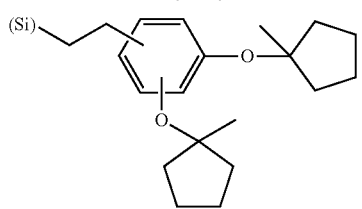
-continued
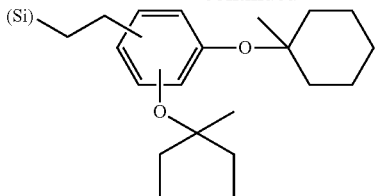
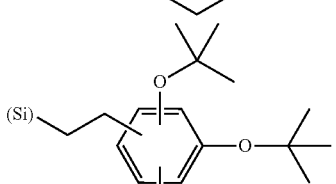
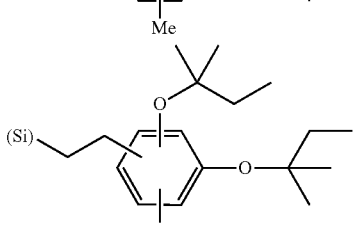
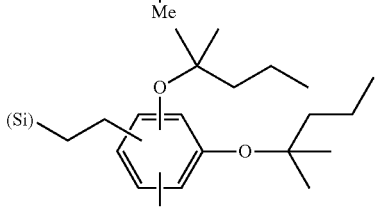
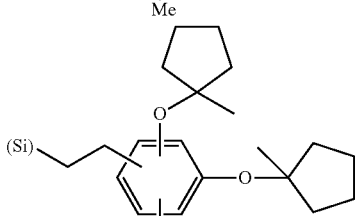
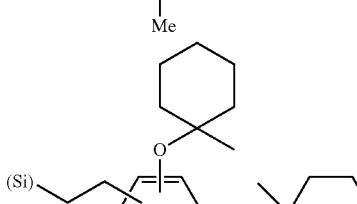
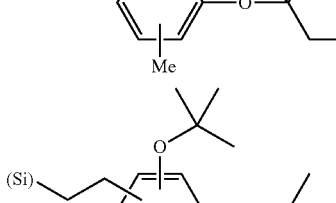
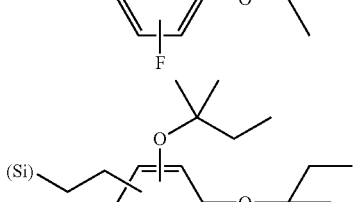

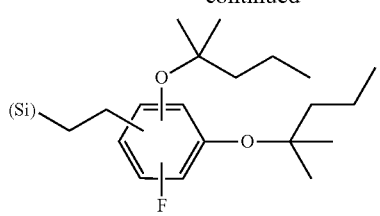
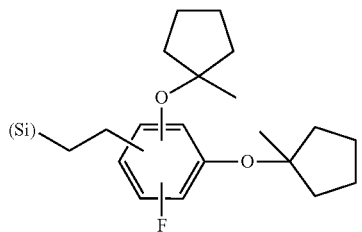
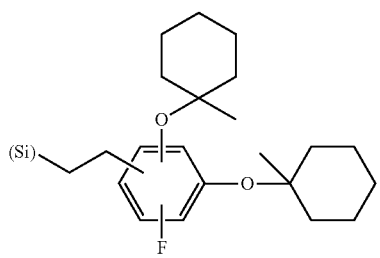
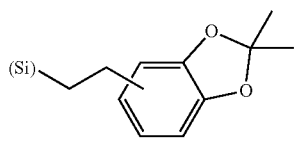
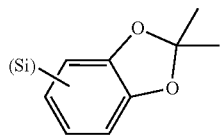
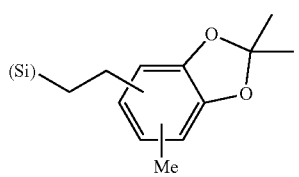
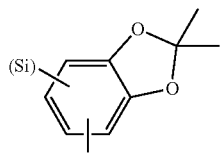
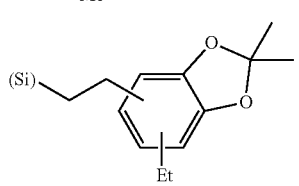
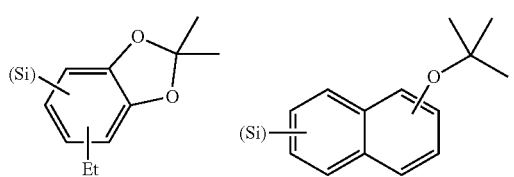
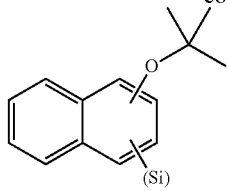
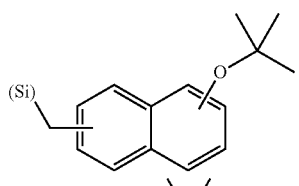
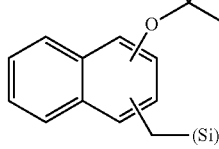
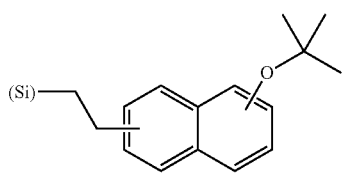
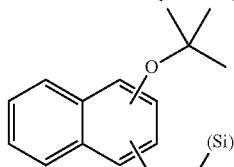
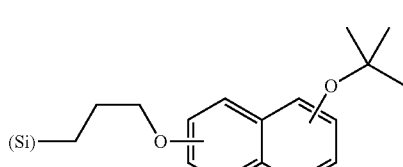
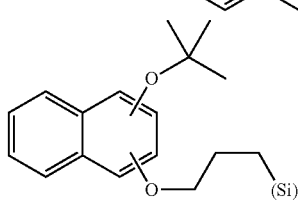

Illustrative example of the hydrolysable silicon compound used as a raw material to form the structure of the silicon-containing compound used in the present invention includes a compound having the foregoing structures on a silicon atom while containing, as the hydrolysable group, one, two, or three of chlorine, bromine, iodine, an acetoxy group, a methoxy group, an ethoxy group, a propoxy group, a butoxy group, or the like, and further a hydrogen atom or a monovalent organic group having 1 to 30 carbon atoms as $R^2$ and $R^3$.

Other illustrative example of the hydrolysable silicon compound used as a raw material to form the structure of the silicon-containing compound used in the present invention includes the following compounds.

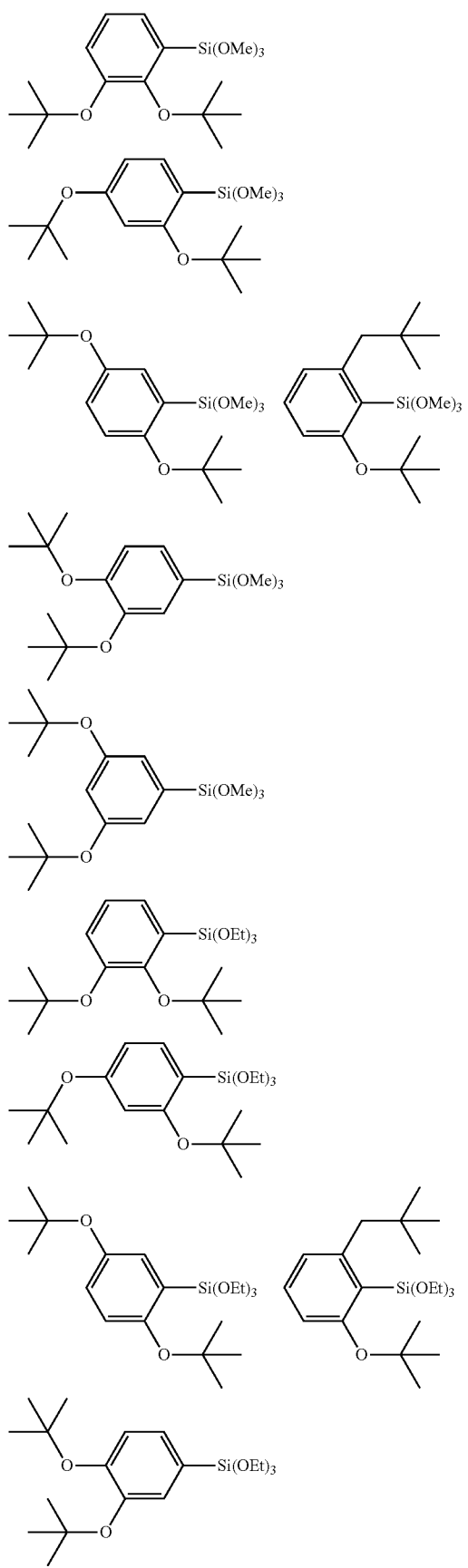
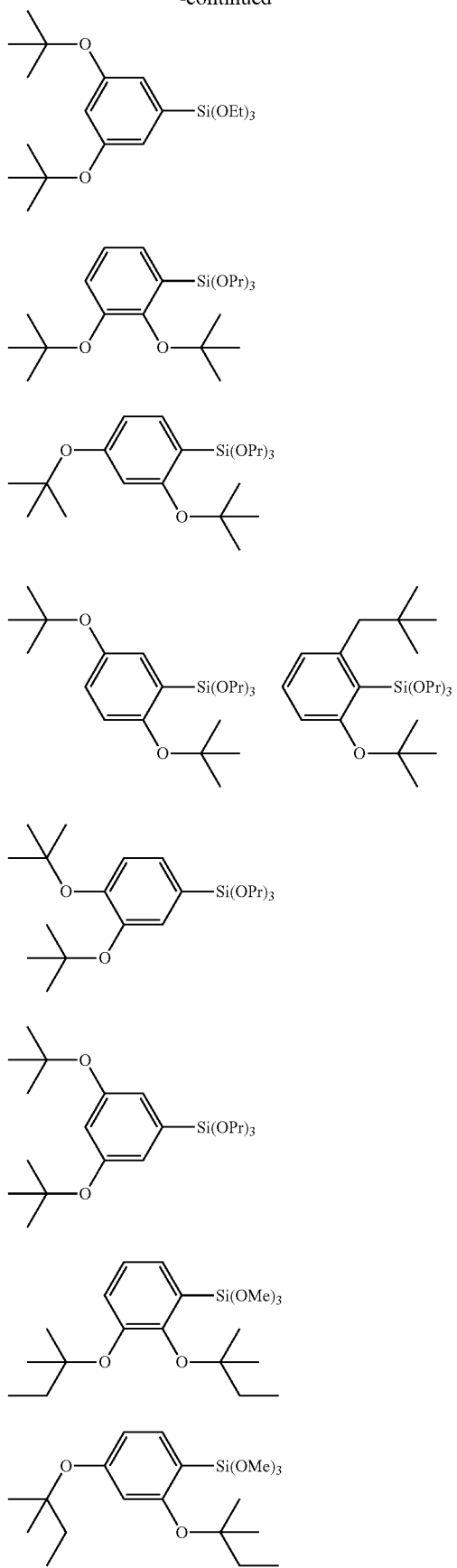

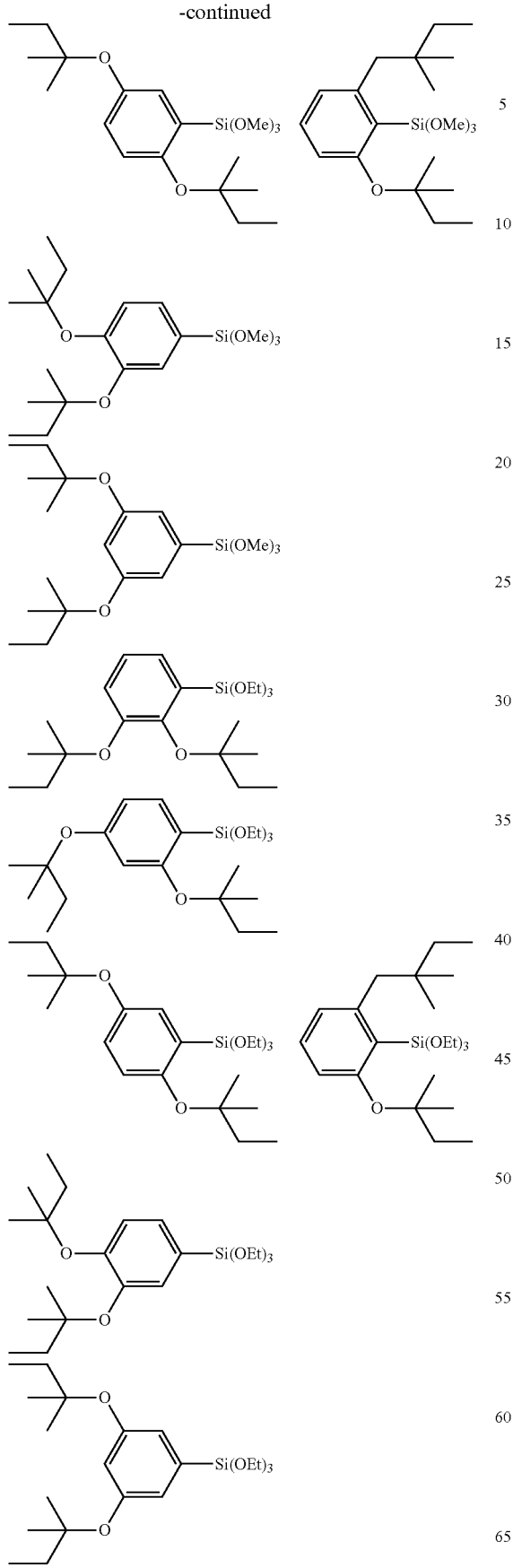
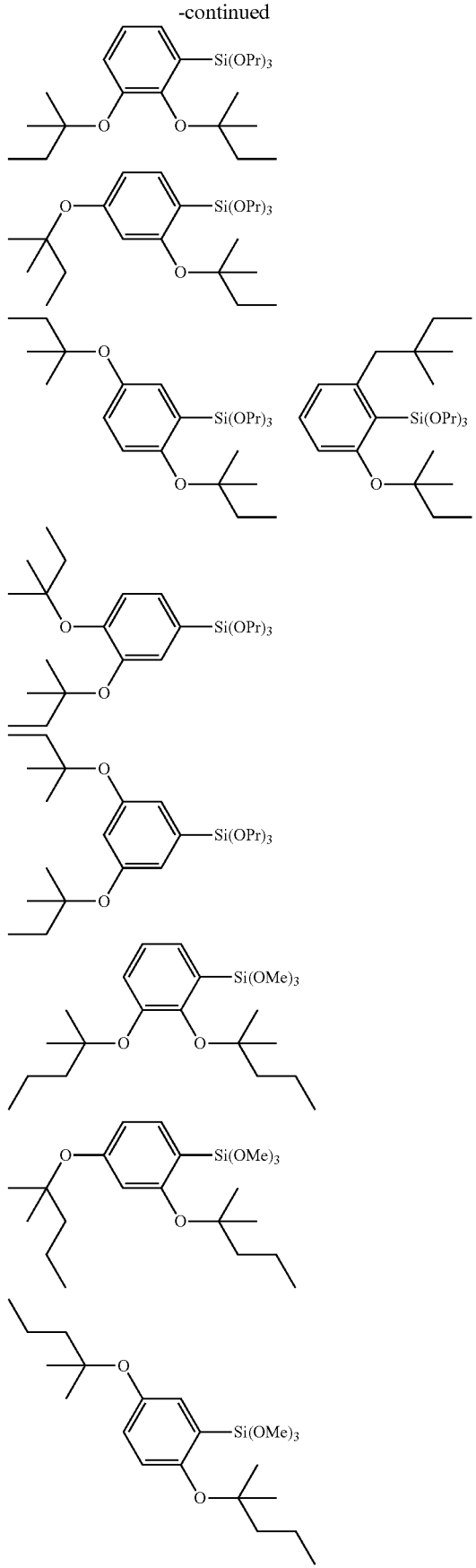

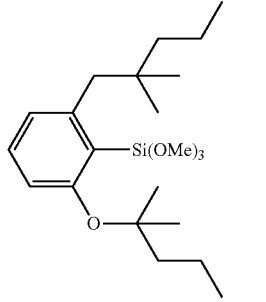
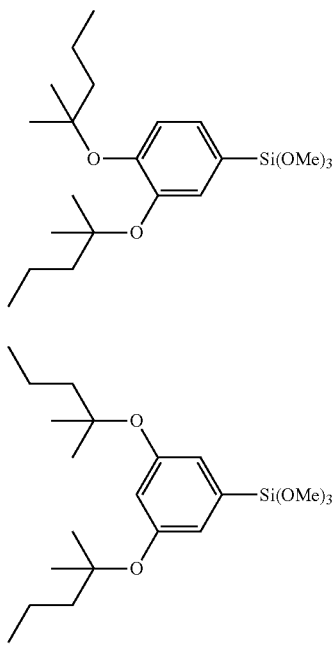
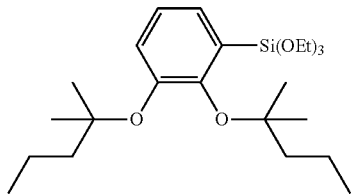
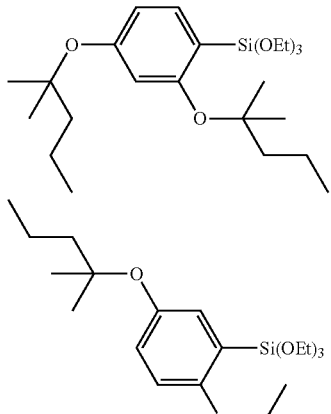
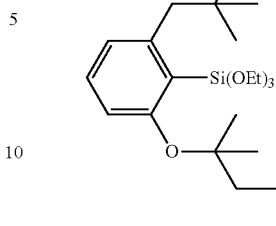
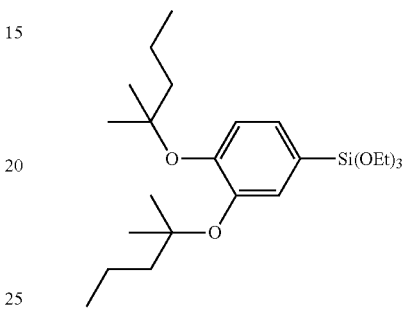
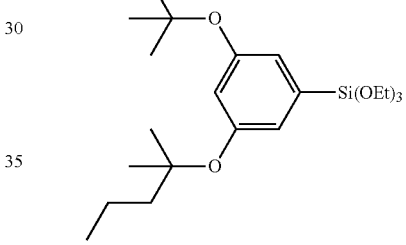
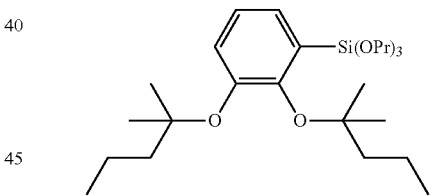
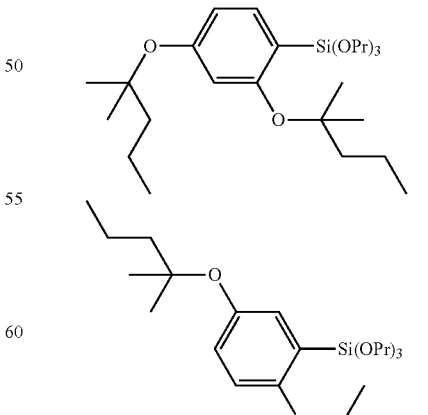

-continued
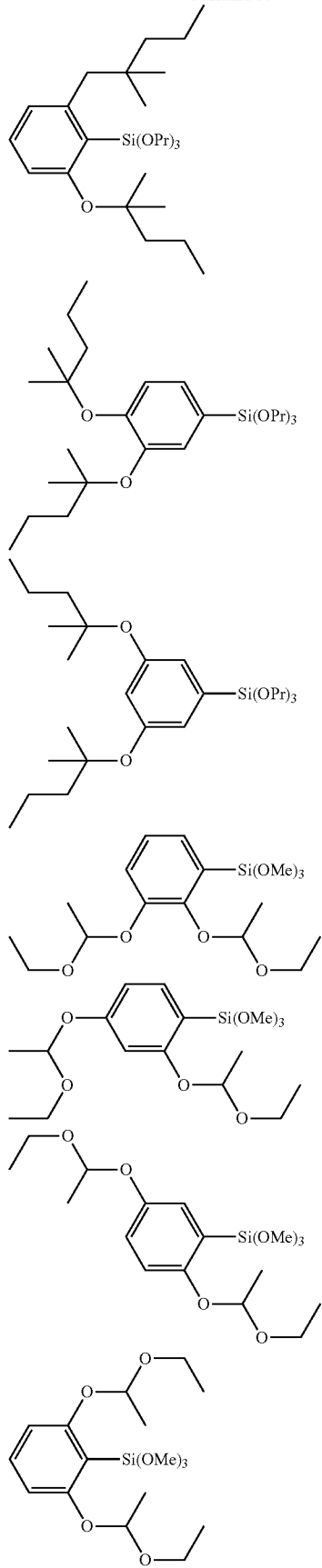
-continued
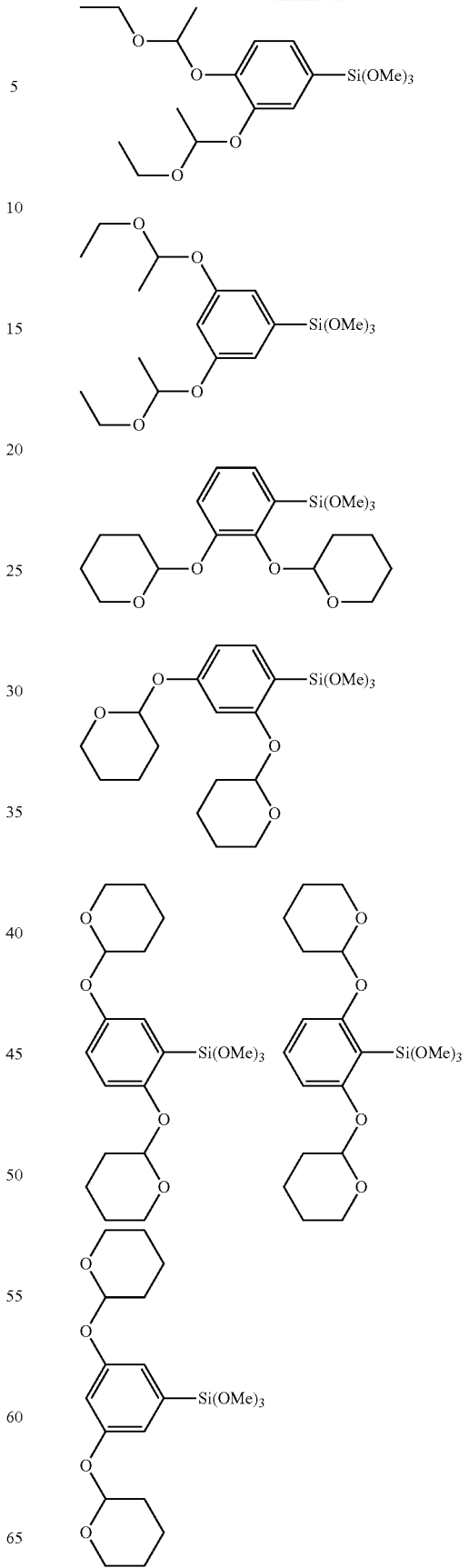

-continued
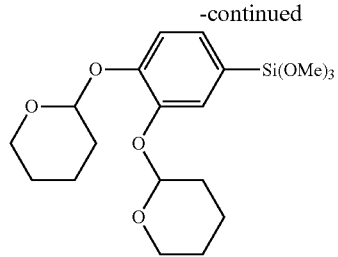
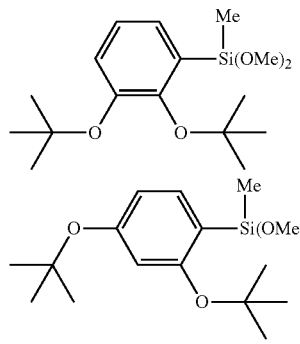
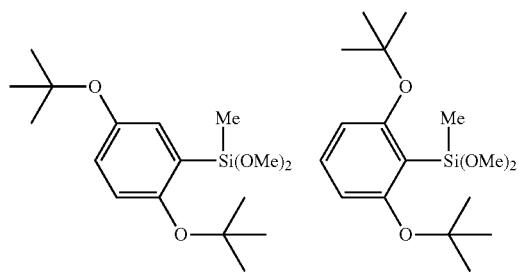
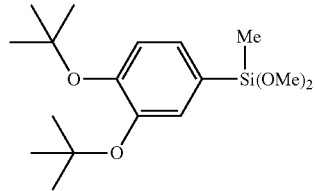
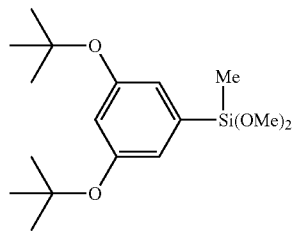
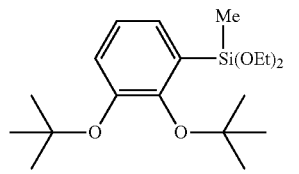
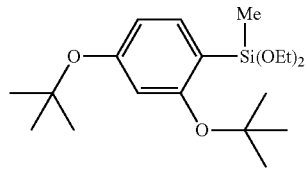
-continued
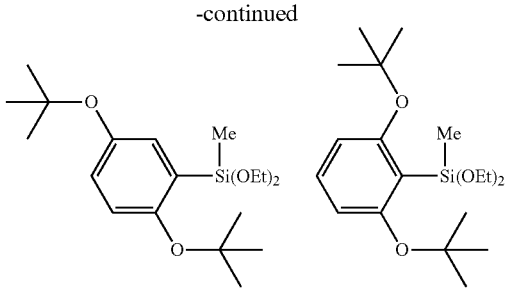
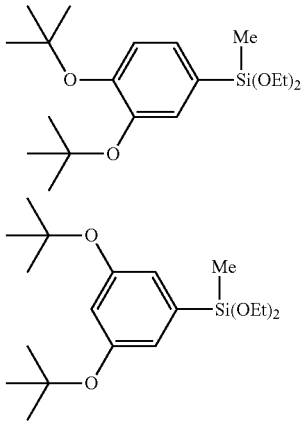
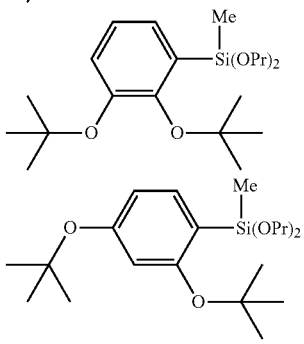
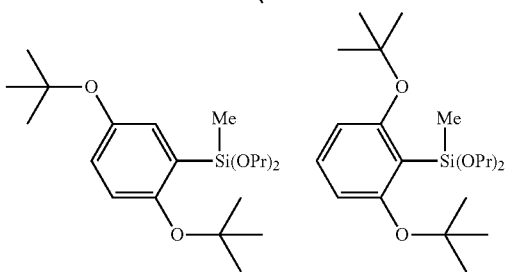
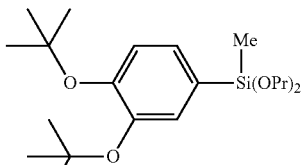
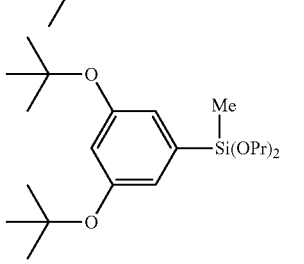

33
-continued
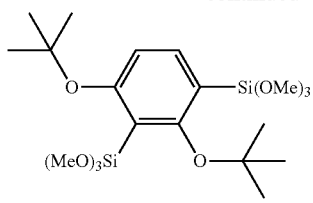
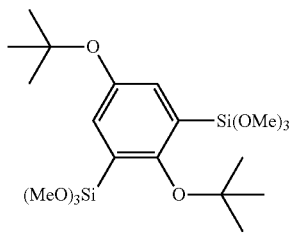
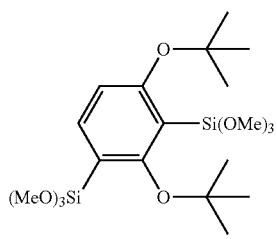
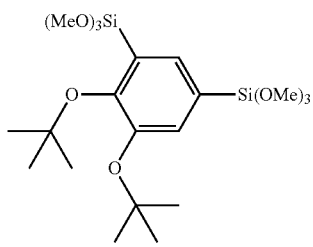
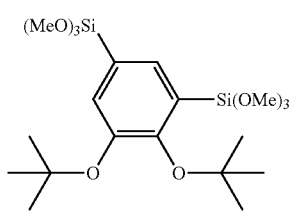
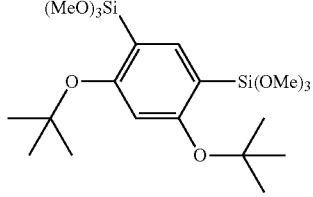
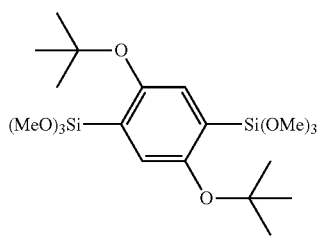
34
-continued
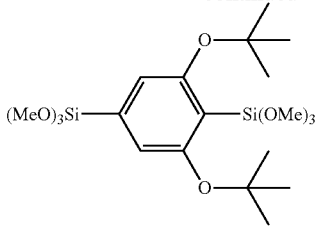
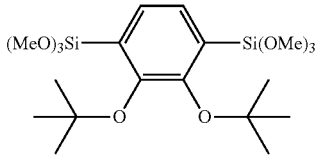
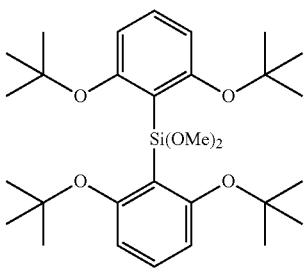
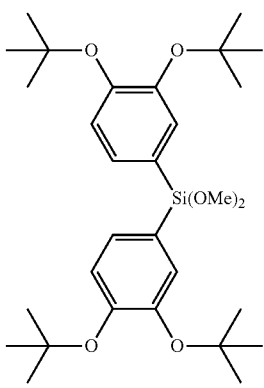
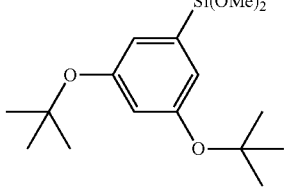
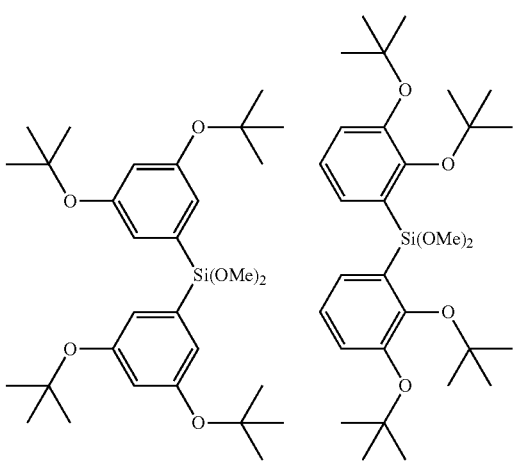
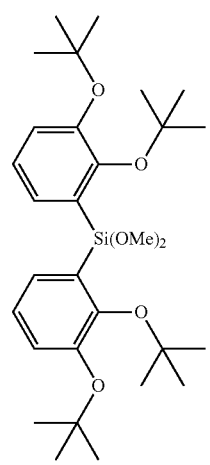

-continued

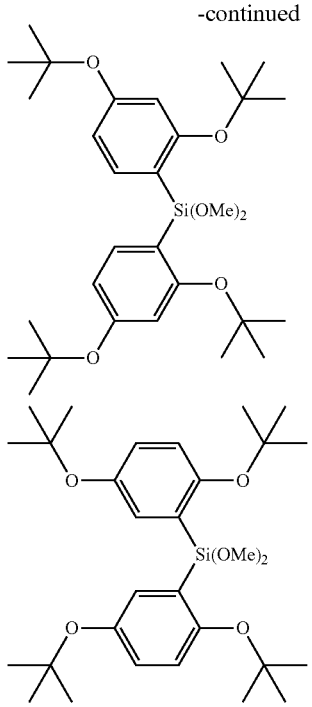

In addition, the silicon-containing compound that can be used in the patterning process of the present invention may be produced by hydrolysis condensation of a mixture which contains following hydrolysable monomers.

Illustrative example of the hydrolysable monomer includes tetramethoxy silane, tetraethoxy silane, tetrapropoxy silane, tetraisopropoxy silane, trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, t-butyl trimethoxy silane, t-butyl triethoxy silane, t-butyl tripropoxy silane, t-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, anisyl trimethoxy silane, anisyl triethoxy silane, anisyl tripropoxy silane, anysil triisopropoxy silane, tolyl trimethoxy silane, tolyl triethoxy silane, tolyl tripropoxy silane, tolyl triisopropoxy silane, phenetyl trimethoxy silane, phenetyl triethoxy silane, phenetyl tripropoxy silane, phenetyl triisopropoxy silane, naphthyl trimethoxy silane, naphthyl triethoxy silane, naphthyl tripropoxy silane, naphthyl triisopropoxy silane, dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-t-butyl dimethoxy silane, di-t-butyl diethoxy silane, di-t-butyl dipropoxy silane, di-t-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl)dimethoxy silane, bis(bicycloheptenyl)diethoxy silane, bis(bicycloheptenyl)dipropoxy silane, bis(bicycloheptenyl)diisopropoxy silane, bis(bicycloheptyl)dimethoxy silane, bis(bicycloheptyl)diethoxy silane, bis(bicycloheptyl)dipropoxy silane, bis(bicycloheptyl)diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, and dimethyl phenethyl ethoxy silane.

Preferable example of the hydrolysable monomers mentioned above includes tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenetyl trimethoxy silane, phenetyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, dipropyl dimethoxy silane, dibutyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, and dimethyl phenethyl methoxy silane.

Illustrative example of the organic group shown by $R^2$ and $R^3$ includes an organic group having one or more of a carbon-oxygen single bond or a carbon-oxygen double bond. Specifically an organic group having one or more of a group selected from the group consisting of an epoxy group, an ester group, an alkoxy group, and a hydroxyl group may be mentioned. Illustrative example thereof includes the group shown by the following general formula (1).

$$(P-Q_1-(S_1)_{v1}-Q_2-)_u-(T)_{v2}-Q_3-(S_2)_{v3}-Q_4- \quad (1)$$

wherein P represents a hydrogen atom, epoxy ring

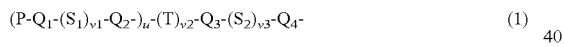

a hydroxyl group, an alkoxy group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represents $-C_qH_{(2q-p)}P_p-$ wherein P represents the same meaning as before; p represents an integer of 0 to 3; q represents an integer of 0 to 10 (however, q=0 means a single bond)); u represents an integer of 0 to 3; each of $S_1$ and $S_2$ independently represents —O—, —CO—, —OCO—, —COO—, or —OCOO—. Each of v1, v2, and v3 independently represents 0 or 1. Concurrently with the above, T represents an alicyclic or an aromatic divalent group optionally containing a heteroatom, and illustrative example of the alicyclic or the aromatic T optionally containing a heteroatom such as an oxygen atom includes those shown below. In T, respective bonding sites to $Q_2$ and to $Q_3$ are not particularly restricted; and the sites are appropriately selected by considering reactivity due to a steric factor, availability of a commercially available reagent, and so on.

T = 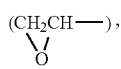

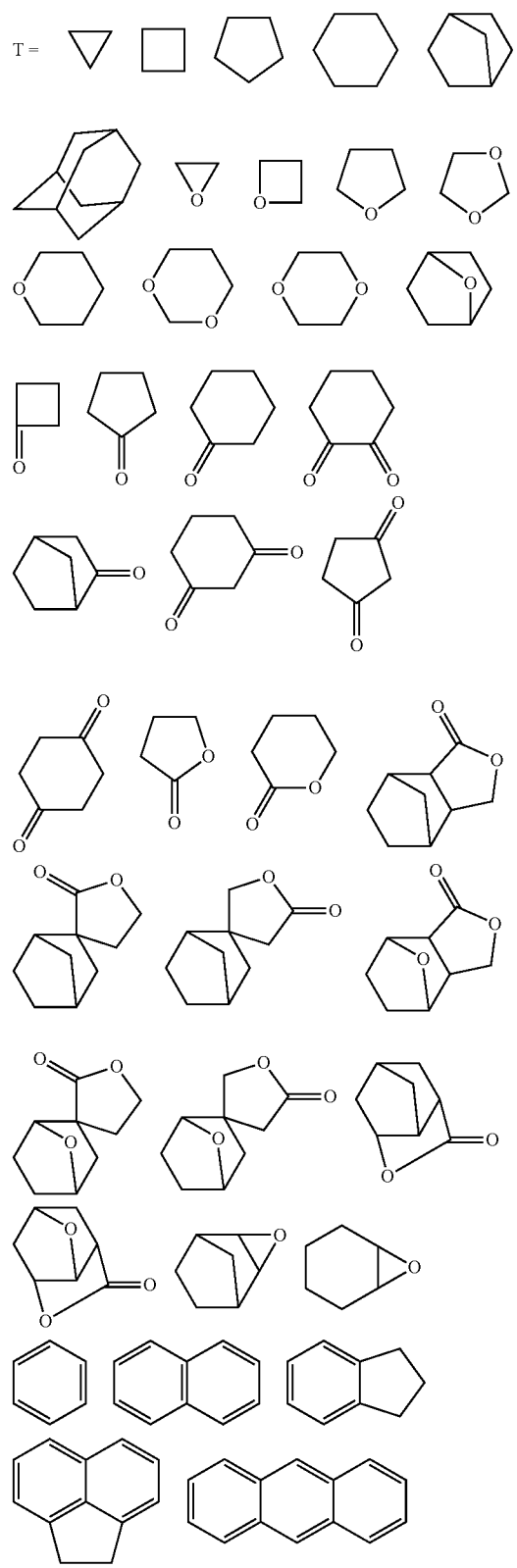

Preferable example of the organic group which is shown by the general formula (1) and has one or more of a carbon-oxygen single bond or a carbon-oxygen double bond includes those shown below.

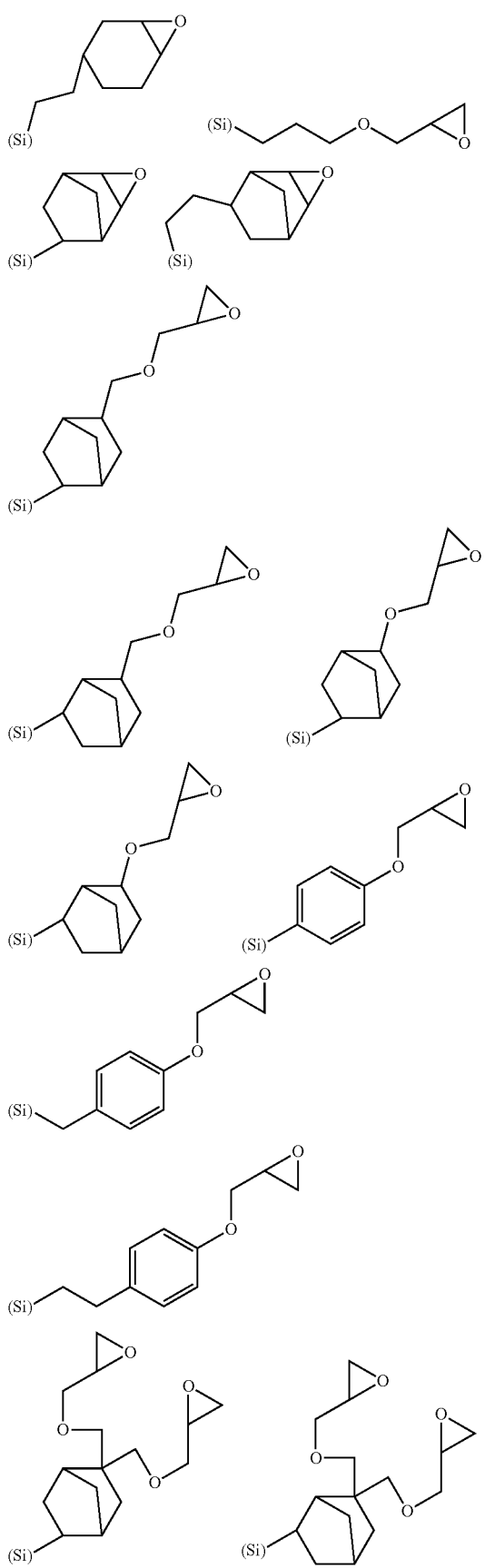
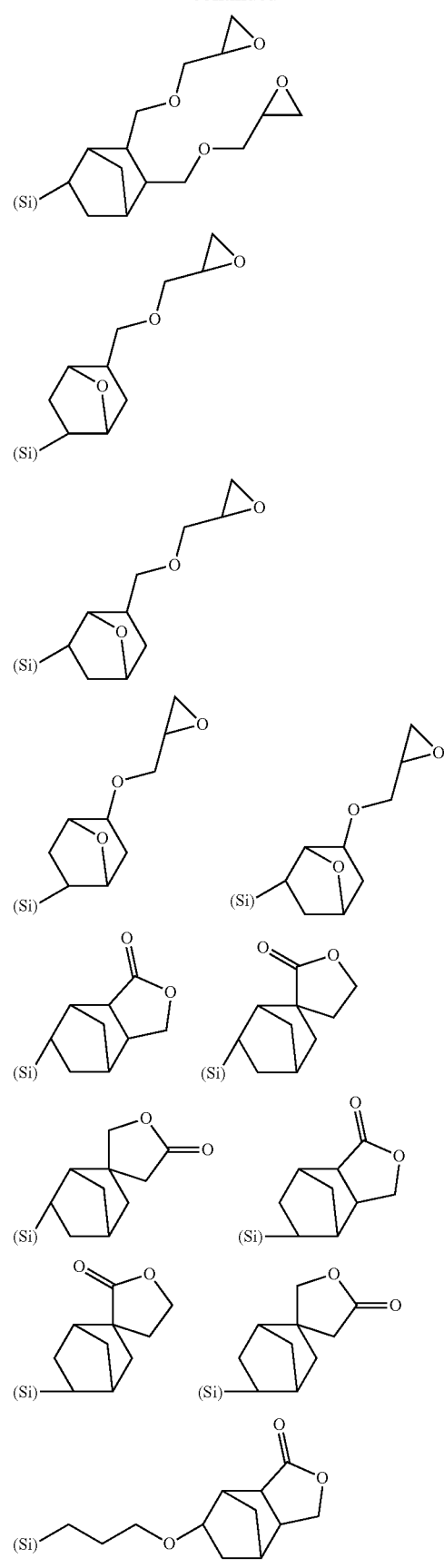

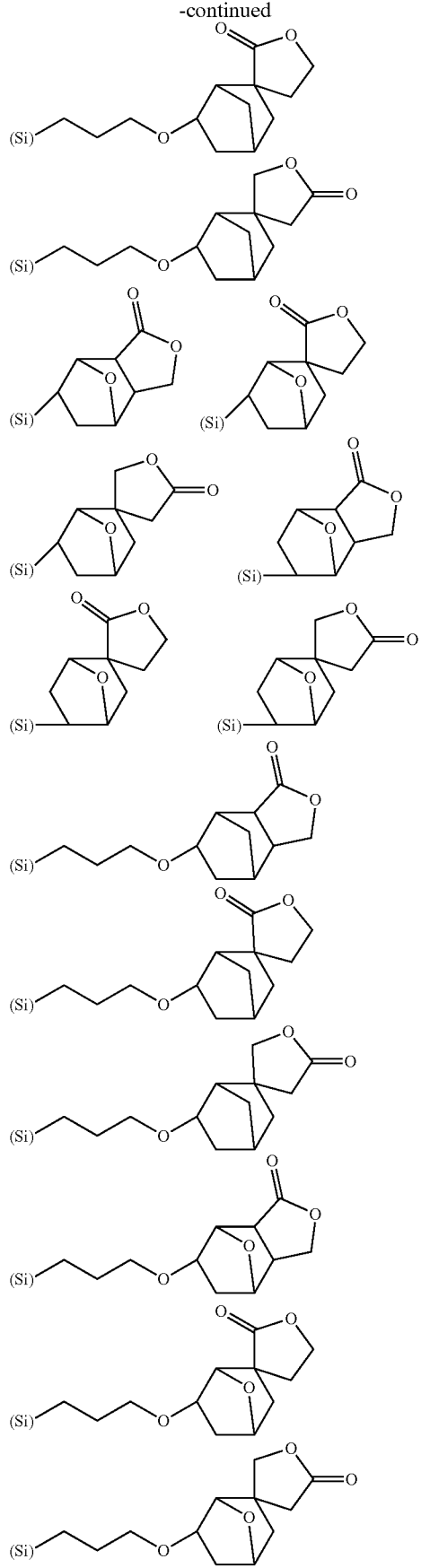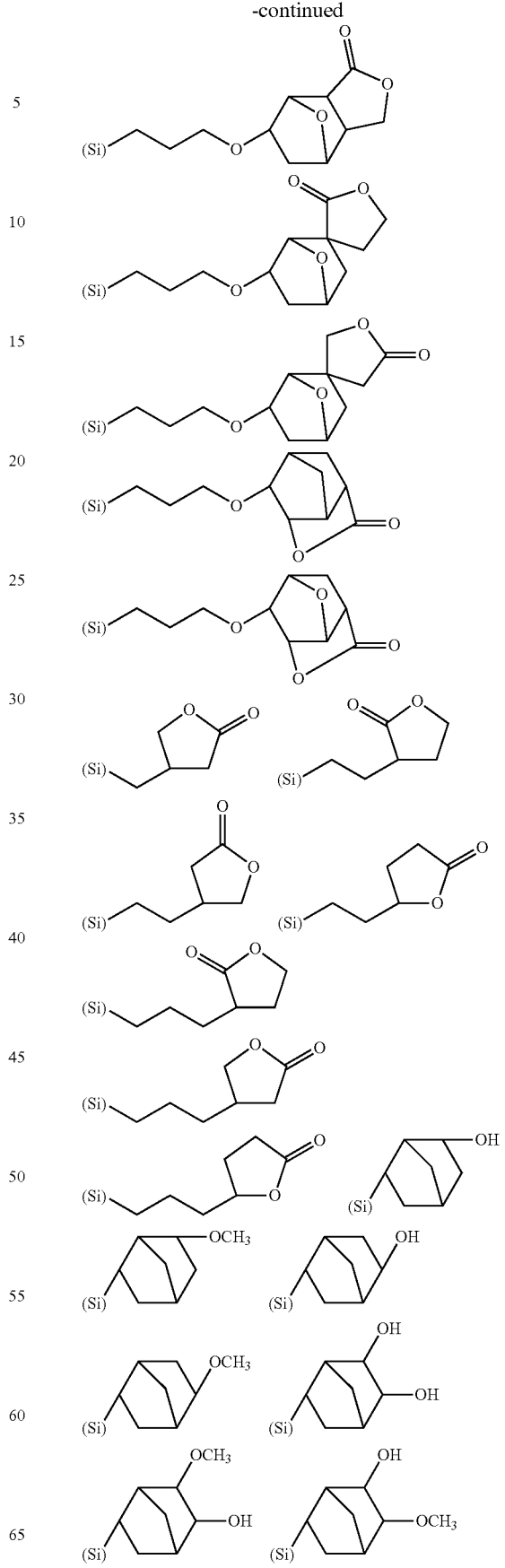

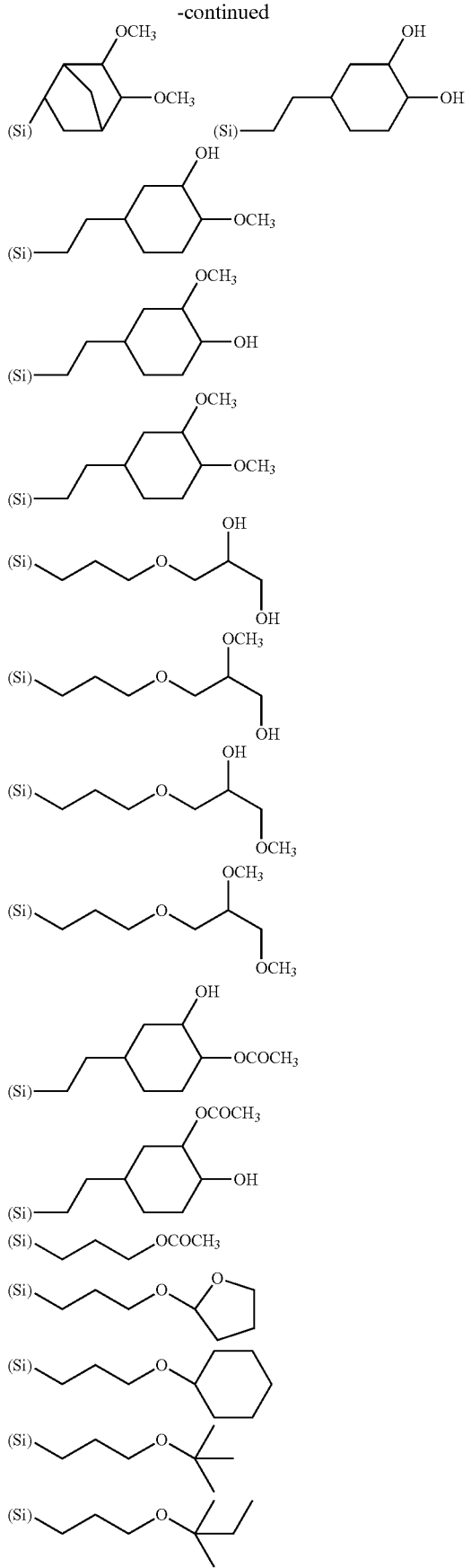
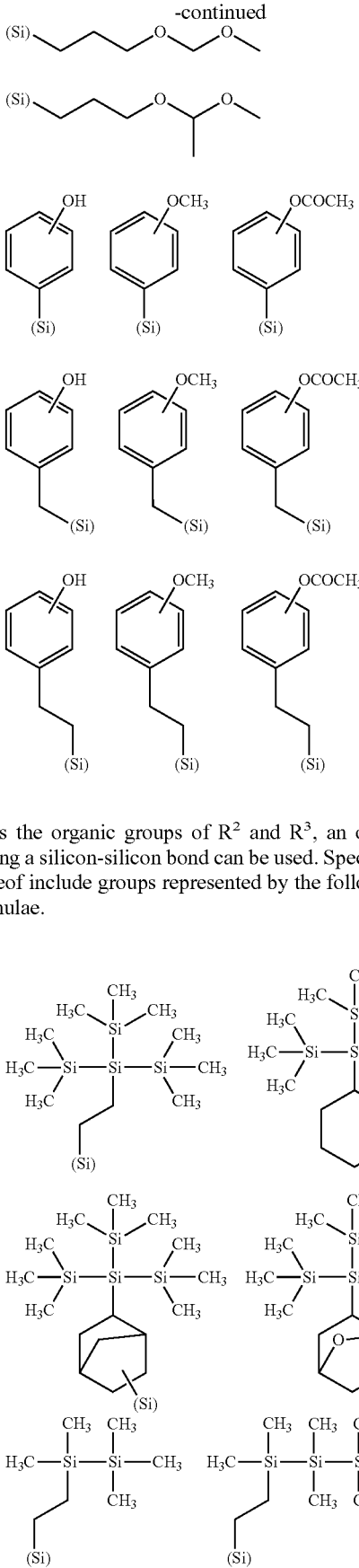
As the organic groups of $R^2$ and $R^3$, an organic group having a silicon-silicon bond can be used. Specific examples thereof include groups represented by the following general formulae.
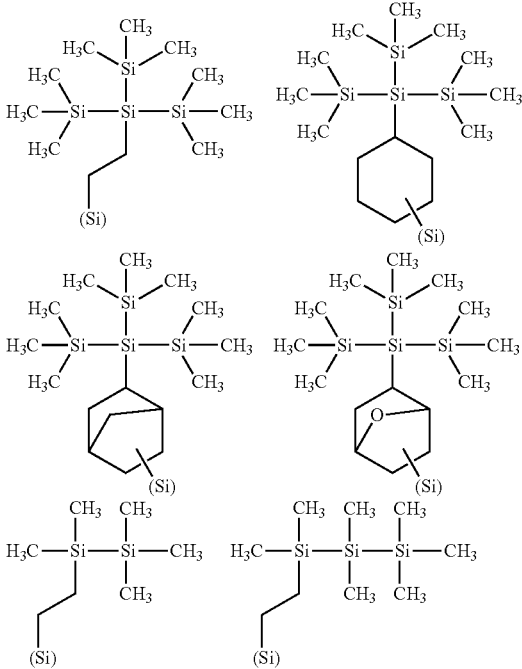

-continued

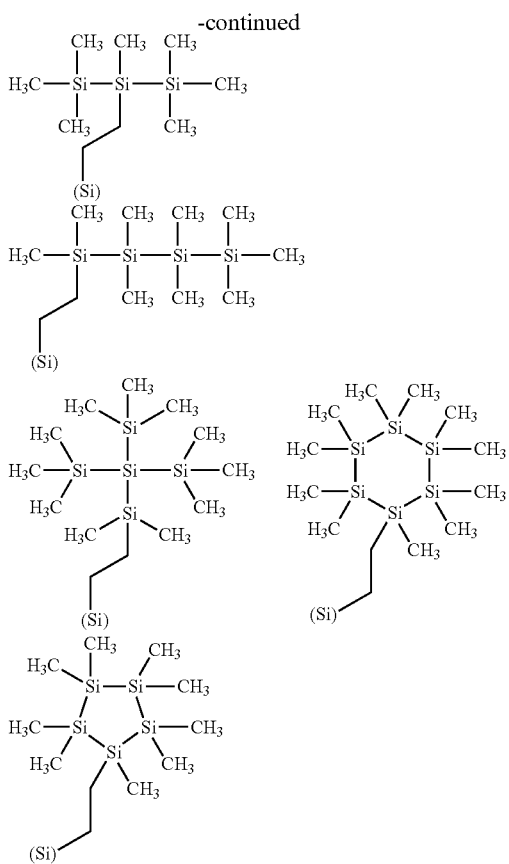

[Method for Synthesizing Silicon-Containing Compound]
(Synthesis Method 1: Acid Catalyst)

The silicon-containing compound used in the present invention can be produced, for example, by hydrolysis condensation of a raw material that contains the hydrolysable silicon compound mentioned above in the presence of an acid catalyst.

Illustrative example of the acid catalyst used for this hydrolysis condensation includes an organic acid such as formic acid, acetic acid, oxalic acid, and maleic acid; and hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. Use amount of the catalyst is $1\times10^{-6}$ to 10 moles, preferably $1\times10^{-5}$ to 5 moles, or more preferably $1\times10^{-4}$ to 1 mole, relative to 1 mole of the monomer.

Amount of water to obtain the silicon-containing compound by the hydrolysis condensation of the raw material that contains the hydrolysable silicon compound is preferably 0.01 to 100 moles, more preferably 0.05 to 50 moles, or still more preferably 0.1 to 30 moles, relative to 1 mole of the hydrolysable substituent which is bonded to the raw material that contains the hydrolysable silicon compound. When the amount is 100 moles or less, small equipment can be used for the reaction; and thus, it is economical.

Operational procedure of adding the raw material that contains the hydrolysable silicon compound into an aqueous catalyst solution is employed to start the hydrolysis condensation reaction. At this time, an organic solvent may be added in the aqueous catalyst solution, or the raw material that contains the hydrolysable silicon compound may be diluted by an organic solvent, or both of them may be done. The reaction temperature is 0 to 100° C., or preferably 5 to 80° C.

A method, wherein the temperature thereof is kept at 5 to 80° C. during the time of gradual addition of the raw material that contains the hydrolysable silicon compound, and then, aging is done at 20 to 80° C., is preferable.

Preferable example of the organic solvent which can be added to the aqueous solution containing a catalyst or can be used to dilute the raw material containing a hydrolyzable silicon compound include methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pilvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Among these organic solvents, a water-soluble solvent is preferable. Illustrative example thereof includes an alcohol such as methanol, ethanol, 1-propanol, and 2-propanol; a polyol such as ethylene glycol and propylene glycol; a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, and tetrahydrofuran. Among them, a solvent having a boiling point of 100° C. or lower is particularly preferable.

Meanwhile, the amount of the organic solvent to be used is preferably 0 to 1,000 mL, particularly preferably 0 to 500 mL, relative to 1 mole of the raw material containing a hydrolyzable silicon compound. As the amount of the organic solvent to be used is smaller, a reaction vessel is smaller, and therefore it is economic.

Thereafter, if necessary, a neutralization reaction of the catalyst is carried out to obtain an aqueous reaction mixture solution. Use amount of a alkaline substance for neutralization is preferably 0.1 to 2 equivalents relative to the acid used as the catalyst. Any alkaline substance may be used as far as the substance shows a alkaline property in water.

Subsequently, a byproduct such as alcohol produced by hydrolysis-condensation reaction is preferably removed from the reaction mixture under reduced pressure. The temperature of heating the reaction mixture at this time depends on the types of the added organic solvent and the alcohol produced by the reaction, and is preferably 0 to 100° C., more preferably 10 to 90° C., further preferably 15 to 80° C. The degree of reduced pressure at this time depends on the types of organic solvent and alcohol to be removed, an exhaust device, a condenser, and a heating temperature, and is preferably equal to or less than atmospheric pressure, more preferably an absolute pressure of 80 kPa or less, further an absolute pressure of 50 kPa or less. It is difficult to accurately know the amount of alcohol to be removed at this time, but it is desirable that about 80% by mass or more of produced alcohol is removed.

Next, the acid catalyst used in the hydrolysis-condensation may be removed from the reaction mixture. In order to remove the acid catalyst, water and the reaction mixture are mixed, and the silicon-containing compound is extracted with an organic solvent. The organic solvent used at this time is preferably a substance which is capable of dissolving a silicon-containing compound and is mixed in water to separate two layers. Illustrative examples thereof include methanol, ethanol, 1-propanol, 2-propanol, 1-butanol, 2-butanol, 2-methyl-1-propanol, acetone, tetrahydrofuran, toluene, hexane, ethyl acetate, acetone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pilvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl, and a mixture thereof.

Further, a mixture of a water-soluble organic solvent and a poorly water-soluble organic solvent can be used. Preferable illustrative examples thereof include a methanol-ethyl acetate mixture, an ethanol-ethyl acetate mixture, a 1-propanol-ethyl acetate mixture, a 2-propanol-ethyl acetate mixture, a butanediol monomethyl ether-ethyl acetate mixture, a propylene glycol monomethyl ether-ethyl acetate mixture, an ethylene glycol monomethyl ether-ethyl acetate mixture, a butanediol monoethyl ether-ethyl acetate mixture, a propylene glycol monoethyl ether-ethyl acetate mixture, an ethylene glycol monoethyl ether-ethyl acetate mixture, a butanediol monopropyl ether-ethyl acetate mixture, a propylene glycol monopropyl ether-ethyl acetate mixture, an ethylene glycol monopropyl ether-ethyl acetate mixture, a methanol-methyl isobutyl ketone mixture, an ethanol-methyl isobutyl ketone mixture, a 1-propanol-methyl isobutyl ketone mixture, a 2-propanol-methyl isobutyl ketone mixture, a propylene glycol monomethyl ether-methyl isobutyl ketone mixture, an ethylene glycol monomethyl ether-methyl isobutyl ketone mixture, a propylene glycol monoethyl ether-methyl isobutyl ketone mixture, an ethylene glycol monoethyl ether-methyl isobutyl ketone mixture, a propylene glycol monopropyl ether-methyl isobutyl ketone mixture, an ethylene glycol monopropyl ether-methyl isobutyl ketone mixture, a methanol-cyclopentyl methyl ether mixture, an ethanol-cyclopentyl methyl ether mixture, a 1-propanol-cyclopentyl methyl ether mixture, a 2-propanol-cyclopentyl methyl ether mixture, a propylene glycol monomethyl ether-cyclopentyl methyl ether mixture, an ethylene glycol monomethyl ether-cyclopentyl methyl ether mixture, a propylene glycol monoethyl ether-cyclopentyl methyl ether mixture, an ethylene glycol monoethyl ether-cyclopentyl methyl ether mixture, a propylene glycol monopropyl ether-cyclopentyl methyl ether mixture, an ethylene glycol monopropyl ether-cyclopentyl methyl ether mixture, a methanol-propylene glycol methyl ether acetate mixture, an ethanol-propylene glycol methyl ether acetate mixture, a 1-propanol-propylene glycol methyl ether acetate mixture, a 2-propanol-propylene glycol methyl ether acetate mixture, a propylene glycol monomethyl ether-propylene glycol methyl ether acetate mixture, an ethylene glycol monomethyl ether-propylene glycol methyl ether acetate mixture, a propylene glycol monoethyl ether-propylene glycol methyl ether acetate mixture, an ethylene glycol monoethyl ether-propylene glycol methyl ether acetate mixture, a propylene glycol monopropyl ether-propylene glycol methyl ether acetate mixture, and an ethylene glycol monopropyl ether-propylene glycol methyl ether acetate mixture, though the combination is not limited to the above.

Meanwhile, mixing ratio of the water-soluble organic solvent to the poorly water-soluble organic solvent is appropriately selected. The amount of the water-soluble organic solvent is 0.1 to 1,000 parts by mass, preferably 1 to 500 parts by mass, further preferably 2 to 100 parts by mass, relative to 100 parts by mass of the poorly water-soluble organic solvent.

Subsequently, the reaction mixture may be washed with neutral water. As the neutral water, so-called deionized water or e-pure water may be usually used. The amount of water is 0.01 to 100 L, preferably 0.05 to 50 L, more preferably 0.1 to 5 L, relative to 1 L of silicon-containing compound solution. An aqueous layer may be separated by the washing method in which the extract and water are placed in a container and the mixture is stirred and then allowed to stand. The number of washing needs to be one or more. However, even when the number is 10 or more, a washing effect corresponding to the number cannot be obtained. Therefore, the number is preferably 1 to about 5.

Illustrative examples of another method for removing an acid catalyst include a method using an ion exchange resin, and a method in which an acid catalyst is neutralized with an epoxy compound such as ethylene oxide and propylene oxide and then removed. The method can be appropriately selected according to an acid catalyst used in the reaction.

This water-washing operation transfers one part of the silicon-containing compound to an aqueous layer. Thus, the operation may produce substantially the same effect as a fractionation procedure. Therefore, the number of water-washing and the amount of water for washing may be appropriately selected in consideration of catalyst-removing effect and fractionation effect.

To any of the silicon-containing compound solution having the remaining acid catalyst therein and the silicon-containing compound solution having the acid catalyst removed therefrom is added a final solvent, and then, the solvents therein are exchanged under reduced pressure to obtain an intended solution of the silicon-containing compound. Temperature at the time of this solvent exchange operation is preferably 0 to 100° C., more preferably 10 to 90° C., or still more preferably 15 to 80° C., though it is depending on the reaction solvent and the extraction solvent to be removed. Degree of the reduced pressure in this operation is preferably an atmospheric pressure or lower, more preferably 80 kPa or lower in the absolute pressure, or still more preferably 50 kPa or lower in the absolute pressure, though it depends on kinds of the extraction solvent to be removed, an exhausting equipment, a condensation equipment, and heating temperature.

In order to improve the stability of silicon-containing compound during the solvent exchange, a monohydric or polyhydric alcohol having as a substituent a cyclic ether described in Japanese Patent Laid-Open Publication No. 2009-126940, paragraphs [0181] to [0182] may be added as a stabilizer. The amount of the alcohol to be added is 0 to 25 parts by mass, preferably 0 to 15 parts by mass, more preferably 0 to 5 parts by mass, relative to 100 parts by mass of silicon-containing compound in the solution before the solvent exchange. In the case of addition, the amount is preferably 0.5 parts by mass or more. If the cyclic ether is necessary to the solution before the solvent exchange, the monohydric or polyhydric alcohol having cyclic ether as a substituent may be added to perform solvent exchange.

When the concentration of silicon-containing compound is equal to or more than a predetermined concentration, a further condensation reaction progresses, and the silicon-containing compound may be changed into a state in which it cannot be dissolved again. Therefore, the silicon-containing compound is preferably kept in a solution having an appropriate concentration. When the concentration is too low, the amount of solvent is too large. Therefore, the solution having an appropriate concentration is preferable from the viewpoint of economy. The concentration at this time is preferably 0.1 to 20% by mass.

The final solvent to be added to the solution of silicon-containing compound is preferably an alcohol-based solvent, particularly preferably monoalkyl ether derivatives of ethylene glycol, diethylene glycol, triethylene glycol, propylene glycol, dipropylene glycol, butanediol, and so on. Specifically, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether are preferable.

When the solvent is a main component, a non-alcohol-based solvent may be added as an auxiliary solvent. Illustrative example of the auxiliary solvent includes acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pilvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

Another operation procedure using an acid catalyst of initiating a hydrolysis-condensation reaction is to add water or aqueous organic solvent to the raw material containing a hydrolyzable silicon compound or an organic solution of the silicon compound. At this time, the catalyst may be added to the raw material containing a hydrolyzable silicon compound or the organic solution of the silicon compound, or to water or the aqueous organic solvent. The reaction temperature is 0 to 100° C., preferably 10 to 80° C. A method in which the temperature is heated to 10 to 50° C. during addition of water and increased to 20 to 80° C., followed by aging is preferable.

When the organic solvent is used, a water-soluble solvent is preferable. Illustrative example thereof includes methanol, ethanol, 1-propanol, 2-propanol, 1-butanol, 2-butanol, 2-methyl-1-propanol, acetone, tetrahydrofuran, and acetonitrile; a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether acetate; and a mixture of these solvents.

The amount of the organic solvent to be used is preferably 0 to 1,000 mL, particularly preferably 0 to 500 mL, relative to 1 mole of raw material containing a hydrolyzable silicon compound. As the amount of the organic solvent to be used is smaller, a reaction vessel is smaller, and therefore it is economic. The resulting reaction mixture is post-treated in the same manner as in the above-described method, to obtain a silicon-containing compound.

(Synthesis Method 2: Alkaline Catalyst)

Alternatively, the silicon-containing compound may be produced, for example, by hydrolysis condensation of a raw material that contains the hydrolysable silicon compound in the presence of an alkaline catalyst. Illustrative example of the alkaline catalyst used in this reaction includes methylamine, ethylamine, propylamine, butylamine, ethylene diamine, hexamethylene diamine, dimethylamine, diethylamine, ethyl methyl amine, trimethylamine, triethylamine, tripropylamine, tributylamine, cyclohexylamine, dicyclohexylamine, monoethanol amine, diethanol amine, dimethyl monoethanol amine, monomethyl diethanol amine, triethanol amine, diazabicyclooctane, diazabicyclocyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethyl ammonium hydroxide, cholin hydroxide, tetrapropyl ammonium hydroxide, tetrabutyl ammonium hydroxide, ammonia, lithium hydroxide, sodium hydroxide, potassium hydroxide, barium hydroxide, and calcium hydroxide. Use amount of the catalyst is $1\times10^{-6}$ to 10 moles, preferably $1\times10^{-5}$ to 5 moles, or more preferably $1\times10^{-4}$ to 1 mole, relative to 1 mole of the raw material that contains the hydrolysable silicon compound.

Amount of water to obtain the silicon-containing compound by the hydrolysis condensation reaction of the foregoing raw material that contains the hydrolysable silicon compound is preferably 0.1 to 50 moles, relative to 1 mole of the hydrolysable substituent which is bonded to the raw material that contains the hydrolysable silicon compound. When the amount is not more than 50 moles, small equipment can be used for the reaction; and thus, it is economical.

Operational procedure of adding the raw material that contains the hydrolysable silicon compound into an aqueous catalyst solution is employed to start the hydrolysis condensation reaction. At this time, an organic solvent may be added in the aqueous catalyst solution, or the raw material that contains the hydrolysable silicon compound may be diluted by an organic solvent, or both of them may be done. The reaction temperature is 0 to 100° C., or preferably 5 to 80° C. A method, wherein the temperature thereof is kept at 5 to 80° C. during the time of gradual addition of the raw material that contains the hydrolysable silicon compound, and then, aging is done at 20 to 80° C., is preferable.

Preferable organic solvents which can be added to the aqueous alkaline catalyst solution or can dilute the raw material that contains the hydrolysable silicon compound are similar to those mentioned as the examples of the organic solvent which can be added into the aqueous acid catalyst solution. Meanwhile, use amount of the organic solvent is preferably 0 to 1,000 mL relative to 1 mole of the raw material that contains the hydrolysable silicon compound to carry out the reaction economically.

Thereafter, if necessary, a neutralization reaction of the catalyst is carried out to obtain an aqueous reaction mixture solution. Use amount of an acidic substance for neutralization is preferably 0.1 to 2 equivalents relative to the alkaline substance used as the catalyst. Any acidic substance may be used as far as the substance shows an acidic property in water.

Then, it is preferable to remove byproducts such as an alcohol produced by the hydrolysis condensation reaction from the reaction mixture under reduced pressure or the like. Temperature to heat the reaction mixture in this operation is preferably 0 to 100° C., more preferably 10 to 90° C., or still more preferably 15 to 80° C., though it depends on kinds of the added organic solvent and the alcohol produced by the reaction. Degree of the reduced pressure in this operation is preferably an atmospheric pressure or lower, more preferably 80 kPa or lower in the absolute pressure, or still more preferably 50 kPa or lower in the absolute pressure, though it depends on kinds of the organic solvent and the alcohol to be removed, an exhausting equipment, a condensation equipment, and heating temperature. Although it is difficult to know exactly an amount of the alcohol removed, it is preferable that about 80% or more by mass of a produced alcohol be removed.

In order to remove the alkaline catalyst used in the hydrolysis-condensation, the silicon-containing compound is extracted with an organic solvent. The organic solvent used at this time is preferably a substance which is capable of dissolving a silicon-containing compound and is mixed in water to separate two layers. Further, a mixture of a water-soluble organic solvent and a poorly water-soluble organic solvent can be used.

Specific examples of the organic solvent used to remove an alkaline catalyst include those exemplified as the organic solvent and the mixture of a water-soluble organic solvent and a poorly water-soluble organic solvent, described above.

Meanwhile, mixing ratio of the water-soluble organic solvent to the poorly water-soluble organic solvent is appropriately selected; but the amount of the water-soluble organic solvent is 0.1 to 1,000 parts by mass, preferably 1 to 500 parts by mass, or more preferably 2 to 100 parts by mass, relative to 100 parts by mass of the poorly water-soluble organic solvent.

Then, washing is done by neutral water. So-called de-ionized water or ultrapure water may be used. Amount of this water is 0.01 to 100 L, preferably 0.05 to 50 L, or more preferably 0.1 to 5 L, relative to 1 L of the silicon-containing compound solution. This washing operation may be done in such a way that the both solutions are mixed in a vessel by agitation, and then settled to separate a water layer. Number of washing is 1 or more, or preferably about 1 to about 5, because washing of 10 times or more is not worth to have full effects.

To the silicon-containing compound solution after washing is added a final solvent, and then solvents therein are exchanged under reduced pressure to obtain an intended solution containing the silicon-containing compound. Temperature at the time of the solvent exchange is preferably 0 to 100° C., more preferably 10 to 90° C., or still more preferably 15 to 80° C., though it depends on the extraction solvent to be removed. Degree of the reduced pressure in this operation is preferably an atmospheric pressure or lower, more preferably 80 kPa or lower in the absolute pressure, or still more preferably 50 kPa or lower in the absolute pressure, though it depends on kinds of the extraction solvent to be removed, an exhausting equipment, a condensation equipment, and heating temperature.

A preferable solvent finally added to the silicon-containing compound solution is an alcohol solvent; and especially preferable solvents thereof are a monoalkyl ether of ethylene glycol, diethylene glycol, triethylene glycol, and so on; and a monoalkyl ether of propylene glycol, dipropylene glycol, and so on. Specific example of the preferable solvent includes propylene glycol monomethyl ether, ethylene glycol monomethyl ether, propylene glycol monoethyl ether, ethylene glycol monoethyl ether, propylene glycol monopropyl ether, and ethylene glycol monopropyl ether.

In an alternative operational procedure using an alkaline catalyst, the hydrolysis reaction is started by adding water or a water-containing organic solvent into the raw material that contains the hydrolysable silicon compound or into an organic solution of this. In this operation, the catalyst may be added into the raw material that contains the hydrolysable silicon compound or into the organic solution of this, or into water or the water-containing organic solvent. The reaction temperature is 0 to 100° C., or preferably 10 to 80° C. A method, wherein the temperature thereof is kept at 10 to 50° C. during the time of gradual addition of water, and then, aging is done at 20 to 80° C., is preferable.

The organic solvent which can be used in the organic solution of the raw material that contains the hydrolysable silicon compound or in the water-containing organic solvent is preferably water-soluble; and illustrative example thereof includes methanol, ethanol, 1-propanol, 2-propanol, 1-butanol, 2-butanol, 2-methyl-1-propanol, acetone, tetrahydrofuran, and acetonitrile; a polyol condensation derivative such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether acetate; and a mixture of these solvents.

Molecular weight of the silicon-containing compound obtained by the Synthesis Methods 1 or 2 mentioned above can be controlled not only by selection of the hydrolysable silicon compound but also by control of reaction conditions during the time of polymerization, wherein the molecular weight thereof is preferably 100,000 or less, more preferably 200 to 50,000, or still more preferably 300 to 30,000, because foreign matters or coating smears may be formed as the case may be. Meanwhile, the data of the weight-average molecular weight are of the polystyrene-equivalent molecular weight based on the standard polystyrene, wherein the data are obtained by a gel permeation chromatography (GPC) using RI as a detector and tetrahydrofuran as an eluting solvent.

A polysiloxane contained in a silicon-containing film composition produced by the silicon-containing compound used in the present invention can be produced from the raw material containing a hydrolyzable silicon compound under the acidic or alkaline catalyst.

Further, a mixture of the raw material containing a hydrolyzable silicon compound and a hydrolyzable metal compound represented by the following formula (2) and a polysiloxane derivative produced under the acidic or alkaline catalyst can be used as a component of the silicon-containing film composition used in the present invention,

$$U(OR^7)_{m7}(OR^8)_{m8} \quad (2)$$

wherein $R^7$ and $R^8$ represent an organic group having 1 to 30 carbon atoms; m7+m8 is a number which is equal to a valency that is determined by U; m7 and m8 represent an integer of 0 or more; and U represents elements belonging to the groups III, IV, or V in the periodic table except for carbon and silicon elements.

Illustrative example of the hydrolysable metal compound (2) used therein includes the following compounds. In the case that U is boron, illustrative example of the compound shown by the general formula (2) includes, as the monomer, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

In the case that U is aluminum, illustrative example of the compound shown by the general formula (2) includes, as the monomer, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, and aluminum 2,2,6,6-tetramethyl-3,5-heptanedionate.

In the case that U is gallium, illustrative example of the compound shown by the general formula (2) includes, as the monomer, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, and gallium 2,2,6,6-tetramethyl-3,5-heptanedionate.

In the case that U is yttrium, illustrative example of the compound shown by the general formula (2) includes, as the monomer, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, and yttrium 2,2,6,6-tetramethyl-3,5-heptanedionate.

In the case that U is germanium, illustrative example of the compound shown by the general formula (2) includes, as the monomer, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

In the case that U is titanium, illustrative example of the compound shown by the general formula (2) includes, as the monomer, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, and titanium dibutoxy bis-2,4-pentanedionate.

In the case that U is hafnium, illustrative example of the compound shown by the general formula (2) includes, as the monomer, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis-2,4-pentanedionate, and hafnium dibutoxy bis-2,4-pentanedionate.

In the case that U is tin, illustrative example of the compound shown by the general formula (2) includes, as the monomer, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

In the case that U is arsenic, illustrative example of the compound shown by the general formula (2) includes, as the monomer, methoxy arsenic, ethoxy arsenic, propoxy arsenic, butoxy arsenic, and phenoxy arsenic.

In the case that U is antimony, illustrative example of the compound shown by the general formula (2) includes, as the monomer, methoxy antimony, ethoxy antimony, propoxy antimony, butoxy antimony, phenoxy antimony, antimony acetate, and antimony propionate.

In the case that U is niobium, illustrative example of the compound shown by the general formula (2) includes, as the monomer, methoxy niobium, ethoxy niobium, propoxy niobium, butoxy niobium, and phenoxy niobium.

In the case that U is tantalum, illustrative example of the compound shown by the general formula (2) includes, as the monomer, methoxy tantalum, ethoxy tantalum, propoxy tantalum, butoxy tantalum, and phenoxy tantalum.

In the case that U is bismuth, illustrative example of the compound shown by the general formula (2) includes, as the monomer, methoxy bismuth, ethoxy bismuth, propoxy bismuth, butoxy bismuth, and phenoxy bismuth.

In the case that U is phosphorous, illustrative example of the compound shown by the general formula (2) includes, as the monomer, trimethyl phosphate, triethyl phosphate, tripropyl phosphate, trimethyl phosphite, triethyl phosphite, tripropyl phosphite, and diphosphorous pentaoxide.

In the case that U is vanadium, illustrative example of the compound shown by the general formula (2) includes, as the monomer, vanadium oxide bis(2,4-pentanedionate), vanadium 2,4-pentanedionate, vanadium tributoxide oxide, and vanadium tripropoxide oxide.

In the case that U is zirconium, illustrative example of the compound shown by the general formula (2) includes, as the monomer, methoxy zirconium, ethoxy zirconium, propoxy zirconium, butoxy zirconium, phenoxy zirconium, zirconium dibutoxide bis(2,4-pentanedionate), and zirconium dipropoxide bis(2,2,6,6-tetramethyl-3,5-heptanedionate).

Further, a silicon-containing compound represented by the general formula (D) containing repeating units represented by the following general formula (D-1) and (D-2) as substructures may be also used.

(D)

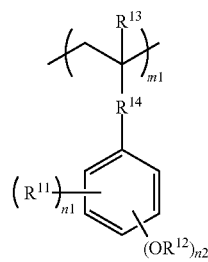

(D-1)

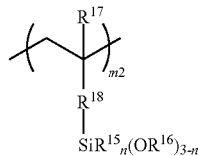

(D-2)

wherein, $R^{11}$ represents an organic group having 1 to 20 carbon atoms; $R^{12}$ represents an acid labile group; $0 \leq n1 \leq 3$, $1 \leq n2 \leq 3$, $1 \leq n1+n2 \leq 5$; $R^{13}$ represents a hydrogen atom or a methyl group; $R^{14}$ represents a single bond or a divalent organic group having 1 to 20 carbon atoms; $R^{15}$ represents a hydrogen atom or an organic group having 1 to 30 carbon atoms; $R^{16}$ represents an alkyl group having 1 to 6 carbon atoms; $R^{17}$ represents a hydrogen atom or a methyl group; $R^{18}$ represents a single bond or a divalent organic group having 1 to 20 carbon atoms; $0 \leq n \leq 2$; m1 and m2 represent a molar ratio in the polymer containing the above-described substructures, 0<m1<1, 0<m2<1, and 0<m1+m2≤1.
Illustrative example of the silicon-containing compounds (D-1) and (D-2) which can be used in the patterning process of the present invention may includes structures represented by the following general formulae.
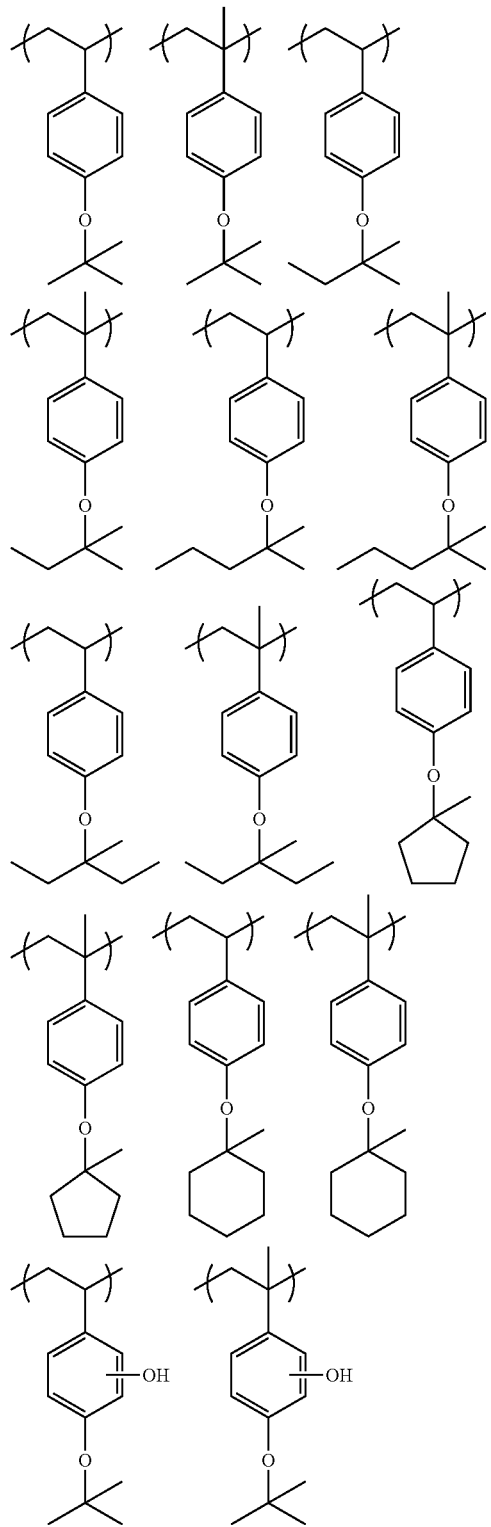
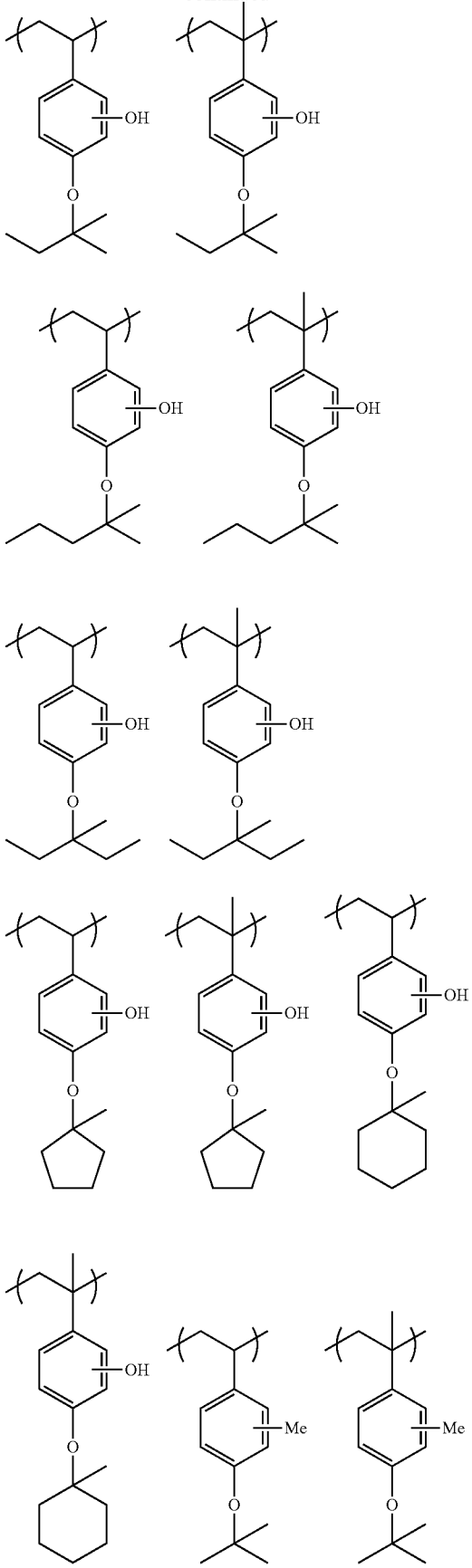

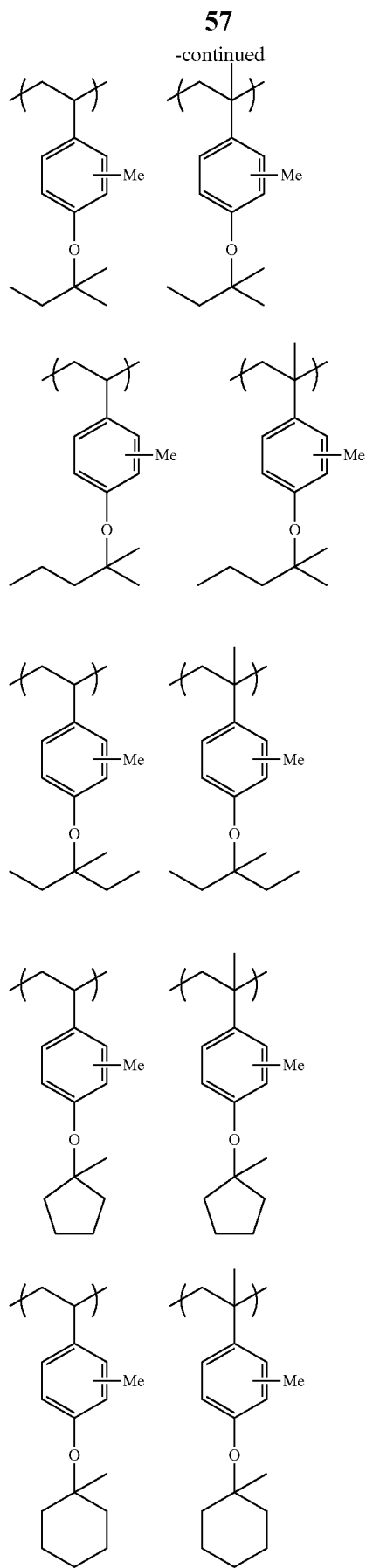
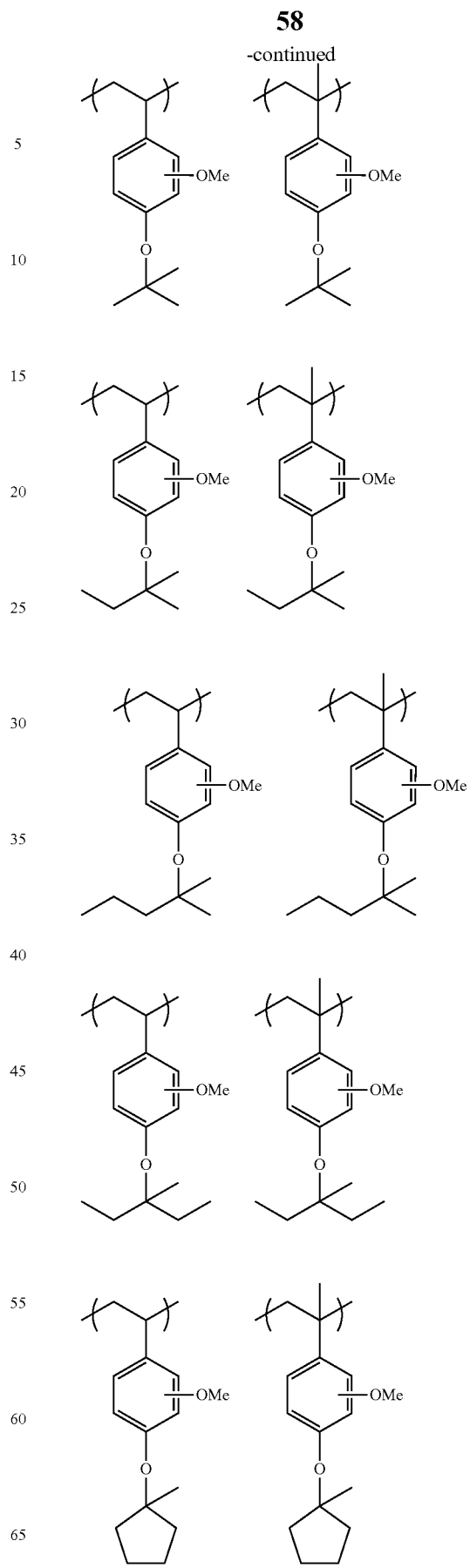

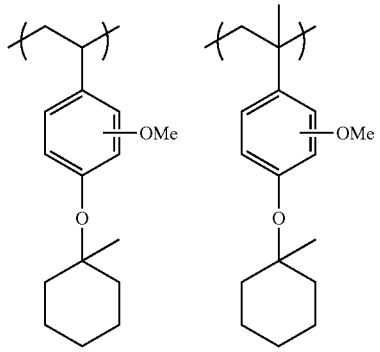
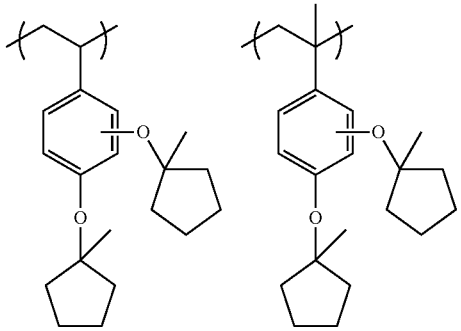
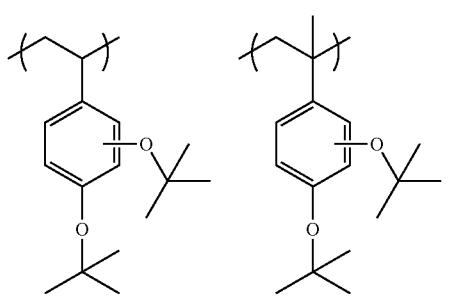
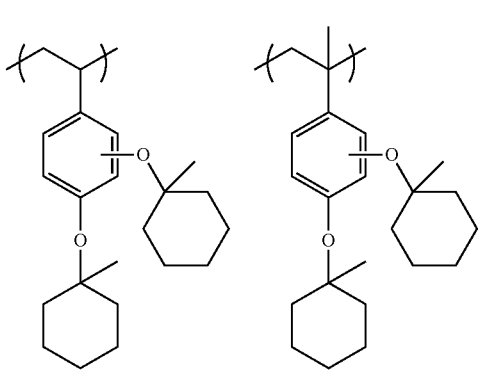
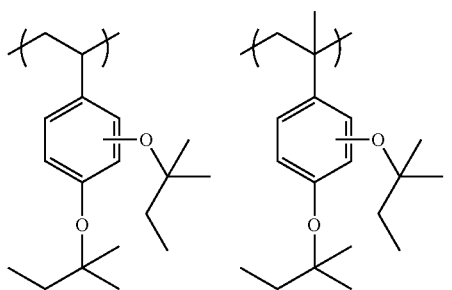
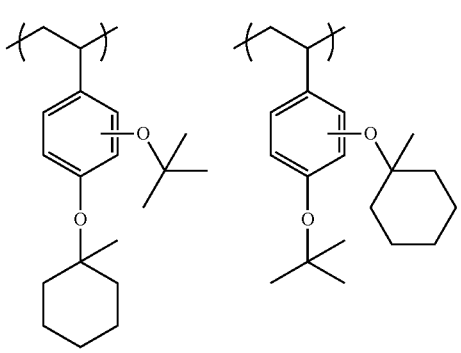
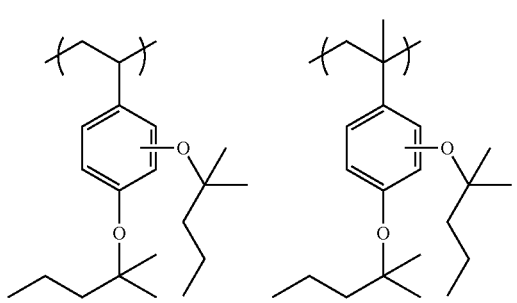
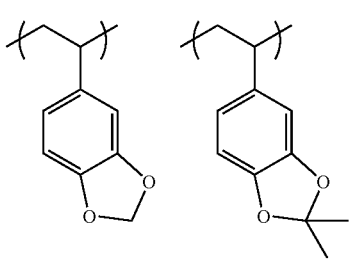
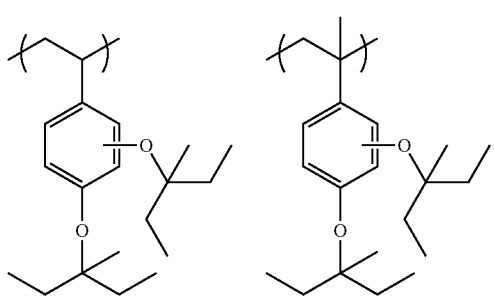
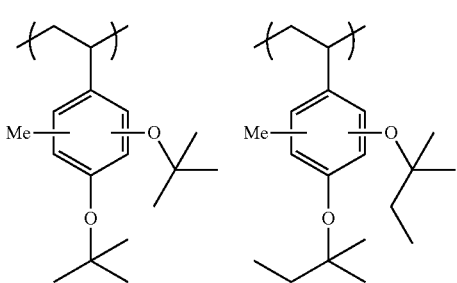

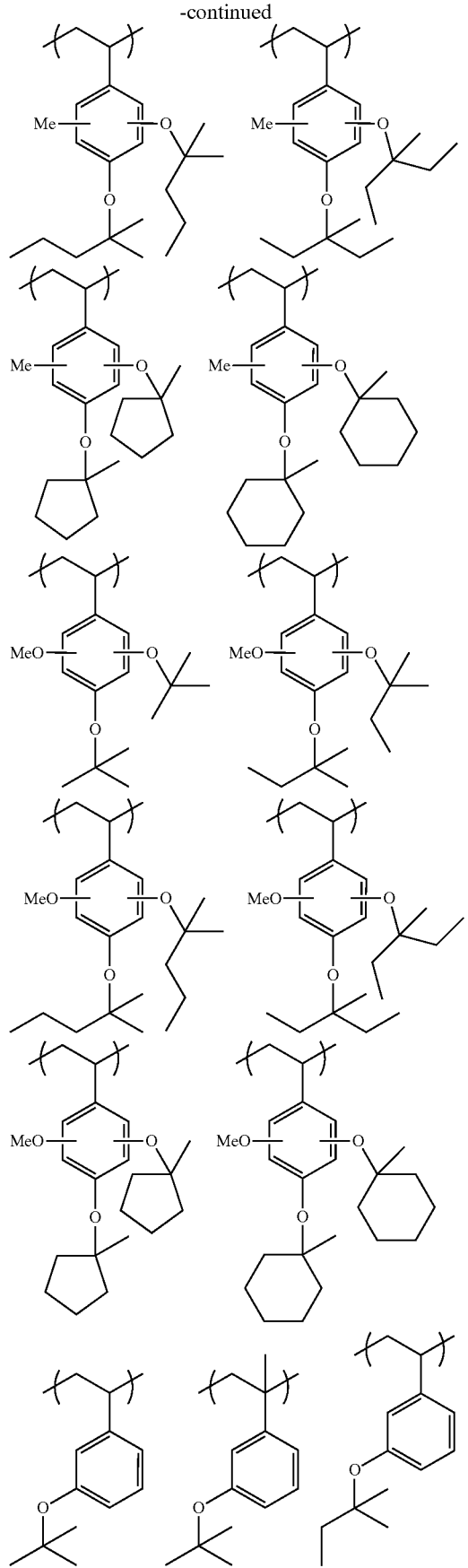
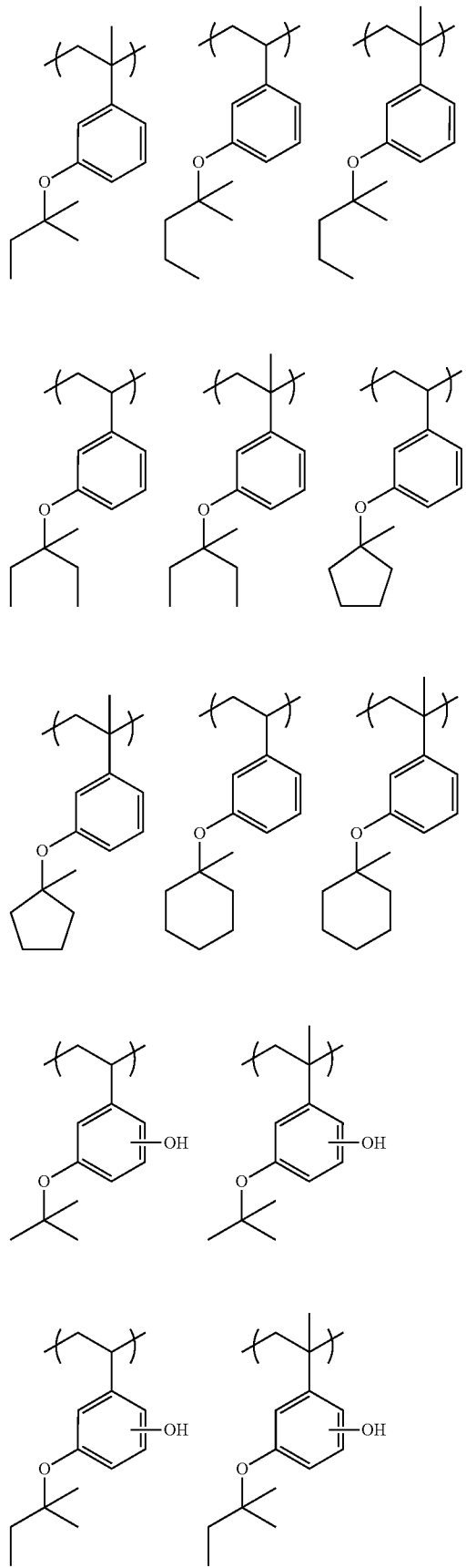

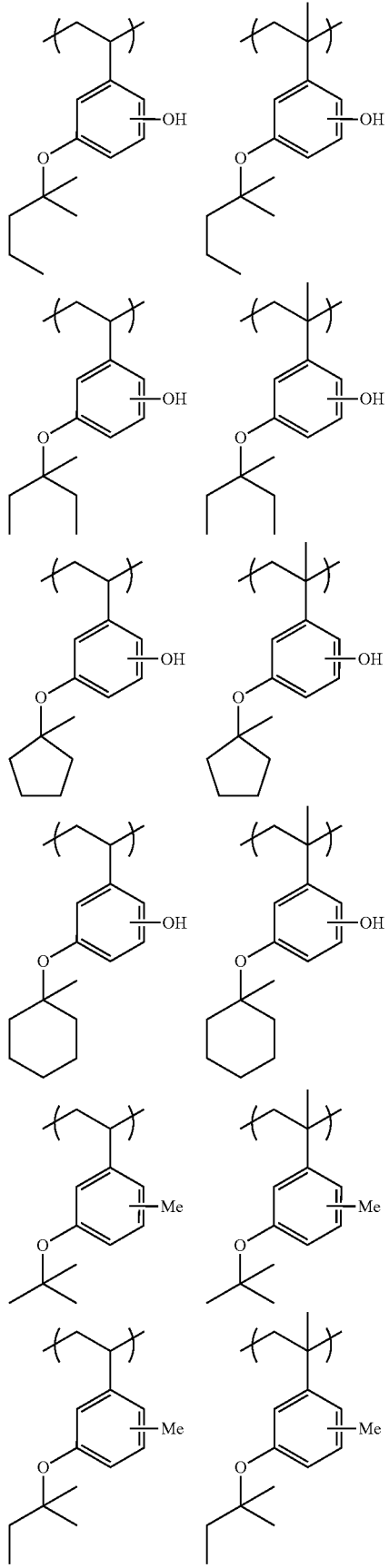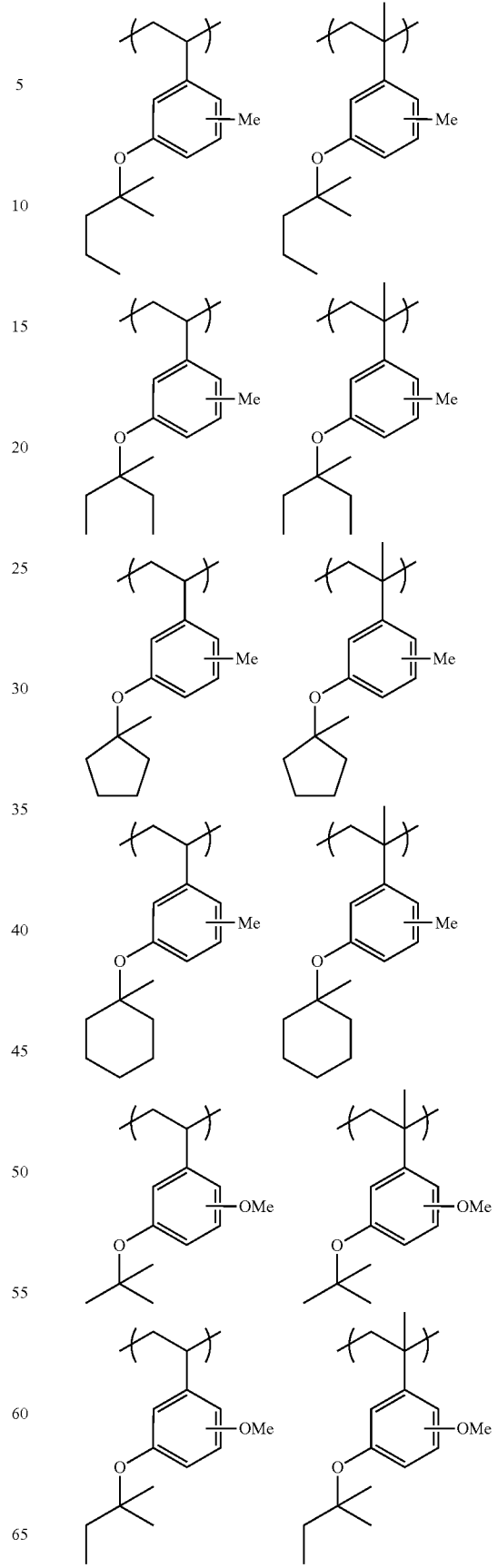

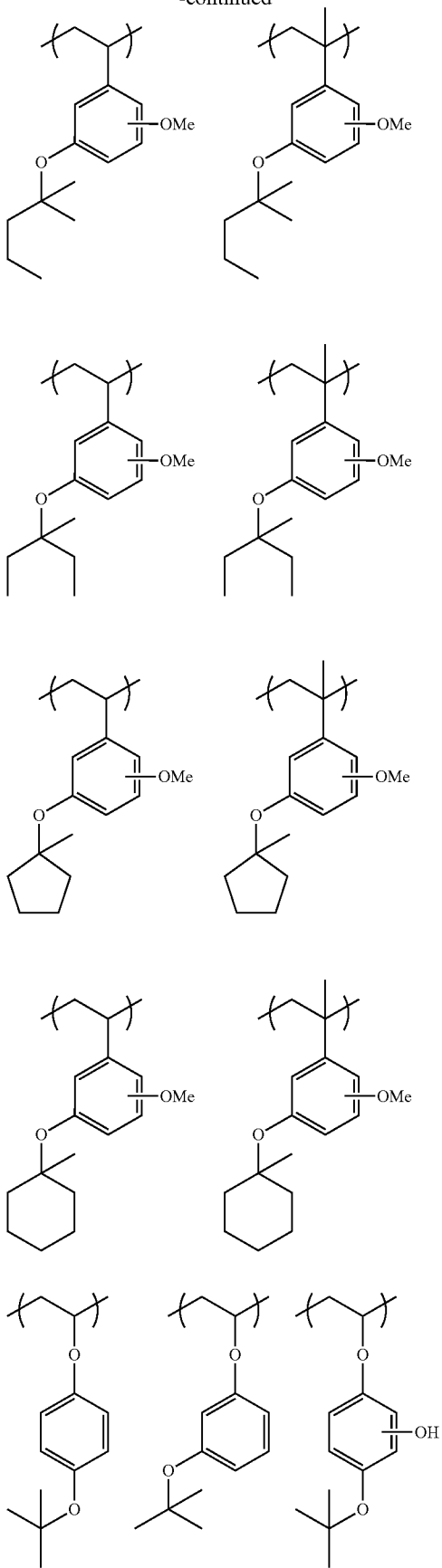
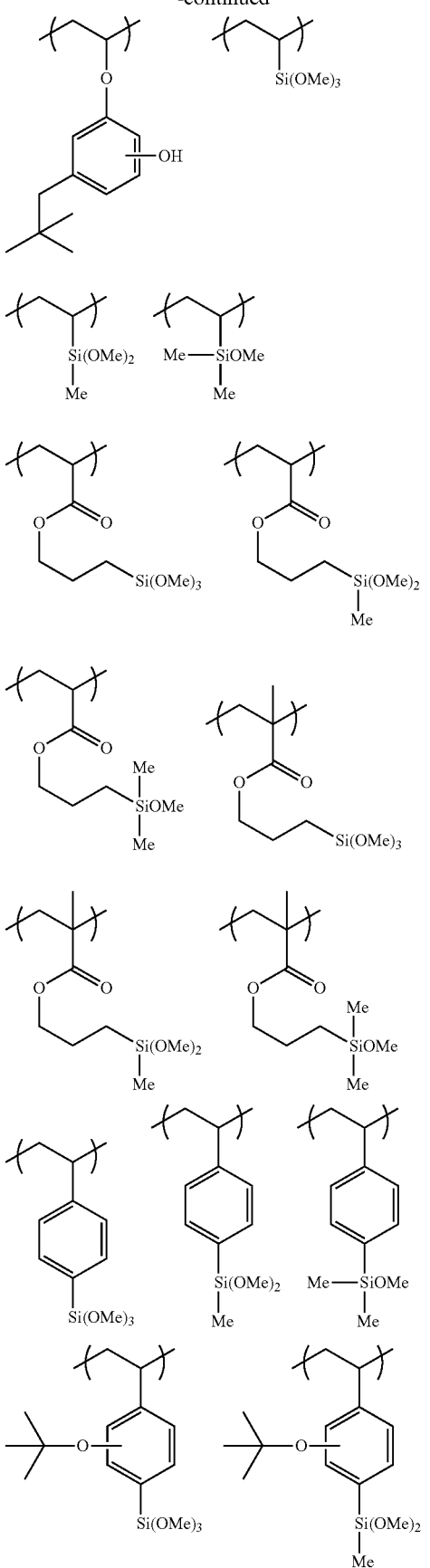

-continued

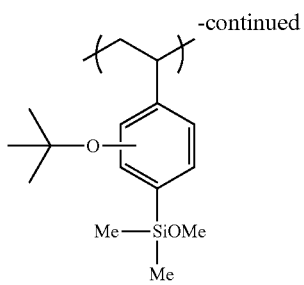

[Other Components]
(Thermal Crosslinking Accelerator)

In the present invention, a thermal crosslinking accelerator may be blended to the silicon-containing film composition to be used in the present invention. Examples of the thermal crosslinking accelerator which can be blended therein are compounds shown by the following general formula (3) or (4). Specific examples that can be added therein are those described in the Japanese Patent No. 4716037, $$L_a H_b X \tag{3}$$

wherein L represents lithium, sodium, potassium, rubidium, or cesium; X represents a hydroxyl group, or an organic acid group having 1 to 30 carbon atoms with the valency thereof being one, or two or higher; reference character "a" represents an integer of one or more, reference character "b" represents 0 or an integer of one or more, and a+b is a valency of the hydroxyl group or the organic acid group, $$MY \tag{4}$$

wherein M represents sulfonium, iodonium, or ammonium; and Y represents a non-nucleophilic counter ion.

Meanwhile, the foregoing thermal crosslinking accelerators may be used solely or in a combination of two or more of them. Adding amount of the thermal crosslinking accelerator is preferably 0.01 to 50 parts by mass, or more preferably 0.1 to 40 parts by mass, relative to 100 parts by mass of the silicon-containing compound contained in the silicon-containing film composition.

(Organic Acid)

In order to improve the stability of the silicon-containing film composition which can be used in the present invention, a monovalent or polyvalent organic acid having 1 to 30 carbon atoms is preferably added. Illustrative example of the acid to be added herein includes formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Especially, oxalic acid, maleic acid, formic acid, acetic acid, propionic acid, citric acid, and the like are preferable. To keep storage stability, two or more kinds of these acids may be used as a mixture. Adding amount thereof is 0.001 to 25 parts by mass, preferably 0.01 to 15 parts by mass, or more preferably 0.1 to 5 parts by mass, relative to 100 parts by mass of the silicon-containing compound contained in the silicon-containing film composition.

Alternatively, the above-mentioned organic acid may be added such that pH of the composition may become preferably 0≤pH≤7, more preferably 0.3≤pH≤6.5, or still more preferably 0.5≤pH≤6.

(Water)

In the present invention, water may be added to the silicon-containing film composition. A polysiloxane compound in the silicon-containing film composition is hydrated by the added water, and a lithography performance is improved. The content of water in a solvent component of silicon-containing film composition is more than 0% by mass and less than 50% by mass, particularly preferably 0.3 to 30% by mass, further preferably 0.5 to 20% by mass.

The amount of all the solvents containing water to be used is 100 to 100,000 parts by mass, particularly suitably 200 to 50,000 parts by mass, relative to 100 parts by mass of silicon-containing compound contained in the silicon-containing film composition.

(Photoacid Generator)

In the present invention, a photoacid generator may be added to the silicon-containing film composition. Specifically, a material described in Japanese Patent Laid-Open Publication No. 2009-126940, paragraphs [0160] to [0179] can be added as a photoacid generator used in the present invention.

(Stabilizer)

Further, a monohydric or polyhydric alcohol having a cyclic ether as a substituent can be added as a stabilizer to the silicon-containing film composition which can be used in the present invention. Specifically, a stabilizer described in Japanese Patent Laid-Open Publication No. 2009-126940, paragraphs [0181] to [0182] can be added to improve the stability of the silicon-containing film composition which can be used in the present invention.

(Surfactant)

Further, a surfactant can be mixed in the silicon-containing film composition which can be used in the present invention, if necessary. Specifically, a material described in Japanese Patent Laid-Open Publication No. 2009-126940, paragraph [0185], can be added as a such a substance.

Moreover, a solvent having a high boiling point of 180° C. or higher may be added to the silicon-containing film composition which can be used in the present invention, if necessary. Illustrative example of this high boiling point solvent includes 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropyelene glycol, glycerin, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, and dipropylene glycol monoethyl ether acetate.

The present invention includes a step of applying a self-assembling polymer onto a silicon-containing film to form a polymer film and a step of self-assembling this polymer film by heat treatment to form a microdomain structure.

As to the self-assembling polymer to form the polymer film on the silicon-containing film of the present invention, any self-assembling polymer including a heretofore known polystyrene-poly(meth)acrylate ester block copolymer may be used; and specific example thereof includes polybutadienepolydimethyl siloxane, polybutadiene-4-vinylpyridine, polybutadiene-methyl methacrylate, polybutadiene-poly-t-butyl methacrylate, polybutadiene-t-butyl acrylate, poly-t-butyl methacylate-poly-4-vinylpyridine, polyethylene-poly-methyl methacrylate, poly-t-butyl methacrylate-poly-2-vinylpyridine, polyethylene-poly-2-vinylpyridine, polyethylene-poly-4-vinylpyridine, polyisoprene-poly-2-vinylpyridine, polymethyl methacrylate-polystyrene, poly-t-butyl methacrylate-polystyrene, polymethyl acrylate-polystyrene, polybutadiene-polystyrene, polyisoprene-polystyrene, polystyrene-poly-2-vinylpyridine, polystyrene-poly-4-vinylpyridine, polystyrene-polydimethyl siloxane, polystyrene-poly-N,N-dimethylacrylamide, sodium polybutadiene-polyacrylate, polybutadiene-polyethyleneoxide, poly-t-butyl methacrylate-polyethyleneoxide, polystyrene-polyacrylic acid, and polystyrene-polymethacrylic acid.

Illustrative example of the self-assembling polymers used in the present invention includes an AB type diblock copolymer having a structure in which two kinds of polymer chains, A-polymer chain and B-polymer chain, are bonded, an ABA type triblock copolymer, an ABC type block copolymer comprising three or more kinds of polymers, and a star block copolymer in which each block is bonded at one point and an optimum polymer may be selected in accordance with the form of the intended microdomain structure.

Polystyrene-equivalent mass-average molecular weight of the self-assembling polymer used in the present invention is preferably in the range of 1,000 to 20,000, more preferably 3,000 to 15,000, or still more preferably 5,000 to 12,000 by gel permeation chromatography (GPC). If the mass-average molecular weight is in the above-mentioned ranges, the self-assembly phenomenon takes place with sure so that a fine pattern can be obtained.

In addition, if the molecular weight distribution (Mw/Mn) of the self-assembling polymer used in the present invention is of narrow dispersity such as in the range of 1.0 to 1.3, especially in the range of 1.0 to 1.2, variability of the polymer's molecular weight is so small that deterioration in characteristics such as uniformity and regularity of the pattern having the microdomain structure formed by self-assembly thereof can be prevented.

Illustrative example of an organic solvent capable of dissolving the polymer capable of self-assembly used in the present invention includes s butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methyl pyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone; though not limited to them. Especially preferable organic solvents thereamong are a propylene glycol alkyl ether acetate and an alkyl lactate ester. These solvents may be used singly or as a mixture of two or more of them. Meanwhile, illustrative example of the alkyl group of the propylene glycol alkyl ether acetate in the present invention includes those having 1 to 4 carbon atoms, such as a methyl group, an ethyl group, and a propyl group; though a methyl group and an ethyl group are especially preferable. Because this propylene glycol alkyl ether acetate has a 1,2-substitution and 1,3-substitution, there are three isomers according to a combination of the substitution sites; but it may be any of a single body and a mixture thereof.

Illustrative example of the alkyl group of the alkyl lactate ester includes those having 1 to 4 carbon atoms, such as a methyl group, an ethyl group, and a propyl group; though a methyl group and an ethyl group are preferable.

If the propylene glycol alkyl ether acetate is added as the solvent, adding amount thereof is preferably 50% or more by mass relative to totality of the solvent; and if the alkyl lactate ester is added, adding amount thereof is preferably 50% or more by mass relative to totality of the solvent. If a mixed solvent of the propylene glycol alkyl ether acetate and the alkyl lactate ester is used as the solvent, sum of them is preferably 50% or more by mass relative to totality of the solvent. In this case, more preferably the rate of the propylene glycol alkyl ether acetate is 60 to 95% by mass and the rate of the alkyl lactate ester is 5 to 40% by mass. If the propylene glycol alkyl ether acetate is added with the rate as mentioned above, problems such as deterioration of coating properties and insufficient solubility may be avoided.

Adding amount of the foregoing solvents is usually in the range of 300 to 8,000 parts by mass, or preferably 400 to 3,000 parts by mass, relative to 100 parts by mass of the solid portion of the self-assembling polymer; but the amount is not limited to this if the concentration thereof is applicable to a conventional coating method.

Into the self-assembling polymer used in the present invention may be added a surfactant to improve coating properties thereof.

The surfactant is not particularly restricted, while illustrative example thereof includes a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane aliphatic acid ester such as sorbitane monolaurate, sorbitane monopalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyoxyethylene sorbitane trioleate, and polyoxyethylene sorbitane tristearate; a fluoro surfactant such as F-Top EF301, EF303, and EF352 (manufactured by Tochem Products Co., Ltd.), Megafac F171, F172, and F173 (manufactured by Dainippon Ink & Chemicals, Inc.), Florade FC430 and FC431 (manufactured by Sumitomo 3M Ltd.), Asahi Guard AG710, Surflon S-381, S-382, SC101, SC102, SC103, SC104, SC105, SC106, Surfinol E1004, KH-10, KH-20, KH-30, and KH-40 (manufactured by Asahi Glass Co., Ltd.); an organosiloxane polymer KP-341, X-70-092, and X-70-093 (manufactured by Shin-Etsu Chemical Co., Ltd.); and an acrylate or a methacrylate polymer such as Polyflow No. 75 and No. 95 (manufactured by Kyoeisha Yushikagaku Kogyo K. K.). Among them, FC430, Surflon S-381, Surfinol E1004, KH-20, and KH-30 are preferable. These may be used singly or as a combination of two or more of them.

Adding amount of the surfactant in the self-assembling polymer used in the present invention is 2 or less parts by mass, or preferably 1 or less parts by mass, relative to 100 parts by mass of the solid portion of the polymer. Meanwhile, the lower limit thereof is not particularly stipulated, but preferably 0.1 or more parts by mass.

Any photoresist composition for a typical ArF excimer laser light can be applied to the photoresist film of the upper layer in the present invention. As the photoresist composition of an ArF excimer laser light, many candidates are in the public domain. In a positive photoresist composition, a resin in which an acid labile group is desorbed by the action of acid to become soluble in an aqueous alkaline solution, and a basic substance of controlling the diffusion of a photoacid generator and an acid are main components. In a negative photoresist composition, a resin which is allowed to react with a cross-linker by the action of acid to become insoluble in an aqueous alkaline solution, and a basic substance of controlling the diffusion of a photoacid generator, a cross-linker, and an acid are main components. The characteristic properties depends on a resin to be used. Already heretofore known resins are divided into a poly(meth)acrylic resin, a cycloolefin maleic anhydride (COMA)-based resin, a COMA-(meth)acryl hybrid-based resin, a ring opening metathesis polymerization (ROMP)-based resin, and polynorbornene resin. Among them, a photoresist composition using a poly(meth)acrylic resin has an excellent resolution performance as compared with the other resins since the etching resistance is secured by introducing an alicyclic skeleton into the side chain.

As the photoresist composition for an ArF excimer laser using a poly(meth)acrylic resin, many photoresist compositions are in the public domain. In a positive photoresist composition, a polymer includes a combination of a unit of securing the etching resistance, a unit of changing alkaline solubility by desorption due to the action of acid, a unit of securing the adhesion, and the like, as main functions, or a combination in which one unit contains two or more units as the functions. As the unit of changing alkaline solubility by acid among them, a (meth)acrylate ester having an acid labile group with an adamantane skeleton (Japanese Patent Laid-Open Publication No. 9-73173) or a (meth)acrylate ester having an acid labile group with norbornane and tetracyclododecane skeletons (Japanese Patent Laid-Open Publication No. 2003-84438) is particularly preferably used since it imparts high resolution and etching resistance. As the unit of securing the adhesion, a (meth)acrylate ester having a norbornane side chain with a lactone ring (International publication WO00/01684), a (meth)acrylate ester having an oxanorbornane side chain (Japanese Patent Laid-Open Publication No. 2000-159758), or a (meth)acrylate ester having a hydroxyadamantyl side chain (Japanese Patent Laid-Open Publication No. 8-12626) is preferably used.

After a silicon-containing film is formed from the silicon-containing film composition used in the present invention, a photoresist film is formed on the film using a photoresist composition solution. Here, the spin-coating method is preferably used in the same manner as in the formation of a silicon-containing film. A photoresist composition is spin-coated, and prebaked. At this time, a condition is preferably 80 to 180° C. and 10 to 300 seconds. After then, the film is exposed, post-exposure baked (PEB), and developed to obtain a resist pattern.

The photoresist of upper layer used in the present invention is not limited as long as it is a chemically amplified photoresist which can be patterned by high-energy beam not only for ArF, but also for KrF, EUV, and EB, which are generally known.

The patterning process of the present invention is as follows (refer to FIGS. 1 and 2).

In the process of FIG. 1, at first, a silicon-containing film composition is applied onto a substrate to be processed 1, and heated to form a silicon-containing film 2 (A and B). A photoresist composition is then applied onto the silicon-containing film 2 and heated to form a photoresist film 3 (C). The photoresist film 3 is exposed to generate an acid in the film. As a result, a part of the silicon-containing film 2 is changed into a silicon-containing film 2' having a changed contact angle to obtain a pattern (D). The photoresist film 3 is removed (E). After removing the photoresist film 3, a self-assembling polymer is applied onto the silicon-containing films 2 and 2' to form a self-assembling polymer film 4 (F). The self-assembling polymer film 4 is subjected to self-assembly by a difference of contact angle between the silicon-containing films 2 and 2' and heating (G). Then, the self-assembling polymer film 4 and silicon-containing films 2 and 2' are etched to transfer the pattern to the substrate to be processed 1 (H).

Figure 2:
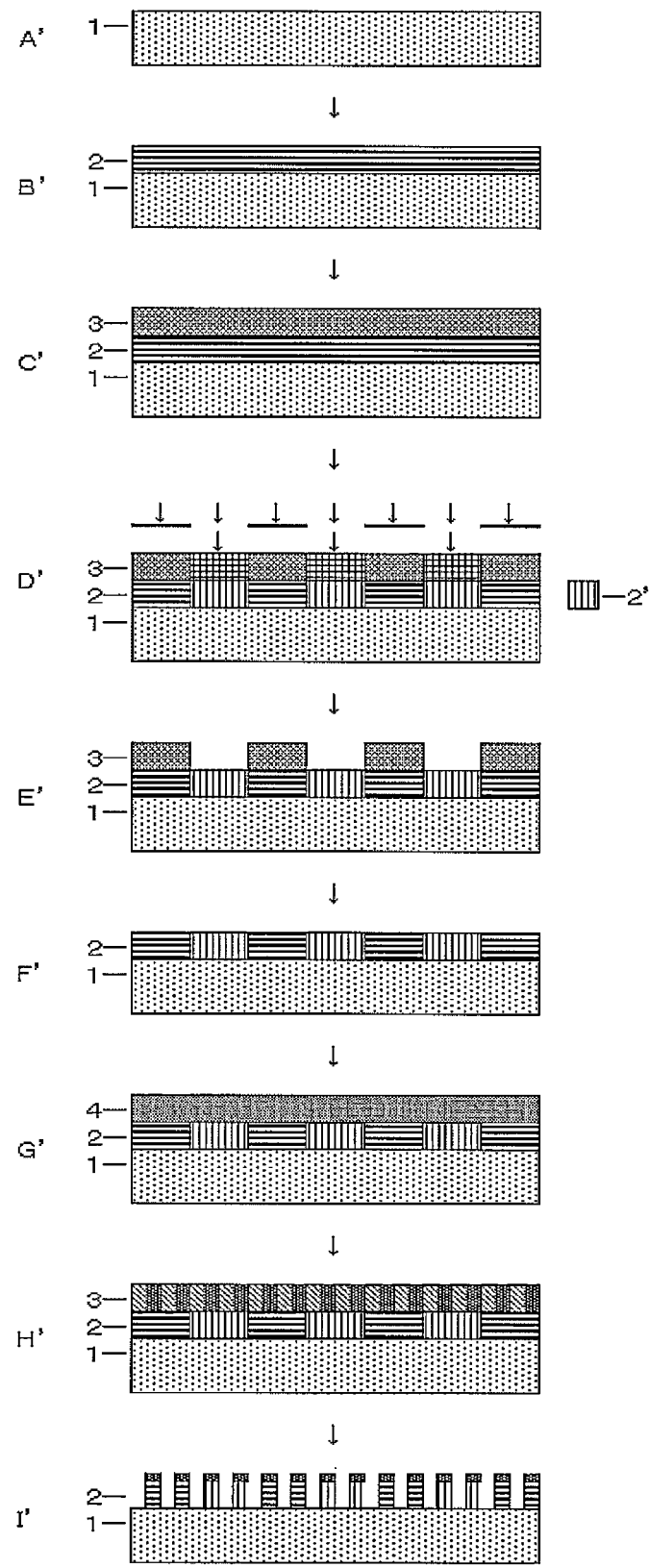
FIG. 2 is a flow chart showing the another aspect of the patterning process of the present invention.

In the process of FIG. 2, at first, a silicon-containing film composition is applied onto a substrate to be processed 1, and heated to form a silicon-containing film 2 (A' and B'). A photoresist composition is then applied onto the silicon-containing film 2 and heated to form a photoresist film 3 (C'). The photoresist film 3 is exposed to generate an acid in the film. As a result, a part of the silicon-containing film 2 is changed into a silicon-containing film 2' having a changed contact angle (D'). The photoresist film 3 is developed to obtain a pattern (E'). The photoresist film 3 is removed (F'). After removing of the photoresist film 3, a self-assembling polymer is applied onto the silicon-containing films 2 and 2' to form a self-assembling polymer film 4 (G'). The self-assembling film 4 is subjected to self-assembly by a difference of contact angle between the silicon-containing films 2 and 2' and heating (H'). Then, the self-assembling polymer film 4 and silicon-containing films 2 and 2' are etched to transfer the pattern to the substrate to be processed 1 (I').

The polymer which can be self-assembled and is used in the present invention is applied onto the silicon-containing film having been pattern-exposed, with the thickness of the polymer film being preferably in the range of 0.005 to 0.05 $\mu m$, especially 0.01 to 0.03 $\mu m$, and then it is subjected to concurrent baking and annealing processes in the temperature range of 100 to 300° C., especially 100 to 150° C., and for the time of 5 to 600 minutes, especially 5 to 100 minutes, thereby forming by self-assembly a pattern having a microdomain structure with the size of 20 nm or less, especially 10 nm or less.

The present invention includes a step of forming a pattern by dry-etching of the polymer film having the microdomain structure formed.

In the present invention, difference in etching rate relative to the self-reactive ion etching (RIE) or to other etching methods can be utilized in the patterning process of the polymer film. For example, in the case that a self-assembling polymer comprised of polystyrene and polybutadiene is used, development treatment to leave only a pattern comprised of the polystyrene block may be possible by using an oxidative gas. In the self-organized pattern comprised of polystyrene and polymethyl methacrylate, polystyrene is more resistant to RIE that uses an oxygen gas and a fluorocarbon gas than polymethyl methacrylate. By utilizing this property, a pattern may be formed by selectively removing a partial structure by RIE from the polymer film having the formed microdomain structure comprised of polymethyl methacrylate.

The present invention includes a step of transferring the pattern to the silicon-containing film by dry-etching by using the polymer film's pattern as a mask and a step of transferring the pattern to the substrate to be processed by dry-etching by using the pattern that is transferred to the silicon-containing film as a mask.

Unlikely the self-assembling organic polymer, the silicon-containing film has an etching selectivity because of the silicon-containing compound contained therein, thereby functioning as an etching hard mask; and thus, the pattern formed by self-assembly can be transferred to the substrate to be processed in a further lower layer.

A self-assembly pattern is formed by difference of contact angle on the silicon-containing film used in the present invention. A combination of the self-assembly pattern with a CVD film or an organic underlayer film is optimized to transfer the self-assembly pattern to an inorganic film or a semiconductor device substrate which is located below the film without a difference in size conversion.

EXAMPLES

Hereinafter, the present invention will be specifically described with reference to Synthesis Examples, Examples, and Comparative Examples, but is not limited to the following description. Meanwhile, "%" shown in the following examples means "% by mass", and molecular weight measurement was done with GPC.

Synthesis of Silicon-Containing Compound

Synthesis Example 1-1

Into a mixture of 220 g of methanol, 0.2 g of methanesulfonic acid, and 80 g of deionized water was added a mixture of 25.9 g of Monomer 101, 41.9 g of Monomer 102, and 9.5 g of Monomer 120; and then, they were kept at 40° C. for 12 hours to carry out the hydrolysis condensation reaction. After the reaction, 200 g of propylene glycol ethyl ether (PGEE) was added thereinto; and then, the by-produced alcohol was distilled out under reduced pressure. Then, 1000 mL of ethyl acetate and 300 g of PGEE were added thereinto to separate the water layer. To the remained organic layer was added 100 mL of ion-exchanged water; and then, the resulting mixture was stirred, settled, and separated into the layers. This operation was repeated for three times. The remained organic layer was concentrated under reduced pressure to obtain 330 g of PGEE solution containing the silicon-containing compound 1-1 (compound concentration of 10%). The polystyrene-equivalent molecular weight of this compound was measured to be Mw=2,200.

Synthesis Examples 1-2 to 1-16 and Synthesis Examples 1-20 to 1-24 were carried out by using the monomers shown in Table 1 under the conditions similar to those in Synthesis Example 1-1 to obtain each of the intended products.

Synthesis Example 1-17

Into a mixture of 400 g of ethanol, 5 g of 25% tetramethyl ammonium hydroxide, and 200 g of deionized water was added a mixture of 20.4 g of Monomer 101, 7.6 g of Monomer 102, and 95.5 g of Monomer 128; and then, they were kept at 40° C. for 4 hours to carry out the hydrolysis condensation reaction. After the reaction, 2 g of acetic acid was added thereinto for neutralization, and then, the by-produced alcohol was distilled out under reduced pressure. Then, 1200 mL of ethyl acetate and 400 g of PGEE were added thereinto to separate the water layer. To the remained organic layer was added 100 mL of ion-exchanged water; and then, the resulting mixture was stirred, settled, and separated into the layers. This operation was repeated for three times. The remained organic layer was concentrated under reduced pressure to obtain 410 g of PGEE solution containing the silicon-containing compound 1-17 (compound concentration of 20%). The polystyrene-equivalent molecular weight of this compound was measured to be Mw=2,300.

Synthesis Example 1-18 and Synthesis Example 1-19 were carried out by using the monomers shown in Table 1 under the conditions similar to those in Synthesis Example 1-17 to obtain each of the intended products.

Synthesis Example 1-25

Into a mixture of 120 g of methanol, 0.1 g of 70% nitric acid, and 60 g of deionized water was added a mixture of 5.0 g of Monomer 100, 3.4 g of Monomer 101, and 68.5 g of Monomer 102; and then, they were kept at 40° C. for 12 hours to carry out the hydrolysis condensation reaction. After the reaction, 300 g of PGEE was added thereinto; and then, the by-produced alcohol and excess water were distilled out under reduced pressure to obtain 310 g of PGEE solution containing the silicon-containing film composition 1-25 (polymer concentration of 10%). The polystyrene-equivalent molecular weight of this compound was measured to be Mw=2,200.

Synthesis Example 1-26 to Synthesis Example 1-30 were carried out by using the monomers shown in Table 1 under the conditions similar to those in Synthesis Example 1-25 to obtain each of the intended products.

TABLE 1

| Synthesis Example | Raw materials for reaction | Mw |
|---|---|---|
| 1-1 | [Monomer 101]: 25.9 g, [Monomer 102]: 41.9 g, [Monomer 120]: 9.5 g | 2,200 |
| 1-2 | [Monomer 101]: 25.9 g, [Monomer 102]: 41.9 g, [Monomer 121]: 10.5 g | 2,300 |
| 1-3 | [Monomer 101]: 25.9 g, [Monomer 102]: 41.9 g, [Monomer 122]: 11.4 g | 2,400 |
| 1-4 | [Monomer 101]: 25.9 g, [Monomer 102]: 41.9 g, [Monomer 123]: 12.0 g | 2,400 |
| 1-5 | [Monomer 101]: 25.9 g, [Monomer 102]: 41.9 g, [Monomer 124]: 9.7 g | 2,200 |
| 1-6 | [Monomer 101]: 25.9 g, [Monomer 102]: 41.9 g, [Monomer 125]: 8.9 g | 2,200 |
| 1-7 | [Monomer 101]: 25.9 g, [Monomer 102]: 41.9 g, [Monomer 126]: 9.3 g | 2,200 |
| 1-8 | [Monomer 101]: 25.9 g, [Monomer 102]: 41.9 g, [Monomer 127]: 11.1 g | 2,200 |
| 1-9 | [Monomer 101]: 20.4 g, [Monomer 102]: 7.6 g, [Monomer 120]: 81.1 g | 1,600 |
| 1-10 | [Monomer 101]: 20.4 g, [Monomer 102]: 7.6 g, [Monomer 121]: 90.1 g | 1,300 |
| 1-11 | [Monomer 101]: 20.4 g, [Monomer 102]: 7.6 g, [Monomer 122]: 97.9 g | 1,600 |
| 1-12 | [Monomer 101]: 20.4 g, [Monomer 102]: 7.6 g, [Monomer 123]: 102.8 g | 1,200 |
| 1-13 | [Monomer 101]: 20.4 g, [Monomer 102]: 7.6 g, [Monomer 124]: 83.5 g | 1,500 |
| 1-14 | [Monomer 101]: 20.4 g, [Monomer 102]: 7.6 g, [Monomer 125]: 76.3 g | 1,300 |
| 1-15 | [Monomer 101]: 20.4 g, [Monomer 102]: 7.6 g, [Monomer 126]: 79.9 g | 1,500 |
| 1-16 | [Monomer 101]: 20.4 g, [Monomer 102]: 7.6 g, [Monomer 127]: 94.9 g | 1,300 |
| 1-17 | [Monomer 101]: 20.4 g, [Monomer 102]: 7.6 g, [Monomer 128]: 95.5 g | 2,300 |
| 1-18 | [Monomer 101]: 20.4 g, [Monomer 102]: 7.6 g, [Monomer 129]: 79.3 g | 2,500 |
| 1-19 | [Monomer 101]: 20.4 g, [Monomer 102]: 7.6 g, [Monomer 130]: 94.3 g | 2,300 |

TABLE 1-continued

| Synthesis Example | Raw materials for reaction | Mw |
|---|---|---|
| 1-20 | [Monomer 101]: 20.4 g, [Monomer 102]: 7.6 g, [Monomer 140]: 68.5 g | 1,600 |
| 1-21 | [Monomer 101]: 22.5 g, [Monomer 102]: 41.9 g, [Monomer 110]: 4.7 g, [Monomer 120]: 9.5 g | 2,100 |
| 1-22 | [Monomer 101]: 22.5 g, [Monomer 102]: 41.9 g, [Monomer 111]: 8.5 g, [Monomer 120]: 9.5 g | 1,900 |
| 1-23 | [Monomer 101]: 20.4 g, [Monomer 102]: 3.8 g, [Monomer 112]: 9.1 g, [Monomer 120]: 81.1 g | 2,500 |
| 1-24 | [Monomer 101]: 20.4 g, [Monomer 102]: 3.8 g, [Monomer 113]: 7.1 g, [Monomer 120]: 81.1 g | 2,500 |
| 1-25 | [Monomer 100]: 5.0 g, [Monomer 101]: 3.4 g, [Monomer 102]: 68.5 g | 2,200 |
| 1-26 | [Monomer 100]: 5.0 g, [Monomer 101]: 6.8 g, [Monomer 102]: 60.9 g, [Monomer 110]: 4.7 g | 3,700 |
| 1-27 | [Monomer 100]: 5.0 g, [Monomer 101]: 6.8 g, [Monomer 102]: 60.9 g, [Monomer 111]: 8.5 g | 3,700 |
| 1-28 | [Monomer 100]: 5.0 g, [Monomer 101]: 6.8 g, [Monomer 102]: 60.9 g, [Monomer 112]: 9.1 g | 3,600 |
| 1-29 | [Monomer 100]: 5.0 g, [Monomer 101]: 6.8 g, [Monomer 102]: 60.9 g, [Monomer 113]: 7.1 g | 4,000 |
| 1-30 | [Monomer 100]: 5.0 g, [Monomer 101]: 6.8 g, [Monomer 102]: 60.9 g, [Monomer 114]: 8.1 g | 3,900 |

$PhSi(OCH_3)_3$,
[Monomer 100]
$CH_3Si(OCH_3)_3$,
[Monomer 101]
$Si(OCH_3)_3$,
[Monomer 102]
$B(OC_3H_7)_3$,
[Monomer 110]
$Ti(OC_4H_9)_4$,
[Monomer 111]
$Ge(OC_4H_9)_4$,
[Monomer 112]
$P_2O_5$,
[Monomer 113]
$Al[CH_3COCH=C(O-)CH_3]_3$,
[Monomer 114]

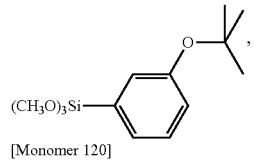

[Monomer 120]

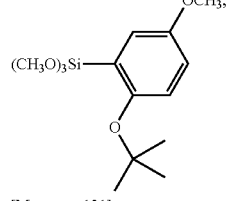

[Monomer 121]

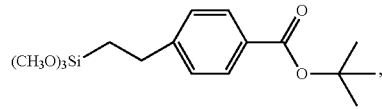

[Monomer 122]

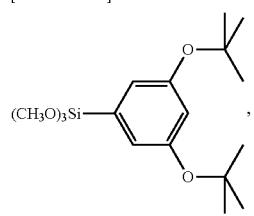

[Monomer 123]

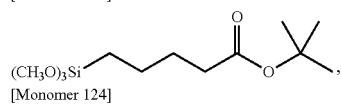

[Monomer 124]

TABLE 1-continued

| Synthesis Example | Raw materials for reaction | Mw |
|---|---|---|

[Monomer 125]

[Monomer 126]

[Monomer 127]

[Monomer 128]

[Monomer 129]

[Monomer 130]

[Monomer 140]

Synthesis Example 1-31

A monomer solution was prepared from 27.3 g of 4-tert-butoxystyrene, 104.3 g of 4-trimethoxysilyl styrene, 4.2 g of MAIB (dimethyl-2,2'-azobis(isobutyrate)), and 100 g of PGMEA (propylene glycol monomethyl ether acetate). Under a nitrogen atmosphere, 50 g of PGMEA was taken into a flask, and then, after it was heated to 80° C. with stirring, the above-prepared monomer solution was gradually added thereinto over two hours. Thereafter, after the polymerization solution was stirred at 80° C. for 20 hours, heating thereof was stopped. The obtained polymerization solution was cooled to room temperature and then diluted with 200 g of PGMEA; and then, the resulting mixture was gradually added into 2000 g of methanol with stirring. The precipitated silicon-containing compound was collected by filtration, washed with 600 g of methanol twice, and then dried under vacuum at 50° C. for 20 hours to obtain the silicon-containing film composition 1-31. The polystyrene-equivalent mass-average molecular weight (Mw) of this compound by GPC was 9,800, and the dispersity thereof (Mw/Mn) was 1.91. From the $^{13}$C-NMR analysis, the ratio of the unit derived from 4-tert-butoxystyrene to the unit derived from 4-trimethoxysilyl styrene, the composition ratio of the copolymer, was 26 to 74.

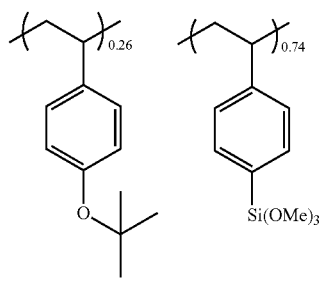

Polymer Composition Ratio:

unit derived from 4-tert-butoxystyrene/unit derived from 4-trimethoxysilyl styrene=26/74 (molar ratio)

Molecular weight (Mw): 9,800

Dispersity (Mw/Mn): 1.91

Each of the silicon-containing compounds (1-1) to (1-31) obtained in the Synthesis Examples was mixed with an acid, a thermal crosslinking accelerator, a solvent, and an additive were mixed at a ratio shown in Table 2 or 3. The resulting mixture was filtrated through a fluorinated resin filter having a porous size of 0.1 μm, to prepare each silicon-containing film composition as Sol. 1 to Sol. 41.

TABLE 2

| No. | Silicon-containing compound (part by mass) | | Thermal crosslinking accelerator (part by mass) | Photoacid generator (part by mass) | Acid (part by mass) | Solvent (part by mass) | Water (part by mass) |
|---|---|---|---|---|---|---|---|
| Sol. 1 | 1-1 | (4.0) | TPSOH (0.04) | — | Maleic acid (0.04) | PGEE (150) | Water (15) |
| Sol. 2 | 1-1 | (4.0) | TPSHCO$_3$ (0.04) | — | Oxalic acid (0.04) | PGEE (150) | Water (15) |
| Sol. 3 | 1-1 | (4.0) | TPSOx (0.04) | — | Maleic acid (0.04) | PGEE (150) | Water (15) |
| Sol. 4 | 1-1 | (4.0) | TPSTFA (0.04) | — | Maleic acid (0.04) | PGEE (150) | Water (15) |
| Sol. 5 | 1-1 | (4.0) | TPSOCOPh (0.04) | — | Oxalic acid (0.04) | PGEE (150) | Water (15) |
| Sol. 6 | 1-1 | (4.0) | TPSH$_2$PO$_4$ (0.04) | — | Oxalic acid (0.04) | PGEE (150) | Water (15) |
| Sol. 7 | 1-1 | (4.0) | QMAMA (0.04) | — | Maleic acid (0.04) | PGEE (150) | Water (15) |
| Sol. 8 | 1-1 | (4.0) | QBANO$_3$ (0.04) | — | Maleic acid (0.04) | PGEE (150) | Water (15) |
| Sol. 9 | 1-1 | (4.0) | QMATFA (0.04) | — | Maleic acid (0.04) | PGEE (150) | Water (15) |
| Sol. 10 | 1-1 | (4.0) | Ph$_2$ICl (0.04) | — | Maleic acid (0.04) | PGEE (150) | Water (15) |
| Sol. 11 | 1-1 | (4.0) | TPSMA (0.04) | — | Maleic acid (0.04) | PGEE (150) | Water (15) |
| Sol. 12 | 1-2 | (4.0) | TPSMA (0.04) | — | Maleic acid (0.04) | PGEE (150) | Water (15) |
| Sol. 13 | 1-3 | (4.0) | TPSMA (0.04) | TPSNf (0.04) | Maleic acid (0.04) | PGEE (150) | Water (15) |
| Sol. 14 | 1-4 | (4.0) | TPSMA (0.04) | TPSNf (0.04) | Maleic acid (0.04) | PGEE (150) | Water (15) |
| Sol. 15 | 1-5 | (4.0) | TPSMA (0.04) | TPSNf (0.04) | Maleic acid (0.04) | PGEE (150) | Water (15) |
| Sol. 16 | 1-6 | (4.0) | TPSMA (0.04) | — | Oxalic acid (0.04) | PGEE (150) | Water (15) |
| Sol. 17 | 1-7 | (4.0) | TPSMA (0.04) | — | Maleic acid (0.04) | PGEE (150) | Water (15) |
| Sol. 18 | 1-8 | (4.0) | TPSMA (0.04) | — | Maleic acid (0.04) | PGEE (150) | Water (15) |
| Sol. 19 | 1-9 1-25 | (0.1) (3.9) | TPSMA (0.04) | — | Maleic acid (0.04) | PGEE (150) | Water (15) |
| Sol. 20 | 1-10 1-25 | (0.1) (3.9) | TPSMA (0.04) | — | Maleic acid (0.04) | PGEE (150) | Water (15) |
| Sol. 21 | 1-11 1-25 | (0.1) (3.9) | TPSMA (0.04) | — | Maleic acid (0.04) | PGEE (150) | Water (15) |
| Sol. 22 | 1-12 1-25 | (0.1) (3.9) | TPSMA (0.04) | — | Maleic acid (0.04) | PGEE (150) | Water (15) |
| Sol. 23 | 1-13 1-25 | (0.1) (3.9) | TPSMA (0.04) | TPSNf (0.04) | Maleic acid (0.04) | PGEE (150) | Water (15) |
| Sol. 24 | 1-14 1-25 | (0.1) (3.9) | TPSMA (0.04) | TPSNf (0.04) | Maleic acid (0.04) | PGEE (150) | Water (15) |
| Sol. 25 | 1-15 1-25 | (0.1) (3.9) | TPSMA (0.04) | TPSNf (0.04) | Maleic acid (0.04) | PGEE (150) | Water (15) |

TABLE 3

| No. | Silicon-containing compound (part by mass) | | Thermal crosslinking accelerator (part by mass) | Photoacid generator (part by mass) | Acid (part by mass) | Solvent (part by mass) | Water (part by mass) |
|---|---|---|---|---|---|---|---|
| Sol. 26 | 1-16 1-25 | (0.1) (3.9) | TPSMA (0.04) | TPSNf (0.04) | Maleic acid (0.04) | PGEE (150) | Water (15) |
| Sol. 27 | 1-17 1-25 | (0.1) (3.9) | TPSMA (0.04) | TPSNf (0.04) | Maleic acid (0.04) | PGEE (150) | Water (15) |

TABLE 3-continued

| No. | Silicon-containing compound (part by mass) | | Thermal crosslinking accelerator (part by mass) | Photoacid generator (part by mass) | Acid (part by mass) | Solvent (part by mass) | Water (part by mass) |
|---|---|---|---|---|---|---|---|
| Sol. 28 | 1-18 1-25 | (0.1) (3.9) | TPSMA (0.04) | TPSNf (0.04) | Maleic acid (0.04) | PGEE (150) | Water (15) |
| Sol. 29 | 1-19 1-25 | (0.1) (3.9) | TPSMA (0.04) | — | Maleic acid (0.04) | PGEE (150) | Water (15) |
| Sol. 30 | 1-21 1-25 | (0.1) (3.9) | TPSMA (0.04) | — | Maleic acid (0.04) | PGEE (150) | Water (15) |
| Sol. 31 | 1-22 1-25 | (0.1) (3.9) | TPSMA (0.04) | — | Maleic acid (0.04) | PGEE (150) | Water (15) |
| Sol. 32 | 1-23 1-25 | (0.1) (3.9) | TPSMA (0.04) | — | Maleic acid (0.04) | PGEE (150) | Water (15) |
| Sol. 33 | 1-24 1-25 | (0.1) (3.9) | TPSMA (0.04) | — | Maleic acid (0.04) | PGEE (150) | Water (15) |
| Sol. 34 | 1-31 1-25 | (0.1) (3.9) | TPSMA (0.04) | — | Maleic acid (0.04) | PGEE (150) | Water (15) |
| Sol. 35 | 1-9 1-26 | (0.1) (3.9) | TPSMA (0.04) | — | Maleic acid (0.04) | PGEE (150) | Water (15) |
| Sol. 36 | 1-9 1-27 | (0.1) (3.9) | TPSMA (0.04) | — | Maleic acid (0.04) | PGEE (150) | Water (15) |
| Sol. 37 | 1-9 1-28 | (0.1) (3.9) | TPSMA (0.04) | — | Maleic acid (0.04) | PGEE (150) | Water (15) |
| Sol. 38 | 1-9 1-29 | (0.1) (3.9) | TPSMA (0.04) | — | Maleic acid (0.04) | PGEE (150) | Water (15) |
| Sol. 39 | 1-9 1-30 | (0.1) (3.9) | TPSMA (0.04) | — | Maleic acid (0.04) | PGEE (150) | Water (15) |
| Sol. 40 | 1-17 1-29 | (0.1) (3.9) | TPSMA (0.04) | — | Maleic acid (0.04) | PGEE (150) | Water (15) |
| Sol. 41 | 1-20 1-25 | (0.1) (3.9) | TPSMA (0.04) | — | Maleic acid (0.04) | PGEE (150) | Water (15) |

TPSOH: Triphenylsulfonium hydroxide
TPSHCO$_3$: Mono(triphenylsulfonium) carbonate
TPSOx: Mono(triphenylsulfonium) oxalate
TPSTFA: Triphenylsulfonium trifluoroacetate
TPSOCOPh: Triphenylsulfonium benzoate
TPSH$_2$PO$_4$: Mono(triphenylsulfonium) phosphate
TPSMA: Mono(triphenylsulfonium) maleate
TPSNf: Triphenylsulfonium nonafluorobutanesulfonate
QMAMA: Mono(tetramethylammonium) maleate
QMATFA: Tetramethylammonium trifluoroacetate
QBANO$_3$: Tetrabutylammonium nitrate
Ph$_2$ICl: Diphenyliodonium chloride
PGEE: Propylene glycol ethyl ether

Synthesis Example 2-1

After a 2-L flask reactor was dried under reduced pressure, 1,500 g of tetrahydrofuran (this was dehydrated by distillation) was charged thereinto under a nitrogen atmosphere. After it was cooled to −75° C., 12.3 g of s-butyl lithium (1 N cyclohexane solution) was charged thereinto followed by gradual charge of 161 g of 4-ethoxyethoxystyrene (this was dehydrated by distillation). During this operation, care was taken such that temperature inside the reaction solution might not reach −60° C. or higher. After 15 minutes of the reaction, 98.7 g of 4-t-butoxystyrene (this was dehydrated by distillation) was gradually added thereinto; and then the reaction was carried out for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 L of acetone, and then, this mixture was poured into 7.0 L of water. Deposited white solid was washed, collected by filtration, and then dried at 40° C. under reduced pressure to obtain 166.2 g of white polymer.

The obtained polymer showed following analysis results by measurements with $^{13}$C-NMR, $^1$H-NMR, and GPC.

Copolymer Composition Ratio:
  Hydroxystyrene:4-t-butoxystyrene=57.7:42.3
Mass-average molecular weight (Mw): 9,300
Dispersity (Mw/Mn): 1.13
  This was designated as Diblock-A.

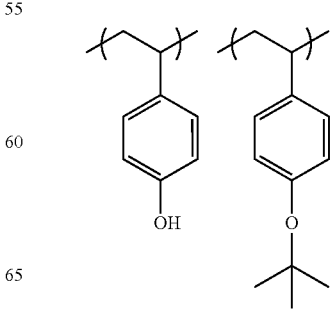

Synthesis Example 2-2

After a 2-L flask reactor was dried under reduced pressure, 1,500 g of tetrahydrofuran (this was dehydrated by distillation) was charged thereinto under a nitrogen atmosphere. After it was cooled to −75° C., 12.5 g of s-butyl lithium (1 N cyclohexane solution) was charged thereinto followed by gradual charge of 41 g of 4-t-butoxystyrene (this was dehydrated by distillation). During this operation, care was taken such that temperature inside the reaction solution might not reach −60° C. or higher. After 15 minutes of the reaction, 154 g of 4-ethoxyethoxystyrene (this was dehydrated by distillation) was gradually added thereinto; and then the reaction was carried out for 15 minutes. Finally, 41 g of 4-t-butoxystyrene (this was dehydrated by distillation) was gradually charged again, and then the reaction was carried out for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 L of acetone, and then, this mixture was poured into 7.0 L of water. Deposited white solid was washed, collected by filtration, and then dried at 40° C. under reduced pressure to obtain 163.2 g of white polymer.

The obtained polymer showed following analysis results by measurements with $^{13}$C-NMR, $^1$H-NMR, and GPC.

Copolymer Composition Ratio:
Hydroxystyrene:4-t-butoxystyrene=62.5:37.5
Mass-average molecular weight (Mw): 10,200
Dispersity (Mw/Mn): 1.09

This was designated as Triblock-B.

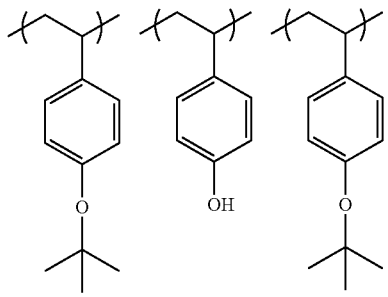

Synthesis Example 2-3

After a 2-L flask reactor was dried under reduced pressure, 1,500 g of tetrahydrofuran (this was dehydrated by distillation) was charged thereinto under a nitrogen atmosphere. After it was cooled to −75° C., 14.5 g of s-butyl lithium (1 N cyclohexane solution) was charged thereinto followed by gradual addition of 193 g of 4-ethoxyethoxystyrene (this was dehydrated by distillation). During this operation, care was taken such that temperature inside the reaction solution might not reach −60° C. or higher. After 15 minutes of the reaction, 47 g of methyl methacrylate ester (this was dehydrated by distillation) was gradually added thereinto; and then, the reaction was carried out with raising the temperature till 0° C. for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 L of acetone, and then, this mixture was poured into 7.0 L of water. Deposited white solid was washed, collected by filtration, and then dried at 40° C. under reduced pressure to obtain 148.9 g of white polymer.

The obtained polymer showed following analysis results by measurements with $^{13}$C-NMR, $^1$H-NMR, and GPC.

Copolymer Composition Ratio:
Hydroxystyrene:methyl methacrylate ester=67.9:32.1
Mass-average molecular weight (Mw): 11,200
Dispersity (Mw/Mn): 1.12

This was designated as Diblock-C.

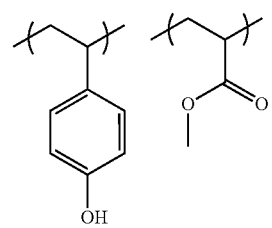

Hereinafter, Triblock-D, Diblock-E, Diblock-F, Diblock-G, and Diblock-H having following structures were synthesized similarly.

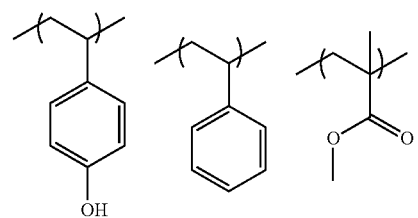

Triblock-D
(30:42.4:27.6)
Mw = 13,800
Mw/Mn = 1.08

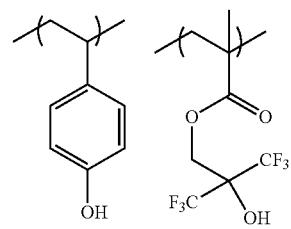

Diblock-E
(61.9:38.1)
Mw = 8,900
Mw/Mn = 1.17

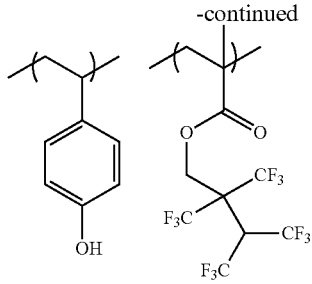

Diblock-F
(69.2:30.8)
Mw = 9,500
Mw/Mn = 1.12

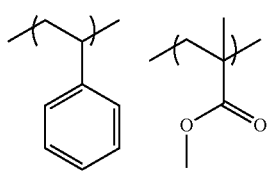

Diblock-G
(66.2:33.8)
Mw = 11,500
Mw/Mn = 1.09

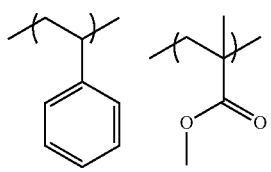

Diblock-H
(67.9:32.1)
Mw = 41,000
Mw/Mn = 1.11

Examples and Comparative Examples

Measurement of Contact Angle

<Contact Angle Sample of Non-Exposed Area of Underlayer Film>

Each of the silicon-containing film compositions Sol. 1 to Sol. 41 was applied, and heated at 240° C. for 60 seconds to form silicon-containing films Film 1 to Film 41 having a thickness of 35 nm. The contact angle with pure water (CA1) was measured (Table 4).

<Contact Angle Sample of Exposed Area of Underlayer Film>

Each of the silicon-containing film compositions Sol. 1 to Sol. 41 was applied to a silicon wafer, and heated at 240° C. for 60 seconds to form silicon-containing films Film 1 to Film 41 having a thickness of 35 nm. Then, the silicon-containing film was subjected to flood exposure by an ArF immersion lithography device NSR-S610C manufactured by Nikon Corporation, and baked at 100° C. for 60 seconds to obtain a film on an exposed area of the silicon-containing film. The contact angle with pure water (CA2) on the film was measured (Table 5).

TABLE 4

| No. | Contact angle |
|---|---|
| Film 1 | 75° |
| Film 2 | 75° |
| Film 3 | 75° |
| Film 4 | 75° |
| Film 5 | 75° |
| Film 6 | 75° |
| Film 7 | 78° |
| Film 8 | 75° |
| Film 9 | 76° |
| Film 10 | 77° |
| Film 11 | 74° |
| Film 12 | 75° |
| Film 13 | 78° |
| Film 14 | 78° |
| Film 15 | 74° |
| Film 16 | 80° |
| Film 17 | 79° |
| Film 18 | 78° |
| Film 19 | 81° |
| Film 20 | 80° |
| Film 21 | 78° |
| Film 22 | 79° |
| Film 23 | 74° |
| Film 24 | 77° |
| Film 25 | 78° |
| Film 26 | 78° |
| Film 27 | 76° |
| Film 28 | 76° |
| Film 29 | 74° |
| Film 30 | 75° |
| Film 31 | 78° |
| Film 32 | 77° |
| Film 33 | 76° |
| Film 34 | 75° |
| Film 35 | 77° |
| Film 36 | 77° |
| Film 37 | 78° |
| Film 38 | 79° |
| Film 39 | 75° |
| Film 40 | 79° |
| Film 41 | 75° |

TABLE 5

| No. | Contact angle |
|---|---|
| Film 1 | 43° |
| Film 2 | 44° |
| Film 3 | 45° |
| Film 4 | 40° |
| Film 5 | 49° |
| Film 6 | 43° |
| Film 7 | 47° |
| Film 8 | 40° |
| Film 9 | 39° |
| Film 10 | 41° |
| Film 11 | 38° |
| Film 12 | 43° |
| Film 13 | 45° |
| Film 14 | 44° |
| Film 15 | 46° |
| Film 16 | 47° |
| Film 17 | 41° |
| Film 18 | 39° |
| Film 19 | 40° |
| Film 20 | 41° |
| Film 21 | 42° |
| Film 22 | 45° |
| Film 23 | 45° |
| Film 24 | 38° |
| Film 25 | 36° |
| Film 26 | 42° |
| Film 27 | 42° |

TABLE 5-continued

| No. | Contact angle |
|---|---|
| Film 28 | 36° |
| Film 29 | 48° |
| Film 30 | 43° |
| Film 31 | 42° |
| Film 32 | 41° |
| Film 33 | 40° |
| Film 34 | 37° |
| Film 35 | 43° |
| Film 36 | 39° |
| Film 37 | 43° |
| Film 38 | 43° |
| Film 39 | 45° |
| Film 40 | 47° |
| Film 41 | 68° |

In Films 1 to Film 40 which are the silicon-containing films having the structure used in the present invention, the contact angles after exposure were confirmed to be decreased. On the other hand, in Film 41 in which substitution with a group stable to acid was performed, change of contact angle after exposure did not appear.

Formation of the Patterning Wafer

[Procedure 1]

A spin-on carbon film ODL-50 (carbon content of 80% by mass, manufactured by Shin-Etsu Chemical Co., Ltd.) having a thickness of 200 nm was formed on a silicon wafer. Each of the silicon-containing film compositions Sol. 11 to Sol. 25 and Sol. 41 was applied to the silicon wafer, and heated at 240° C. for 60 seconds to form silicon-containing films Film 11 to Film 25 and Film 41 having a thickness of 35 nm.

Subsequently, an ArF photoresist solution for positive development (PR-1) was applied onto the silicon-containing film, and baked at 110° C. for 60 seconds to form a photoresist film having a thickness of 100 nm. Further, an immersion top coat (TC-1) was formed on the photoresist film, and baked at 90° C. for 60 seconds to form a top coat having a thickness of 50 nm. These films were exposed using an ArF immersion lithography device (manufactured by Nikon Corporation; NA of 1.30, σ: 0.98/0.65, 35° polarization illumination, 6% half-tone phase-shift mask), and then baked (PER) at 100° C. for 60 seconds to obtain a pattern corresponding to a 43-nm 1:1 positive line and space pattern. Next, the photoresist film was all rinsed with propylene glycol monomethyl ether (PGME) to obtain a wafer 1.

[Procedure 2]

A spin-on carbon film ODL-50 (carbon content of 80% by mass, manufactured by Shin-Etsu Chemical Co., Ltd.) having a thickness of 200 nm was formed on a silicon wafer. Each of the silicon-containing film compositions Sol. 26 to Sol. 41 was applied onto the silicon wafer, and heated at 240° C. for 60 seconds to form silicon-containing films Film 26 to Film 41 having a thickness of 35 nm.

Subsequently, an ArF photoresist solution for positive development (PR-1) was applied onto the silicon-containing film, and baked at 110° C. for 60 seconds to form a photoresist film having a thickness of 100 nm. Further, an immersion top coat (TC-1) was formed on the photoresist film, and baked at 90° C. for 60 seconds to form a top coat having a thickness of 50 nm. These films were exposed using an ArF immersion lithography instrument NSR-S610C (NA of 1.30, σ of 0.98/0.65, 35-degree dipole polarized illumination, and 6% half tone phase shift mask with which 45 nm 1:1 positive line-and-space pattern can be obtained; manufactured by Nikon Corp.), baked (PEB) at 100° C. for 60 seconds, and developed with an aqueous solution of 2.38% by mass tetramethylammonium hydroxide (TMAH) for 30 seconds, to obtain a pattern corresponding to a 43-nm 1:1 positive line and space pattern. Subsequently, the photoresist film was all rinsed with propylene glycol monomethyl ether (PGME) to obtain a wafer 2.

TABLE 6

| No. | Polymer (part by mass) | Acid generator (part by mass) | Base (part by mass) | Solvent (part by mass) |
|---|---|---|---|---|
| PR-1 | ArF photoresist polymer 1 (100) | PAG 1 (7.0) | Quencher (1.0) | PGMEA (2,500) |

ArF photoresist polymer 1:
Molecular weight (Mw) = 7,800
Dispersion degree (Mw/Mn) = 1.78

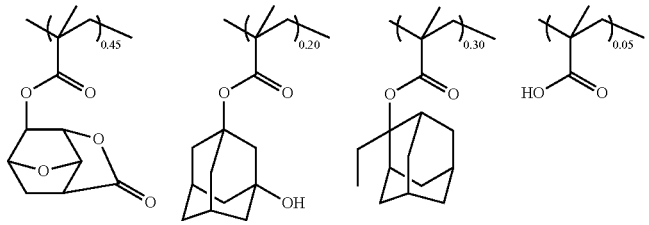

Acid generator: PAG 1

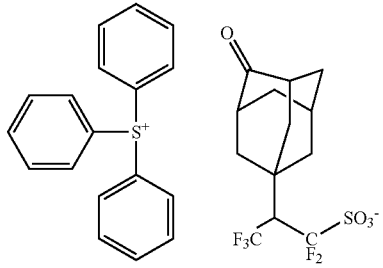

TABLE 6-continued

| No. | Polymer (part by mass) | Acid generator (part by mass) | Base (part by mass) | Solvent (part by mass) |
|---|---|---|---|---|

Base: Quencher

[Chemical structure of quencher]

Top coat polymer
Molecular weight (Mw) = 8,800
Dispersion degree (Mw/Mn) = 1.69

[Chemical structure of top coat polymer]

TABLE 7

| | Polymer (part by mass) | Organic solvent (part by mass) |
|---|---|---|
| TC-1 | Top coat polymer (1.00) | diisoamyl ether (2,700) 2-methyl-1-butanol (270) |

Self-Assembly Patterning Test

PGMEA solutions were prepared from the di- or triblock polymers A to H, filtrated through a fluorinated resin filter having a porous size of 0.1 μm, to prepare self-assembling polymer solutions as DS-A to H, respectively.

Each of the polymer solutions was spin-applied onto the obtained wafer so that the thickness was 50 nm, and heated at 180° C. for 24 hours under vacuum to form a pattern of microdomain structure. The pattern was observed with an electron microscope CG4000 (manufactured by Hitachi High-Technologies Corp.). The results are summarized in Table 8.

Pattern Etching Test

In each pattern formed in the patterning test, a poly(meth)acrylate ester area was dry-etched using an oxygen-containing gas under a processing condition (1). The silicon-containing film was dry-etched using the remaining polystyrene area as a mask under a processing condition (2), followed by dry etching under a condition (3), to transfer the pattern to the spin-on carbon film. The line width in the pattern was observed with an electron microscope OG4000 (manufactured by Hitachi High-Technologies Corp.), and the shape was compared. The results are summarized in Table 8.

(1) Etching Condition of $O_2/N_2$ Gas
Instrument: dry etching instrument Telius SP (manufactured by Tokyo Electron Ltd.)
Etching Condition (1):

| | |
|---|---|
| Chamber pressure: | 5 Pa |
| Upper/Lower RF power: | 100 W/50 W |
| $O_2$ gas flow rate: | 10 mL/min |
| $N_2$ gas flow rate: | 10 mL/min |
| Ar gas flow rate: | 10 mL/min |
| Treatment time: | 30 sec |

(2) Etching Condition of $CHF_3/CF_4$ Gas
Instrument: dry etching instrument Telius SP (manufactured by Tokyo Electron Ltd.)
Etching Condition (2):

| | |
|---|---|
| Chamber pressure: | 15 Pa |
| Upper/Lower RF power: | 500 W/300 W |
| $CHF_3$ gas flow rate: | 50 mL/min |
| $CF_4$ gas flow rate: | 150 mL/min |
| Ar gas flow rate: | 100 mL/min |
| Treatment time: | 40 sec |

(3) Etching Condition of $O_2/N_2$ Gas
Instrument: dry etching instrument Telius SP (manufactured by Tokyo Electron Ltd.)
Etching Condition (3):

| | |
|---|---|
| Chamber pressure: | 5 Pa |
| Upper/Lower RF power: | 1,000 W/300 W |
| $O_2$ gas flow rate: | 300 mL/min |
| $N_2$ gas flow rate: | 100 mL/min |
| Ar gas flow rate: | 100 mL/min |
| Treatment time: | 30 sec |

TABLE 8

| Example | Silicon-containing underlayer film | Procedure of forming test wafer | Self-assembling polymer | Size of microdomain structure | Size after etching |
|---|---|---|---|---|---|
| Example 1 | Film 11 | Procedure 1 | DS-A | 28 nm | 26 nm |
| Example 2 | Film 12 | Procedure 1 | DS-B | 23 nm | 21 nm |
| Example 3 | Film 13 | Procedure 1 | DS-C | 18 nm | 14 nm |
| Example 4 | Film 14 | Procedure 1 | DS-D | 30 nm | 29 nm |
| Example 5 | Film 15 | Procedure 1 | DS-E | 16 nm | 14 nm |
| Example 6 | Film 16 | Procedure 1 | DS-F | 22 nm | 18 nm |
| Example 7 | Film 17 | Procedure 1 | DS-G | 57 nm | 58 nm |
| Example 8 | Film 18 | Procedure 1 | DS-H | 55 nm | 54 nm |
| Example 9 | Film 19 | Procedure 1 | DS-G | 27 nm | 26 nm |
| Example 10 | Film 20 | Procedure 1 | DS-G | 35 nm | 34 nm |
| Example 11 | Film 21 | Procedure 1 | DS-G | 32 nm | 31 nm |
| Example 12 | Film 22 | Procedure 1 | DS-G | 22 nm | 21 nm |
| Example 13 | Film 23 | Procedure 1 | DS-G | 38 nm | 36 nm |
| Example 14 | Film 24 | Procedure 1 | DS-G | 27 nm | 26 nm |

TABLE 8-continued

| Example | Silicon-containing underlayer film | Procedure of forming test wafer | Self-assembling polymer | Size of microdomain structure | Size after etching |
|---|---|---|---|---|---|
| Example 15 | Film 25 | Procedure 1 | DS-G | 22 nm | 18 nm |
| Example 16 | Film 26 | Procedure 2 | DS-G | 35 nm | 31 nm |
| Example 17 | Film 27 | Procedure 2 | DS-G | 33 nm | 31 nm |
| Example 18 | Film 28 | Procedure 2 | DS-G | 43 nm | 42 nm |
| Example 19 | Film 29 | Procedure 2 | DS-G | 32 nm | 30 nm |
| Example 20 | Film 30 | Procedure 2 | DS-G | 35 nm | 33 nm |
| Example 21 | Film 31 | Procedure 2 | DS-G | 48 nm | 46 nm |
| Example 22 | Film 32 | Procedure 2 | DS-G | 43 nm | 39 nm |
| Example 23 | Film 33 | Procedure 2 | DS-G | 43 nm | 39 nm |
| Example 24 | Film 34 | Procedure 2 | DS-G | 25 nm | 21 nm |
| Example 25 | Film 35 | Procedure 2 | DS-G | 40 nm | 38 nm |
| Example 26 | Film 36 | Procedure 2 | DS-G | 43 nm | 39 nm |
| Example 27 | Film 37 | Procedure 2 | DS-G | 30 nm | 28 nm |
| Example 28 | Film 38 | Procedure 2 | DS-G | 43 nm | 39 nm |
| Example 29 | Film 39 | Procedure 2 | DS-G | 35 nm | 33 nm |
| Example 30 | Film 40 | Procedure 2 | DS-G | 28 nm | 26 nm |
| Comparative Example 1 | Film 41 | Procedure 1 | DS-G | Not self-assembled | |
| Comparative Example 2 | Film 41 | Procedure 2 | DS-G | Not self-assembled | |

As shown in Table 8, according to the patterning process of the present invention (Examples 1 to 15), a silicon-containing film having a difference of contact angle after exposure is formed as an underlayer film. A photoresist film is formed on the layer, and exposed to obtain a pattern. After the photoresist film is removed, a self-assembling polymer is formed. Thus, a pattern having excellent uniformity and regularity can be obtained. Moreover, according to the patterning process of the present invention further including a development step (Examples 16 to 30), a pattern having excellent uniformity and regularity can be similarly obtained. In some Examples, a pattern having a fine microdomain structure with a pattern size of 30 nm or less can be obtained (Examples 1 to 6, 9, 12, 14, 15, 19, 24, 27, and 30). Further, a pattern having a good difference in size conversion after pattern transfer by etching can be obtained. On the other hand, in the silicon-containing film having a very small difference of contact angle between before and after exposure (Comparative Examples 1 and 2), self-assembly of a self-assembling polymer is not confirmed with or without the development step, and a pattern cannot be obtained.

The present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. A patterning process which uses self-assembly, comprises:
   a step of forming a silicon-containing film by applying a silicon-containing film composition whose main chain is polysiloxane, and which contains a silicon-containing compound containing an organic substituent group having a hydroxyl group thereof substituted with an acid labile group or a carboxyl group thereof substituted with an acid labile group onto a substrate to be processed, which is then followed by heating the silicon-containing film composition,
   a step of forming a photoresist film by applying a photoresist composition onto the silicon-containing film which is then followed by heating the photoresist composition,
   a step of pattern-exposing of the photoresist film to high-energy beam, which is then followed by heat-treatment thereof,
   a step of removing the photoresist film with a stripper,
   a step of forming a polymer film by applying a self-assembling polymer onto the silicon-containing film after removing the photoresist film,
   a step of self-assembling the polymer film by a heat treatment to form a microdomain structure,
   a step of forming a pattern by dry-etching of the polymer film having the microdomain formed,
   a step of transferring the pattern to the silicon-containing film by dry-etching by using the pattern formed on the polymer as a mask, and
   a step of transferring the pattern to the substrate to be processed by dry-etching by using the pattern transferred to the silicon-containing film as a mask.

2. The patterning process according to claim 1, comprising a step of developing the photoresist film with a developer after exposing the photoresist film to high-energy beam followed by heating the film, and then the step of removing the photoresist film with a stripper.

3. The patterning process according to claim 1, wherein a substrate formed thereon an organic hard mask mainly comprised of carbon formed by a CVD method or an organic film formed by an application type method is used as the substrate to be processed.

4. The patterning process according to claim 2, wherein a substrate formed thereon an organic hard mask mainly comprised of carbon formed by a CVD method or an organic film formed by an application type method is used as the substrate to be processed.

* * * * *